(12) United States Patent
Enomoto et al.

(10) Patent No.: US 8,911,930 B2
(45) Date of Patent: Dec. 16, 2014

(54) METHOD OF FORMING PATTERN USING ACTINIC-RAY OR RADIATION-SENSITIVE RESIN COMPOSITION, AND PATTERN

(75) Inventors: Yuichiro Enomoto, Shizuoka (JP); Shinji Tarutani, Shizuoka (JP); Akinori Shibuya, Shizuoka (JP); Shuhei Yamaguchi, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/375,749

(22) PCT Filed: Jun. 3, 2010

(86) PCT No.: PCT/JP2010/059807
§ 371 (c)(1),
(2), (4) Date: Dec. 1, 2011

(87) PCT Pub. No.: WO2010/140709
PCT Pub. Date: Dec. 9, 2010

(65) Prior Publication Data
US 2012/0077131 A1 Mar. 29, 2012

(30) Foreign Application Priority Data

Jun. 4, 2009 (JP) .................. 2009-135251
Nov. 11, 2009 (JP) .................. 2009-257972

(51) Int. Cl.
*G03F 7/26* (2006.01)
*G03F 7/095* (2006.01)
(Continued)

(52) U.S. Cl.
CPC ............... *C08F 20/28* (2013.01); *G03F 7/095* (2013.01);
(Continued)

(58) Field of Classification Search
CPC ............. C08F 2220/283; G03F 7/0397; G03F 7/0392; G03F 7/0382; G03F 7/004; G03F 7/0233; G03F 7/033; G03F 7/20; C08L 41/00; H01L 21/31144; H01L 21/0271; H01L 21/31058; Y10S 430/122; Y10S 430/126; Y10S 430/115; Y10S 430/123
USPC .......................... 430/270.1, 322, 311
See application file for complete search history.

(56) References Cited

U.S. PATENT DOCUMENTS

2008/0187860 A1    8/2008  Tsubaki et al.
2009/0042147 A1*   2/2009  Tsubaki .................. 430/326
2012/0315449 A1   12/2012  Tsubaki et al.

FOREIGN PATENT DOCUMENTS

EP    1 939 691 A2    7/2008
JP    2000-199953 A    7/2000
(Continued)

OTHER PUBLICATIONS

Singapore Office Action dated Feb. 12, 2014 issued in corresponding application No. 201108959-6.
(Continued)

*Primary Examiner* — Caleen Sullivan
(74) *Attorney, Agent, or Firm* — Sughrue Mion PLLC

(57) ABSTRACT

According to one embodiment, a method of forming a pattern includes the step of applying an actinic-ray- or radiation-sensitive resin composition on a substrate so as to form a film, the step of selectively exposing the film through a mask and the step of developing the exposed film with the use of a developer containing an organic solvent, wherein the actinic-ray- or radiation-sensitive resin composition contains a resin (A) whose polarity is increased by the action of an acid so that the solubility of the resin in the developer containing an organic solvent is decreased, a photoacid generator (B) that when exposed to actinic rays or radiation, generates an acid containing a fluorine atom and a solvent (C), and wherein the photoacid generator (B) is contained in the composition in a ratio of 8 to 20 mass % based on the total solids of the composition.

12 Claims, 6 Drawing Sheets

(51) Int. Cl.
*G03F 7/32* (2006.01)
*C08F 20/28* (2006.01)
*G03F 7/004* (2006.01)
*G03F 7/039* (2006.01)

(52) U.S. Cl.
CPC ............. *G03F 7/325* (2013.01); *G03F 7/0046* (2013.01); *G03F 7/0397* (2013.01); *G03F 7/0045* (2013.01)
USPC ........................................................ 430/322

(56) References Cited

FOREIGN PATENT DOCUMENTS

| | | |
|---|---|---|
| JP | 2006-156422 A | 6/2006 |
| JP | 2008-281980 A | 11/2008 |
| JP | 2008-292975 A | 12/2008 |
| JP | 2009-25723 A | 2/2009 |
| TW | 200839467 A | 10/2008 |
| WO | WO 2004/061918 A1 | 7/2004 |

OTHER PUBLICATIONS

Taiwanese Office Action issue dated Jul. 24, 2014 issued in application No. 099118041.

* cited by examiner

METHOD OF FORMING PATTERN USING ACTINIC-RAY OR RADIATION-SENSITIVE RESIN COMPOSITION, AND PATTERN

CROSS REFERENCE TO RELATED APPLICATIONS

This is a U.S. National Phase Application under 35 USC 371 of International Application PCT/JP2010/059807 (published in English), filed Jun. 3, 2010. This application is based upon and claims the benefit of priority from prior Japanese Patent Nov. 11, 2009, the entire contents of both of which are incorporated herein by reference.

TECHNICAL FIELD

The present invention relates to a method of forming a pattern using an actinic-ray- or radiation-sensitive resin composition for use in a semiconductor production process for an IC or the like, a circuit board production process for a liquid crystal, a thermal head or the like and other photofabrication lithography processes, and also relates to a pattern formed by the method. More particularly, the present invention relates to a method of forming a pattern with the use of an actinic-ray- or radiation-sensitive resin composition that is suitable for exposure by means of an ArF exposure unit or liquid-immersion projection exposure unit using far ultraviolet of a wavelength of 300 nm or shorter as a light source, and also relates to a pattern formed by the method.

BACKGROUND ART

Since the emergence of a resist for a KrF excimer laser (248 nm), it has been of common practice to, in order to compensate for any sensitivity deterioration caused by light absorption, employ an image forming method through chemical amplification as a resist image forming method. A brief description of a positive image forming method through chemical amplification is given below by way of example. Upon exposure, an acid generator is decomposed at exposed areas to thereby generate an acid. In the post-exposure bake (PEB: Post-Exposure Bake), the generated acid is used as a reaction catalyst so that an alkali-insoluble group is converted to an alkali-soluble group. Thereafter, alkali development is carried out to thereby remove the exposed areas. Thus, the relevant image forming method is provided.

In accordance with the miniaturization of semiconductor elements, the wavelength shortening of the exposure light source and the realization of high numerical apertures (high NA) for projector lenses have been advanced. At present, an exposure unit using an ArF excimer laser of 193 nm wavelength as a light source is available. As is commonly known, the following formulae can be established therefor.

(Resolving power)=$k_1 \cdot (\lambda/NA)$ (Focal depth)=$\pm k_2 \cdot \lambda/NA^2$ In the formulae, $\lambda$ is the wavelength of the exposure light source; NA is the numerical aperture of the projector lens; and $k_1$ and $k_2$ are factors relating to the process.

As a technology for enhancing the resolving power, it is heretofore known to employ a liquid immersion technique, that is, a method in which the space between a projector lens and a sample is filled with a liquid of high refractive index (hereinafter also referred to as a "liquid for liquid immersion").

The "effect of the liquid immersion" is as follows. Taking $\lambda_0$ as the wavelength of exposure light in air, n as the refractive index of the liquid for liquid immersion to air and $\theta$ as the convergent half angle of the light beam, where $NA_0=\sin\theta$, the above-mentioned resolving power and focal depth in the event of liquid immersion can be expressed by the following formulae.

(Resolving power)=$k_1 \cdot (\lambda_0/n)/NA_0$ (Focal depth)=$\pm k_2 \cdot (\lambda_0/n)/NA_0^2$ That is, the effect of the liquid immersion is equivalent to the use of an exposure wavelength of 1/n. In other words, in projection optical systems of identical NA, liquid immersion enables the focal depth to be n-fold. This is effective in all pattern configurations. Further, this can be combined with a super-resolution technology, such as a phase shift method or a modified illumination method, now under study.

As techniques for further enhancing the resolving power, it has been proposed to employ a double exposure technique or a double patterning technique. These both lower the value of $k_1$ in the above formula of resolving power. Such techniques enhance the resolving power.

In the conventional patterning for an electronic device, such as a semiconductor element, a reduced transfer of the pattern of a mask or rectile whose pattern size corresponds to 4 to 5 times magnification of that desired onto an exposure subject, such as a wafer, has been carried out by means of a reduced projection exposure unit.

However, in accordance with the miniaturization of the pattern size, the conventional exposure system poses the problem that light beams having been irradiated to adjacent patterns interfere with each other, which reduces the optical contrast. Accordingly, in the conventional technology, an exposure mask design is divided into two or more sections, and individual masks are independently exposed and the resultant images are synthesized. In this double exposure system, it is required to divide an exposure mask design and carry out a re-synthesis of images for the design on an exposure subject (wafer). Thus, it is needed to devise how to divide the mask design so that the pattern on the rectile can be faithfully reproduced on the exposure subject.

Patent reference 1 provides a study of the effect of this double exposure system on the transfer of a microscopic image pattern of a semiconductor element.

However, the patterning by simple application of the conventional resist composition to the conventional resist processing poses the problem that as patterning must be performed in the vicinity of the resolution limit of the resist in this double exposure system, satisfactory exposure margin and focal depth cannot be obtained.

As for the development in g-ray, i-ray, KrF, ArF, EB or EUV lithography, various developers have been proposed to date, and an aqueous alkali developer containing 2.38 mass % TMAH (tetramethylammonium hydroxide) is commonly used.

However, the current situation is that it is extremely difficult to find an appropriate combination of resist composition, developer, rinse liquid, etc. as required for forming a pattern of comprehensively excellent performance, so that an improvement has been demanded in this field. In particular, in accordance with the enhancement of the fineness of resolved line width of the resist, it is increasingly demanded to improve the line edge roughness performance with respect to line patterns and to improve the in-plane uniformity of a pattern dimension.

Moreover, the conventional combination of resist composition and developer only provides a system in which a specified resist composition is combined with a highly polar alkali developer or a developer containing an organic solvent of low polarity to thereby form a pattern. That is, referring to FIG. 1A, a positive system (combination of resist composition and positive developer) only provides a material capable of selectively dissolving/removing any region of high light irradiation intensity $R_P$ within the spatial frequency of an optical image to thereby form a pattern. In contrast, referring to FIG. 1B, a negative system (combination of resist composition and negative developer) only provides a material capable of selectively dissolving/removing any region of low light irradiation intensity $R_N$ to thereby form a pattern.

Herein, the expression "positive developer" means a developer capable of selectively dissolving/removing any region $R_P$ of exposure not lower than the given threshold value $T_2$ indicated by a full line in FIG. 1A; for example, an alkali developer. The expression "negative developer" means a developer capable of selectively dissolving/removing any region $R_N$ of exposure not higher than the given threshold value $T_1$ indicated by a full line in FIG. 1B; for example, a developer containing an organic solvent. The development step using the positive developer is referred to as positive development (also referred to as a positive development step), and the development step using the negative developer is referred to as negative development (also referred to as a negative development step).

A double development technique as a double patterning technology for enhancing the resolving power is described in patent reference 2. In this technique, use is made of a common image forming method through chemical amplification. Using the phenomenon that upon exposure, the polarity of the resin contained in the resist composition becomes high in a region of high light intensity while the polarity of the resin becomes low in a region of low light intensity, the region of high exposure of a specified resist film is dissolved by a developer of high polarity to thereby attain a positive development, and the region of low exposure is dissolved by a developer of low polarity to thereby attain a negative development. For example, referring to FIG. 2, the region $R_P$ of exposure not lower than the threshold value $T_2$ by irradiation light 1 is dissolved by use of an aqueous alkali solution as a positive developer, and the region $R_N$ of exposure not higher than the threshold value $T_1$ is dissolved by use of a specified organic solvent as a negative developer. Accordingly, as shown in FIG. 2, the region of intermediate exposure amount (E2–E1) remains undeveloped, so that a pattern 3 of L/S with a half pitch of exposure mask 2 is formed on a wafer 4.

However, it is extremely difficult to select the most appropriate combination of resist composition and negative developer. The above-mentioned technique encounters the problem that the developability upon the use of the negative developer is deteriorated.

Further, in the formation of a micropattern by double development, it is unsatisfactory to only ensure a high resolving power upon the independent use of either a negative developer or a positive developer. It is demanded to exhibit an excellent pattern resolution in both a negative developer and a positive developer.

Taking the above problems into account, a patterning method using, in the double development technique, a positive resist composition that when exposed to actinic rays or radiation, has its solubility in a positive developer increased and has its solubility in a negative developer decreased is proposed in patent reference 3. It is described that a high-precision micropattern can be stably obtained by this technology.

However, it is still demanded to stably obtain a higher-precision micropattern excelling in line width roughness (LWR) and focus latitude (depth of focus DOF).

[Patent reference 1] Jpn. Pat. Appln. KOKAI Publication No. (hereinafter referred to as JP-A-) 2006-156422,
[Patent reference 2] JP-A-2000-199953, and
[Patent reference 3] US Patent Application 2008/0187860 A.

DISCLOSURE OF INVENTION

It is an object of the present invention to provide a method of forming a pattern using an actinic-ray- or radiation-sensitive resin composition that excels in line width roughness (LWR), focus latitude (depth of focus, DOF) and pattern configuration in order to more stably produce a micropattern of high precision required for manufacturing electronic devices of high integration and high precision. It is another object of the present invention to provide a pattern formed by the above method.

Some aspects of the present invention is as follows.

(1) A method of forming a pattern, comprising the step of applying an actinic-ray- or radiation-sensitive resin composition on a substrate so as to form a film, the step of selectively exposing the film through a mask and the step of developing the exposed film with the use of a developer containing an organic solvent, wherein the actinic-ray- or radiation-sensitive resin composition contains a resin (A) whose polarity is increased by the action of an acid so that the solubility of the resin in the developer containing an organic solvent is decreased, a photoacid generator (B) that when exposed to actinic rays or radiation, generates an acid containing a fluorine atom and a solvent (C), and wherein the photoacid generator (B) is contained in the composition in a ratio of 8 to 20 mass % based on the total solids of the composition.

(2) The method of forming a pattern according to item (1), wherein the acid generated from the photoacid generator (B) contains 6 or more fluorine atoms per molecule.

(3) The method of forming a pattern according to item (1) or (2), wherein the acid generated from the photoacid generator (B) contains an acid having a cyclic structure in its molecule.

(4) The method of forming a pattern according to any of items (1) to (3), wherein the resin (A) contains any of the repeating units of general formula (AII) below,

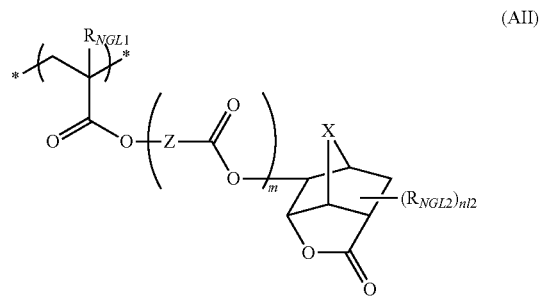

(AII)

in which $R_{NGL1}$ represents a hydrogen atom or an alkyl group; $R_{NGL2}$ represents an alkyl group, a cycloalkyl group, an alkoxy group, an alkoxycarbonyl group, a carboxyl group, a halogen atom, a hydroxyl group or a cyano group; X represents a methylene group, a methylmethylene group, a dimethylmethylene group, an ethylene group, an oxygen atom or a sulfur atom; Z, each independently in the instance of Zs, represents a chain or cyclic alkylene group; m represents the number of repetitions and is an integer of 0 to 3; and nl2 is an integer of 0 to 4, provided that when nl2 is 2 or greater, two or more $R_{NGL2}$s may be identical to or different from each other and that two or more $R_{NGL2}$s may be bonded to each other to thereby form a ring.

(5) The method of forming a pattern according to any of items (1) to (4), further comprising the step of developing the film with the use of an alkali developer.

(6) The method of forming a pattern according to any of items (1) to (5), further comprising the step of rinsing the film with the use of a rinse liquid containing an organic solvent.

(7) A pattern formed by the method of forming a pattern according to any of items (1) to (6).

The present invention has made it feasible to provide a pattern excelling in line width roughness (LWR), focus latitude (depth of focus, DOF) and pattern configuration in a patterning involving negative development or a patterning in which both negative development and positive development are carried out.

BRIEF DESCRIPTION OF DRAWINGS

FIG. 5A is a schematic view relating to positive development; and FIG. 5B is a schematic view relating to negative development.

FIG. 6A shows the relationship between the threshold value ($T_2$) in positive development and the region ($R_P$) dissolved by a positive developer; and FIG. 6B shows the relationship between the threshold value ($T_1$) in negative development subsequent to positive development and the region ($R_N$) dissolved by a negative developer.

FIG. 7A is a schematic view for the relationship exhibited when the PEB step is performed once; and FIG. 7B is a schematic view for the relationship exhibited when the PEB step is performed twice.

BEST MODE FOR CARRYING OUT THE INVENTION

Figure 1A:
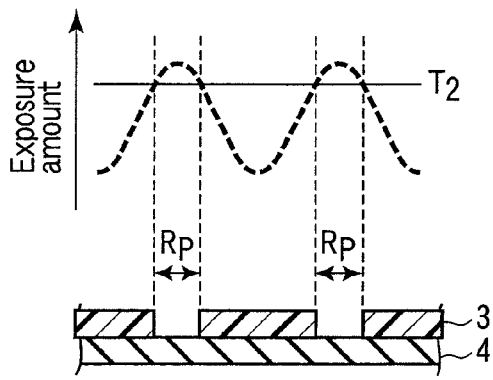
FIG. 1A is a schematic view for explaining a threshold value ($T_2$) of exposure amount applied in positive development.
Figure 1B:
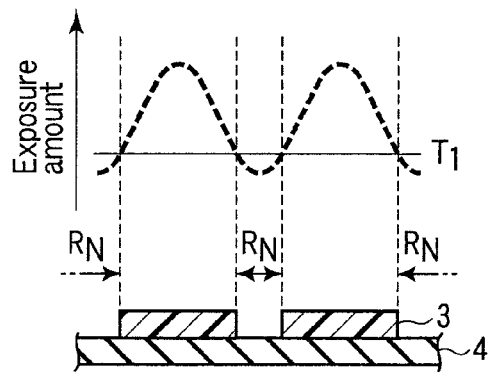
FIG. 1B is a schematic view for explaining a threshold value ($T_1$) of exposure amount applied in negative development.
Figure 2:
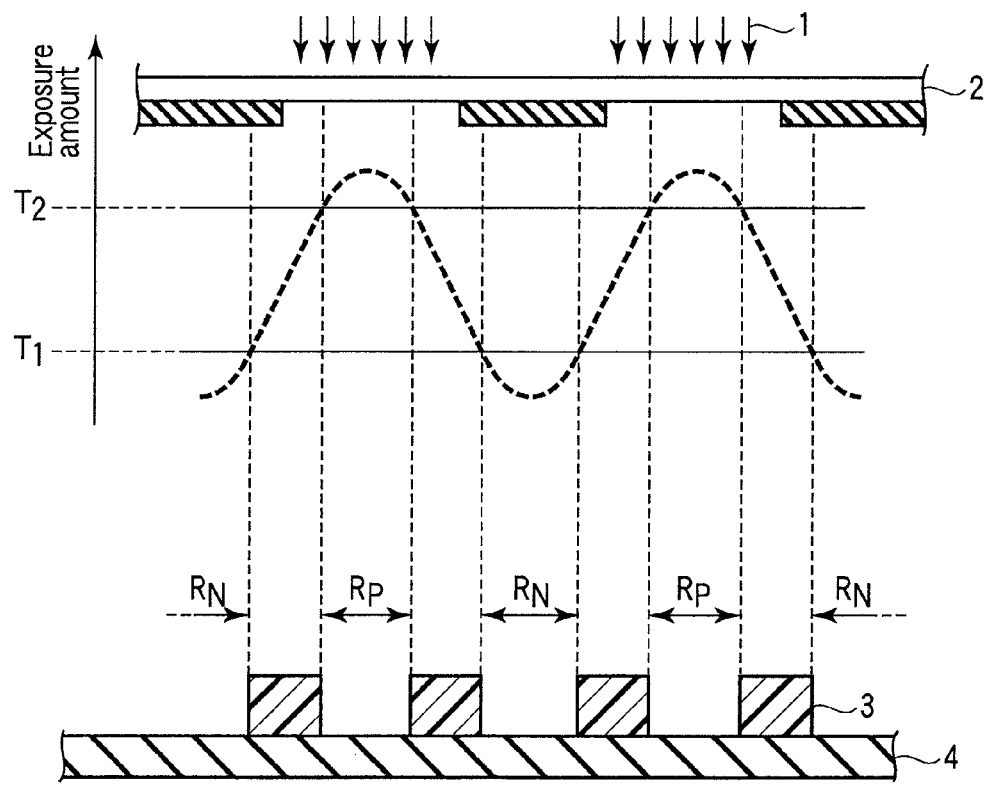
FIG. 2 is a schematic view for explaining a threshold value ($T_2$) of exposure amount applied in positive development and a threshold value ($T_1$) of exposure amount applied in negative development in one mode of a patterning method in which both positive development and negative development are carried out.

The present invention will be described in detail below.

With respect to the expression of a group (atomic group) used in this specification, the expression even when there is no mention of "substituted and unsubstituted" encompasses groups not only having no substituent but also having substituents. For example, the expression "alkyl groups" encompasses not only alkyls having no substituent (unsubstituted alkyls) but also alkyls having substituents (substituted alkyls).

In the present invention, the terms "actinic rays" and "radiation" mean, for example, brightline spectra from a mercury lamp, far ultraviolet represented by excimer laser, extreme ultraviolet, X-rays, electron beams and the like. In the present invention, the term "light" means actinic rays or radiation.

The terms to be used in this description will now be described. The patterning method can be classified into a positive method and a negative method, both of which utilize the change of the solubility of a resist film in a developer by a chemical reaction induced by light irradiation. The positive method refers to a method in which areas exposed to light are dissolved in a developer (alkali developer), and the negative method refers to a method in which areas not exposed to light are dissolved in a developer (developer containing an organic solvent). The developing method combining the development step using the alkali developer with the development step using the developer containing an organic solvent is referred to as multiple development (or multiple development step). Hereinafter, whenever the simple expression "actinic-ray- or radiation-sensitive resin composition" is used, it means the actinic-ray- or radiation-sensitive resin composition for negative development or multiple development. The expression "rinse liquid for negative development" means a rinse liquid containing an organic solvent for use in a rinse step subsequent to a negative development step.

The method of forming a pattern according to the present invention comprises:

the step of forming into a film an actinic-ray- or radiation-sensitive resin composition containing a resin (A) whose polarity is increased by the action of an acid so that the solubility of the resin in a developer containing an organic solvent is decreased, a photoacid generator (B) that when exposed to actinic rays or radiation, generates an acid containing a fluorine atom and a solvent (C), wherein the photoacid generator (B) is contained in the composition in a ratio of 8 to 20 mass % based on the total solids of the composition;

the step of exposing the film, and the step of developing the exposed film with the use of a developer containing an organic solvent.

In the method of forming a pattern according to the present invention, it is preferred for the developer containing an organic solvent to be a developer containing at least one organic solvent selected from among a ketone solvent, an ester solvent, an alcohol solvent, an amide solvent and an ether solvent.

In the developer containing an organic solvent (developer for negative development), a low water content is preferred. In particular, a water content of 10 mass % or below is preferred, and a water content of 5 mass % or below is more preferred. It is especially preferred if substantially no water is contained. The expression that substantially no water is contained encompasses the instance of containing water unintentionally mixed from the atmosphere, or the like.

In the method of forming a pattern according to the present invention, it is preferred for the resin (A) to be a resin whose polarity is increased by the action of an acid so that the solubility of the resin in a developer containing an organic solvent is decreased and so that the solubility of the resin in an alkali developer is increased. If so, it is preferred for the patterning method of the present invention to further include the step of developing the film with an alkali developer.

Preferably, the method of forming a pattern according to the present invention still further includes the step of rinsing the film with a rinse liquid containing an organic solvent.

In the method of forming a pattern according to the present invention, preferably, a baking step is performed after the exposing step.

In the method of forming a pattern according to the present invention, the exposing step can be performed two or more times.

In the method of forming a pattern according to the present invention, the baking step can be performed two or more times.

When, as aforementioned, the resin (A) is a resin whose polarity is increased by the action of an acid so that the solubility of the resin in a developer containing an organic solvent is decreased and so that the solubility of the resin in an alkali developer is increased, the actinic-ray- or radiation-sensitive resin composition according to the present invention can be appropriately used for multiple development in the patterning method of the present invention. In this patterning, a negative image formation (areas of less exposure amount dissolved) is realized when the development is carried out using the "developer containing an organic solvent", and a positive image formation (areas of greater exposure amount dissolved) is realized when the development is carried out using the "alkali developer".

Illustratively, in one mode of the patterning method of the present invention, as a technology for enhancing the resolving power, the actinic-ray- or radiation-sensitive resin composition containing a resin (A) whose polarity is increased by the action of an acid so that the solubility of the resin in the developer containing an organic solvent is decreased and so that the solubility of the resin in an alkali developer is increased, a photoacid generator (B) that when exposed to actinic rays or radiation, generates an acid containing a fluorine atom and a solvent (C), wherein the photoacid generator (B) is contained in the composition in a ratio of 8 to 20 mass % based on the total solids of the composition, is used for multiple development. This actinic-ray- or radiation-sensitive resin composition excels in not only the developability performance via an organic-solvent-containing developer capable of selectively dissolving/removing areas exposed with an exposure amount not greater than a given threshold value $T_1$, but also the developability performance via an alkali developer capable of selectively dissolving/removing areas exposed with an exposure amount not smaller than a given threshold value $T_2$. Therefore, a pattern can be formed by multiple development of the actinic-ray- or radiation-sensitive resin composition with the use of the alkali developer capable of selectively dissolving/removing areas exposed with an exposure amount not smaller than a given threshold value $T_2$ and the organic-solvent-containing developer capable of selectively dissolving/removing areas exposed with an exposure amount not greater than a given threshold value $T_1$.

Figure 3:
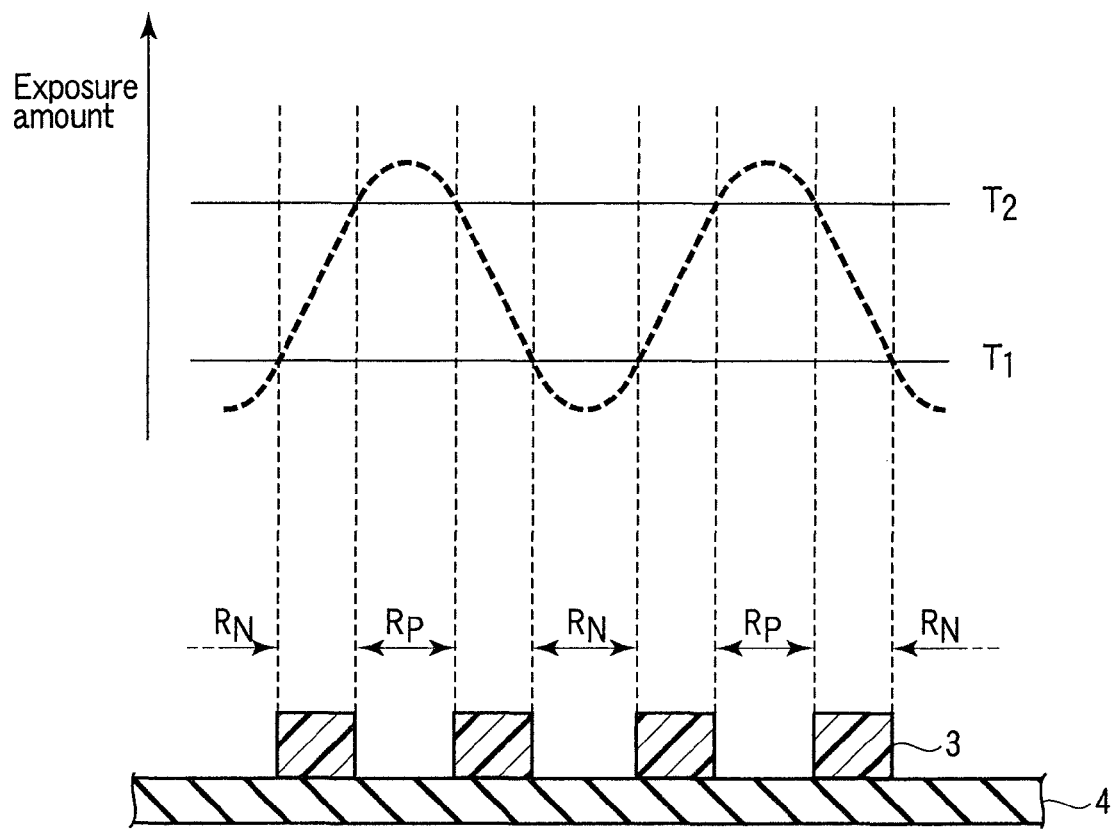
FIG. 3 is a schematic view for explaining a threshold value ($T_2$) of exposure amount applied in positive development and a threshold value ($T_1$) of exposure amount applied in negative development in another mode of a patterning method in which both positive development and negative development are carried out.

For example, referring to FIG. 3, upon projection of an exposure mask pattern element (not shown) upon a wafer 4 by light irradiation, regions $R_P$ of high light irradiation intensity (areas exposed with an exposure amount not smaller than a given threshold value $T_2$) are dissolved and removed by the application of an alkali developer, and regions $R_N$ of low light irradiation intensity (areas exposed with an exposure amount not greater than a given threshold value $T_1$) are dissolved and removed by the application of a developer containing an organic solvent. Thus, a pattern of a resolving power corresponding to twice the frequency of an optical aerial image (light intensity distribution) can be obtained.

When a patterning process is carried out using two types of developers, namely an alkali developer and a developer containing an organic solvent, the order of respective developments is not particularly limited. However, it is preferred to, after the first exposure, perform a positive or negative development using an alkali developer or a developer containing an organic solvent and thereafter perform a negative or positive development using a developer different from the first developer. Further, it is preferred to, after the negative development, rinse the developed pattern with the use of a rinse liquid for negative development containing an organic solvent.

As patterning methods, there can be mentioned a method (a) in which a chemical reaction, such as polarity conversion, is utilized and a method (b) in which intermolecular bond formation, such as a crosslinking reaction or polymerization reaction, is utilized.

With respect to resist materials in which the molecular weight of a resin is increased by intermolecular bonding, such as a crosslinking reaction or polymerization reaction, it has been difficult to construct a system in which a resist material acts positively when a certain developer is used and acts negatively when another developer is used.

When the resin (A) contained in the composition of the present invention is a resin whose polarity is increased by the action of an acid so that the solubility of the resin in a developer containing an organic solvent is decreased and so that the solubility of the resin in an alkali developer is increased, it is feasible to produce a film that has its solubility in the developer containing an organic solvent decreased but has its solubility in the alkali developer increased upon exposure to actinic rays or radiation. Accordingly, a single actinic-ray- or radiation-sensitive resin composition can simultaneously act positively when an alkali developer is applied and act negatively when a developer containing an organic solvent is applied.

In the present invention, it is important t control the "threshold value" of exposure amount (in the region of light exposure, exposure amount solubilizing or insolubilizing the film in a developer). Illustratively, the "threshold value" is the minimum exposure amount for solubilization in an alkali developer or the minimum exposure amount for insolubilization in a developer containing an organic solvent so as to realize a desired line width in a patterning operation.

The "threshold value" can be determined in the following manner.

As mentioned above, the threshold value is the minimum exposure amount for solubilization in an alkali developer, or the minimum exposure amount for insolubilization in a developer containing an organic solvent so as to realize a desired line width in a patterning operation.

More precisely, the threshold value is defined as follows.

Figures 4A, 4B:
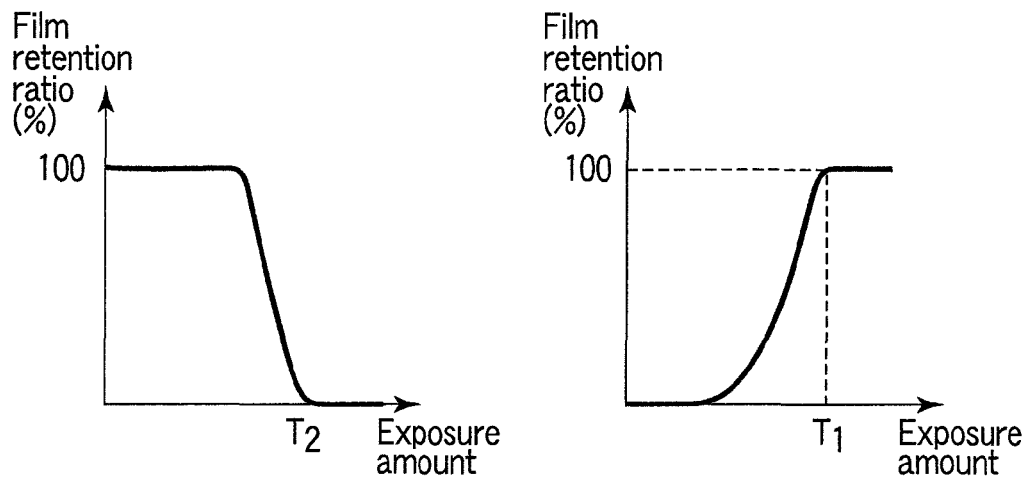
FIG. 4A is a graph showing the relationship between exposure amount and film retention ratio exhibited in the use of a positive developer.
FIG. 4B is a graph showing the relationship between exposure amount and film retention ratio exhibited in the use of a negative developer.

In the measurement of film retention ratio versus exposure amount with respect to the film of the actinic-ray- or radiation-sensitive resin composition, as shown in FIG. 4A, the exposure amount at which the film retention ratio is 0% in the use of an alkali developer is defined as the threshold value $T_2$. Further, as shown in FIG. 4B, the exposure amount at which the film retention ratio is 100% in the use of a developer containing an organic solvent is defined as the threshold value $T_1$.

Figure 5A:
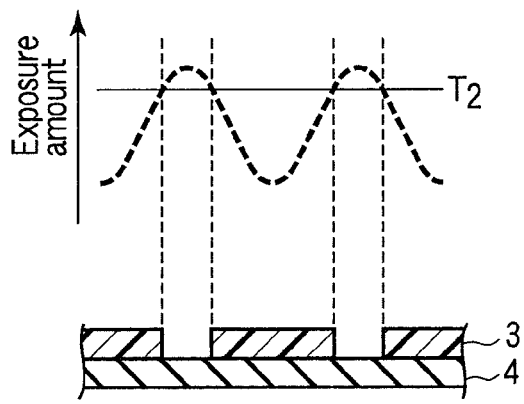
FIG. 5A and FIG. 5B are schematic views for explaining one aspect of the relationship between the threshold value ($T_2$) in positive development and the threshold value ($T_1$) in negative development.
Figure 5B:
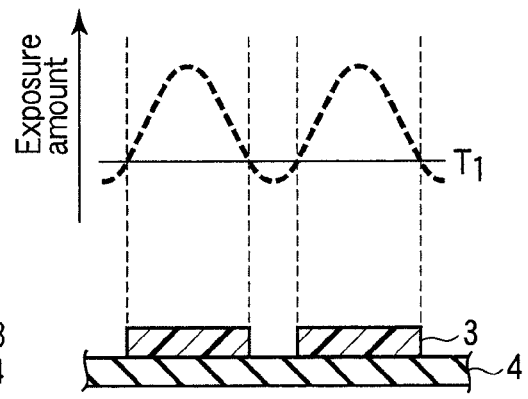
Figure 6A:
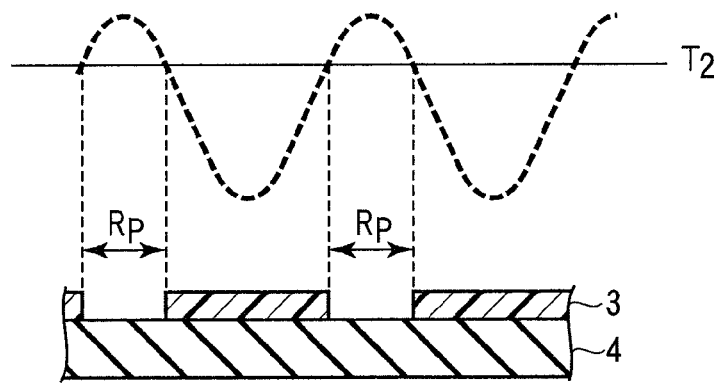
FIG. 6A and FIG. 6B are a process flow chart showing one mode of the method of the present invention.
Figure 6B:
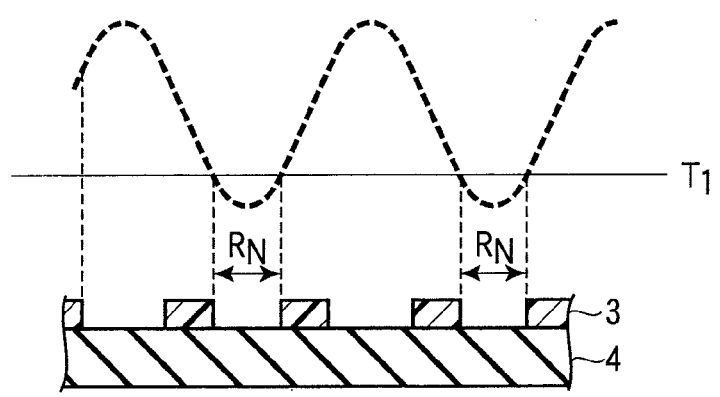

For example, referring to FIGS. 5A and B, a pattern formation by one-time exposure can be realized by causing the threshold value $T_2$ of the exposure amount for solubilization into an alkali developer to be higher than the threshold value $T_1$ of the exposure amount for solubilization into a developer containing an organic solvent. That is, a pattern formation by one-time exposure can be realized by, as shown in FIG. 6A, exposing to light the film of actinic-ray- or radiation-sensitive resin composition provided on a wafer 4 and thereafter first dissolving regions $R_P$ exposed with an exposure amount not smaller than the threshold value $T_2$ by a positive developer and subsequently, as shown in FIG. 6B, dissolving regions $R_N$ exposed with an exposure amount not greater than the threshold value $T_1$ by a negative developer. In this operation, the development using an alkali developer may precede the development using a developer containing an organic solvent, and vice versa. More favorable patterning can be realized by rinsing with a rinse liquid containing an organic solvent after the negative development.

As the method for controlling the threshold values, there can be mentioned a method of controlling material-associated parameters relating to the actinic-ray- or radiation-sensitive resin composition and the developer. Further, process-associated parameters can be controlled in combination with the material-associated parameters.

With respect to the material-associated parameters, it is effective to control various property values, such as the SP value (solubility parameter) and Log P value, associated with the developer for the actinic-ray- or radiation-sensitive resin composition and the solubility thereof in an organic solvent. In particular, the material-associated parameters include, in connection with the constituents of the actinic-ray- or radiation-sensitive resin composition, the weight average molecular weight, molecular weight dispersity, monomer ratio, monomer polarity, monomer sequence and polymer blend of resin (A), the addition of low-molecular additives and the hydrophilicity/hydrophobicity of low-molecular components, such as a photoacid generator and a basic compound, and further include, in connection with the developer, the developer concentration, addition of low-molecular additives, the addition of a surfactant, etc.

As the process-associated parameters, there can be mentioned the temperature for film formation, the duration of film formation, the number of exposures effected, the temperature for post-exposure bake, the duration thereof, the number of post-exposure bakes effected, the temperature for development, the duration of development, a nozzle system of a development unit (puddle method), a rinse method after development, etc.

Accordingly, from the viewpoint of obtaining a desirable pattern in the patterning method using a developer containing an organic solvent and in the patterning method by multiple development using both a developer containing an organic solvent and an alkali developer, it is important to appropriately control the above material-associated parameters and to further appropriately control the process-associated parameters and combine the same with the material-associated parameters.

In the patterning process using two types of developers, namely, an alkali developer and a developer containing an organic solvent, as aforementioned, exposure may be carried out once, or two or more times. When exposure is carried out twice, the first exposure is performed and followed by the development using either an alkali developer or a developer containing an organic solvent, and the second exposure is performed and followed by a negative or positive development using a developer different from that used in the first development.

Performing exposure two or more times is advantageous in that the degree of freedom for the control of the threshold value in the development subsequent to the first exposure and for the control of the threshold value in the development subsequent to the second exposure can be increased. When exposure is carried out two or more times, it is preferred to render the second exposure amount greater than the first exposure amount. The reason for this is that in the second development, the threshold value is determined on the basis of the amount resulting from arithmetic addition of the first and second exposure amount records, and that when the second exposure amount is sufficiently greater than the first exposure amount, the effect of the first exposure amount is diminished and occasionally can be ignored.

It is preferred for the exposure amount (Eo1[mJ/cm$^2$]) in the first exposure step to be smaller than the exposure amount (Eo2[mJ/cm$^2$]) in the second exposure step by at least 5 mJ/cm$^2$. If so, the effect of the first exposure history on the patterning process by the second exposure can be diminished.

The method of regulating the above-mentioned various material/process-associated parameters is effective for changing the first exposure amount and second exposure amount. It is especially effective to control the temperature of the first bake step and the temperature of the second bake step. That is, for rendering the first exposure amount smaller than the second exposure amount, it is effective to render the temperature of the first bake step higher than the temperature of the second bake step.

The threshold value $T_2$ applicable to positive development has the following correspondence in an actual lithographic process.

A film of an actinic-ray- or radiation-sensitive resin composition having its solubility in an alkali developer increased but having its solubility in a developer containing an organic solvent decreased when exposed to actinic rays or radiation is formed on a substrate. The film is exposed through a photomask of given pattern size to light under given illumination conditions. The exposure is carried out while varying the exposure focus with 0.05 μm increments and varying the exposure amount with 0.5 mJ/cm$^2$ increments. The exposed film is baked at a given temperature for a given period of time. The baked film is developed with an alkali developer of a given concentration for a given period of time. After the development, the line width of the pattern is measured by means of CD-SEM, thereby determining the exposure amount A mJ/cm$^2$ and focus position for the formation of the desired line width. Subsequently, the intensity distribution of an optical image having occurred at the above photomask exposure is computed at the thus specified exposure amount A mJ/cm$^2$ and specified focus position. The computation can be performed using simulation software (Prolith ver. 9.2.0.15 compiled by KLA). The details of the computation method are described in Inside PROLITH (written by Chris. A. Mack, FINLE Technologies, Inc., Chapter 2 Aerial Image Formation).

Figure 8:
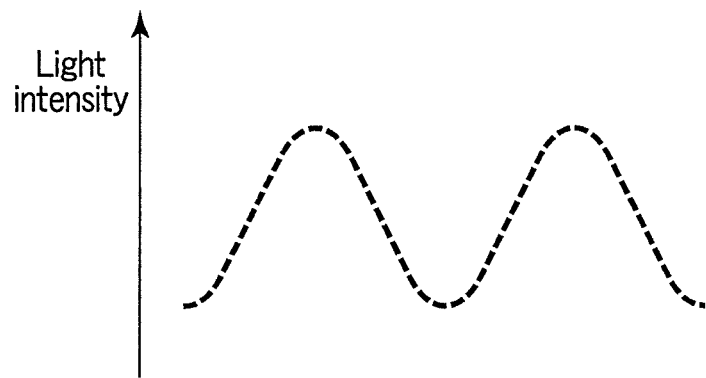
FIG. 8 is a view showing the spatial intensity distribution of an optical image.

The spatial intensity distribution of an optical image as shown in FIG. 8 is obtained as an example of computation results.

Figure 9:
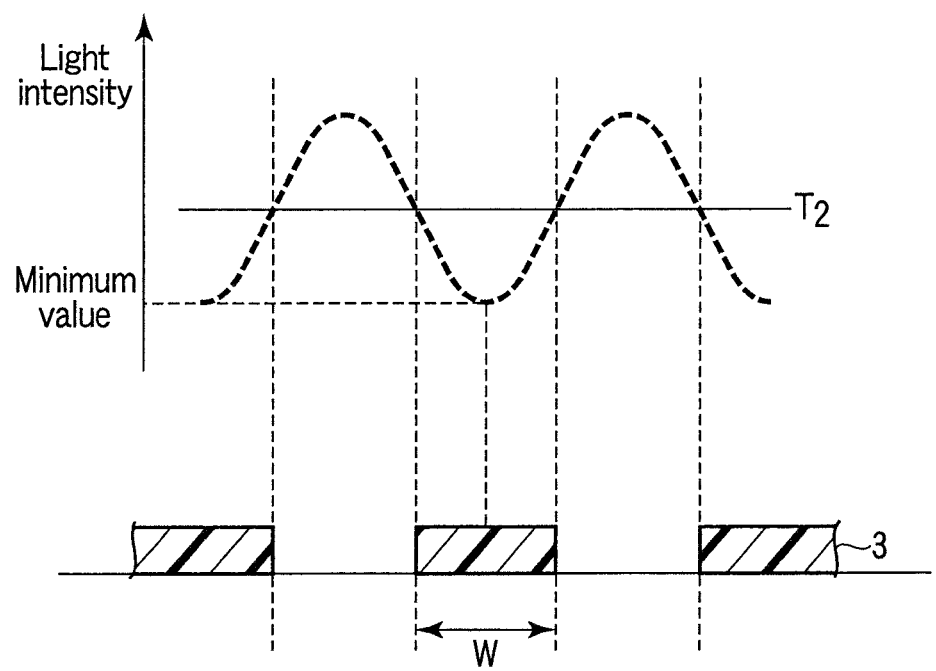
FIG. 9 is a schematic view showing the relationship between the threshold value $T_2$ in positive development and the light intensity.

Referring to FIG. 9, the light intensity at the position at which the spatial position is shifted by ½ of the obtained pattern line width from the minimum value of the spatial intensity distribution of the optical image corresponds to the threshold value $T_2$.

The threshold value $T_1$ applicable to negative development has the following correspondence in an actual lithographic process.

A film of an actinic-ray- or radiation-sensitive resin composition containing a resin whose polarity is increased by the action of an acid so that the solubility thereof in a developer containing an organic solvent is decreased when exposed to actinic rays or radiation is formed on a substrate. The film is exposed through a photomask of a given pattern size to light under given illumination conditions. The exposure is carried out while varying the exposure focus with 0.05 μm increments and varying the exposure amount with 0.5 mJ/cm² increments. The exposed film is baked at a given temperature for a given period of time. The baked film is developed with an organic developer of a given concentration for a given period of time. After the development, the line width of the pattern is measured by means of CD-SEM, thereby determining the exposure amount A mJ/cm² and focus position for the formation of desired line width. Subsequently, the intensity distribution of an optical image having occurred at the above photomask exposure is computed at the thus specified exposure amount A mJ/cm² and specified focus position. The computation is performed using simulation software (Prolith compiled by KLA).

Figure 10:
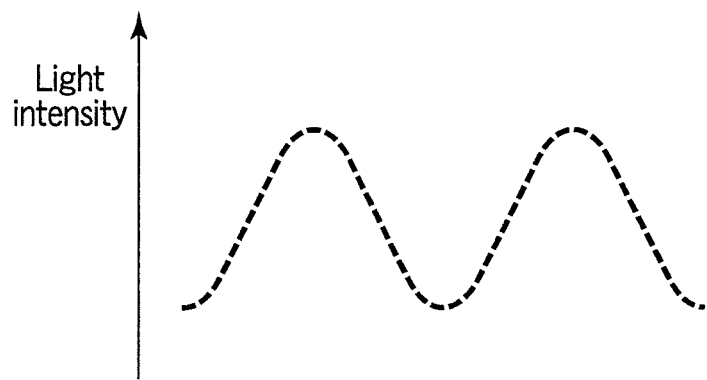
FIG. 10 is a schematic view showing the spatial intensity distribution of an optical image.

For example, the spatial intensity distribution of an optical image as shown in FIG. 10 is obtained.

Figure 11:
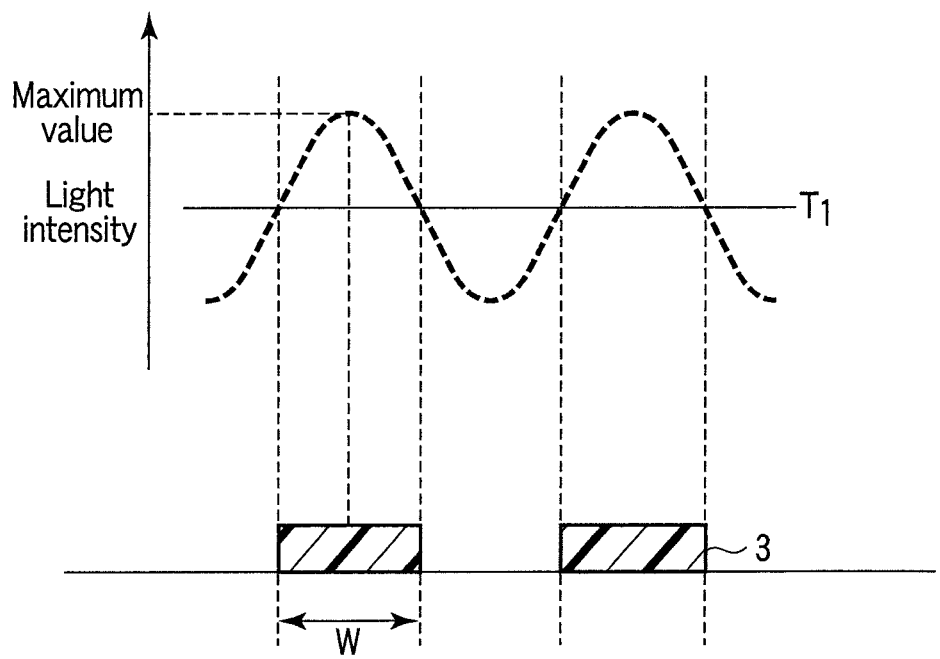
FIG. 11 is a schematic view showing the relationship among negative development, threshold value $T_1$ and light intensity.

Referring to FIG. 11, the light intensity at the position at which the spatial position is shifted by ½ of the obtained pattern line width from the maximum value of the spatial intensity distribution of the optical image is defined as the threshold value $T_1$.

The threshold value $T_2$ is preferably in the range of 0.1 to 100 mJ/cm², more preferably 0.5 to 50 mJ/cm² and further preferably 1 to 30 mJ/cm². The threshold value $T_1$ is preferably in the range of 0.1 to 100 mJ/cm², more preferably 0.5 to 50 mJ/cm² and further preferably 1 to 30 mJ/cm². The difference between threshold value $T_2$ and threshold value $T_1$ is preferably in the range of 0.1 to 80 mJ/cm², more preferably 0.5 to 50 mJ/cm² and further preferably 1 to 30 mJ/cm².

Figure 7A:
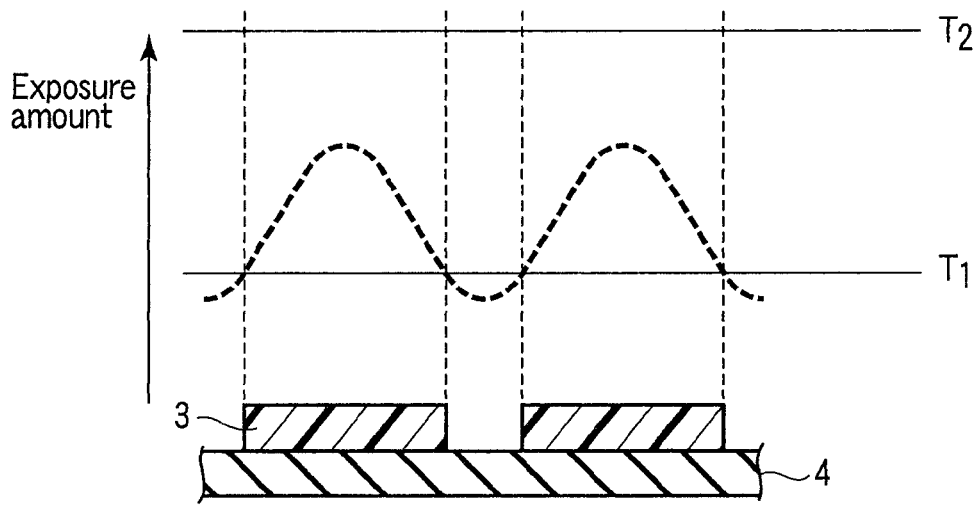
FIG. 7A and FIG. 7B are schematic views for explaining the relationship between threshold value ($T_1$, $T_2$) and PEB in one mode of a patterning method in which both positive development and negative development are carried out.
Figure 7B:
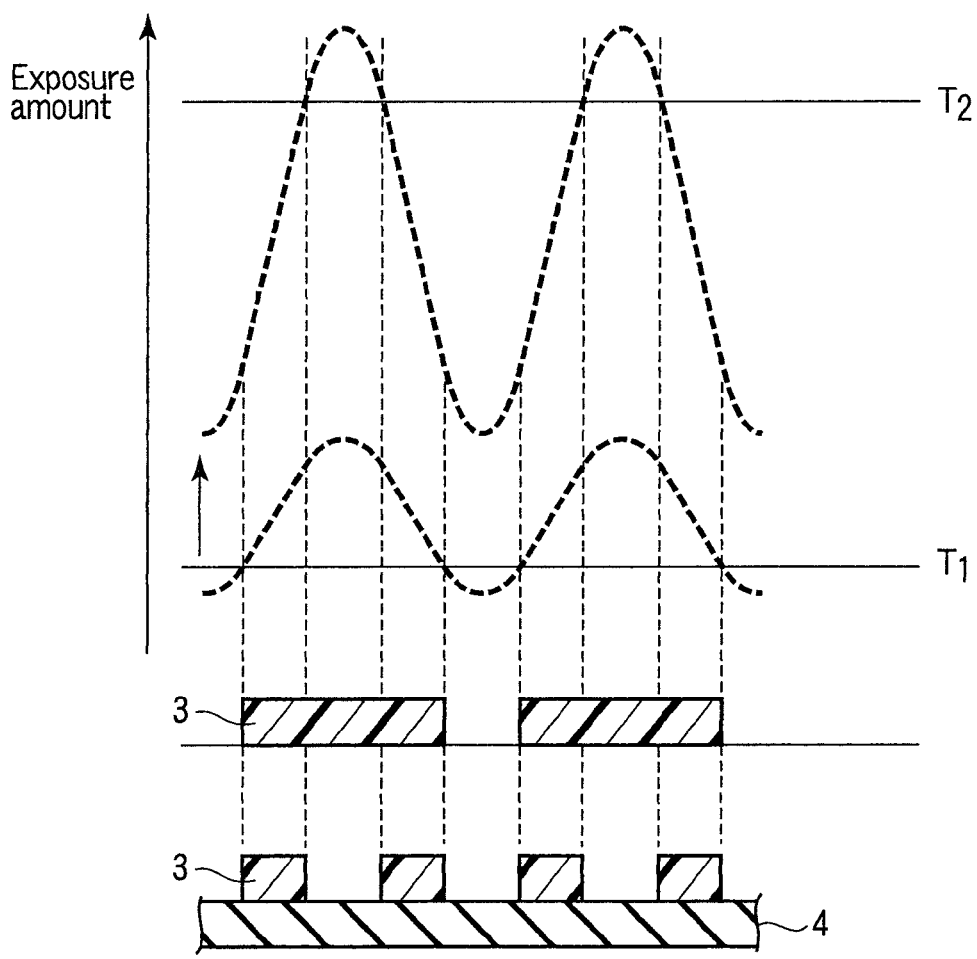

When the patterning method of the present invention includes a multiple development step, in one mode, the method can include a plurality of post-exposure bake (PEB) operations. Illustratively, with respect to the actinic-ray- or radiation-sensitive resin composition for use in the present invention, when it is difficult to form a pattern by multiple development because of a large difference between the threshold value $T_2$ of exposure amount for solubilization in an alkali developer and the threshold value $T_1$ of exposure amount for solubilization in a developer containing an organic solvent, it is preferred to control the threshold value of exposure amount by carrying out PEB prior to the second development. For example, when, referring to FIG. 7A, patterning by multiple exposure is infeasible because of a large difference between the threshold value $T_2$ and the threshold value $T_1$ of the composition, removal of protective groups from resin (A) can be promoted by carrying out PEB prior to the second development, so that, referring to FIG. 7B, the same effect as in the increase of exposure amount can be attained. Thus, double patterning by multiple development can be realized.

The actinic-ray- or radiation-sensitive resin composition for use in the present invention is one containing a resin (A) whose polarity is increased by the action of an acid so that the solubility of the resin in a negative developer is decreased, and a photoacid generator (B) that when exposed to actinic rays or radiation, generates an acid containing a fluorine atom and a solvent (C).

In another aspect of the present invention, a resin whose polarity is increased by the action of an acid so that the solubility of the resin in a developer containing an organic solvent is decreased and so that the solubility of the resin in an alkali developer is increased is used as the resin (A).

The actinic-ray- or radiation-sensitive resin composition that can appropriately be used in the present invention will be described below.

(A) Resin Whose Polarity is Increased by the Action of an Acid

As the resin (A) whose polarity is increased by the action of an acid so that the solubility of the resin in a developer containing an organic solvent is decreased for use in the actinic-ray- or radiation-sensitive resin composition of the present invention, there can be mentioned, for example, a resin (hereinafter also referred to as "acid-decomposable resin" or resin (A)) having, in its principal chain or side chain or both thereof, a group (hereinafter also referred to as "acid-decomposable group") that is decomposed by the action of an acid to thereby generate a polar group.

This resin when having an alkali-soluble group as the polar group generated by acid decomposition is also regarded as a resin whose solubility in an alkali developer is increased by the action of an acid.

As preferred alkali soluble groups, there can be mentioned a carboxyl group, a fluoroalcohol group (preferably hexafluoroisopropanol) and a sulfonate group.

The acid-decomposable group is preferably a group as obtained by substituting the hydrogen atom of any of these alkali soluble groups with an acid eliminable group.

As the acid eliminable group, there can be mentioned, for example, —C($R_{36}$)($R_{37}$)($R_{38}$), —C($R_{36}$)($R_{37}$)(O$R_{39}$), —C($R_{01}$)($R_{02}$)(O$R_{39}$) or the like.

In the formulae, each of $R_{36}$ to $R_{39}$ independently represents an alkyl group, a cycloalkyl group, an aryl group, an aralkyl group or an alkenyl group. $R_{36}$ and $R_{37}$ may be bonded with each other to thereby form a ring structure.

Each of $R_{01}$ to $R_{02}$ independently represents a hydrogen atom, an alkyl group, a cycloalkyl group, an aryl group, an aralkyl group or an alkenyl group.

Preferably, the acid-decomposable group is a cumyl ester group, an enol ester group, an acetal ester group, a tertiary alkyl ester group or the like. A tertiary alkyl ester group is more preferred.

The resin (A) contains a repeating unit having an acid-decomposable group. The repeating unit having an acid-decomposable group is preferably any of those of the following general formula (A).

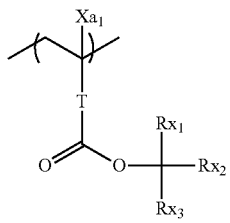
(A)

In the general formula (A),

Xa$_1$ represents a hydrogen atom, a methyl group, a trifluoromethyl group or a hydroxymethyl group, T represents a single bond or a bivalent connecting group, and each of Rx$_1$ to Rx$_3$ independently represents an alkyl group (linear or branched) or a cycloalkyl group (monocyclic or polycyclic), provided that at least two of Rx$_1$ to Rx$_3$ may be bonded with each other to thereby form a cycloalkyl group (monocyclic or polycyclic).

As the bivalent connecting group represented by T, there can be mentioned an alkylene group, a group of the formula —COO-Rt-, a group of the formula —O-Rt- or the like. In the formulae, Rt represents an alkylene group or a cycloalkylene group.

T is preferably a single bond or a group of the formula —COO-Rt-. Rt is preferably an alkylene group having 1 to 5 carbon atoms, more preferably a —CH$_2$— group or —(CH$_2$)$_3$— group.

The alkyl group represented by each of Rx$_1$ to Rx$_3$ is preferably one having 1 to 4 carbon atoms, such as a methyl group, an ethyl group, an n-propyl group, an isopropyl group, an n-butyl group, an isobutyl group or a t-butyl group.

The cycloalkyl group represented by each of Rx$_1$ to Rx$_3$ is preferably a monocyclic alkyl group, such as a cyclopentyl group or a cyclohexyl group, or a polycyclic alkyl group, such as a norbornyl group, a tetracyclodecanyl group, a tetracyclododecanyl group or an adamantyl group.

The cycloalkyl group formed by bonding of at least two of Rx$_1$ to Rx$_3$ is preferably a monocyclic alkyl group, such as a cyclopentyl group or a cyclohexyl group, or a polycyclic alkyl group, such as a norbornyl group, a tetracyclodecanyl group, a tetracyclododecanyl group or an adamantyl group.

In a preferred mode, Rx$_1$ is a methyl group or an ethyl group, and Rx$_2$ and Rx$_3$ are bonded with each other to thereby form any of the above-mentioned cycloalkyl groups.

The content of repeating units having an acid-decomposable group is preferably in the range of 20 to 60 mol %, more preferably 30 to 50 mol %, based on all the repeating units of the resin (A).

Specific examples of the preferred repeating units having acid-decomposable groups will be shown below, which however in no way limit the scope of the present invention.

In the following formulae, Rx represents H, CH$_3$, CF$_3$ or CH$_2$OH. Each of Rxa and Rxb represents an alkyl group having 1 to 4 carbon atoms.

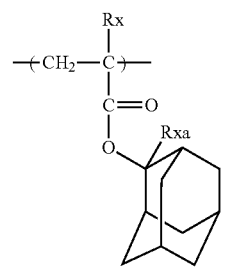
1

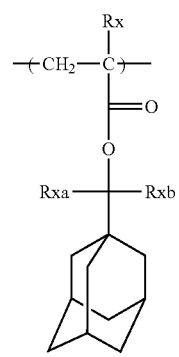
2

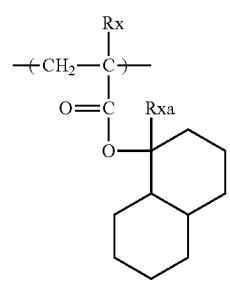
3

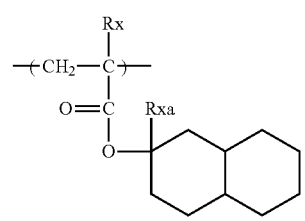
4

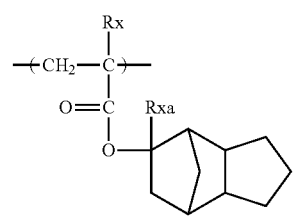
5

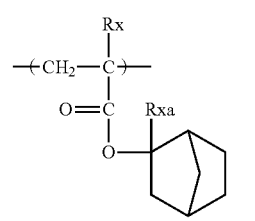
6

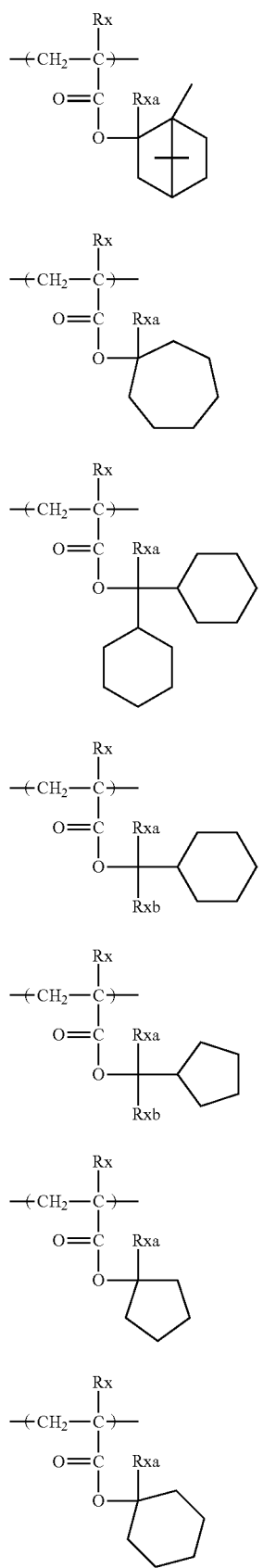
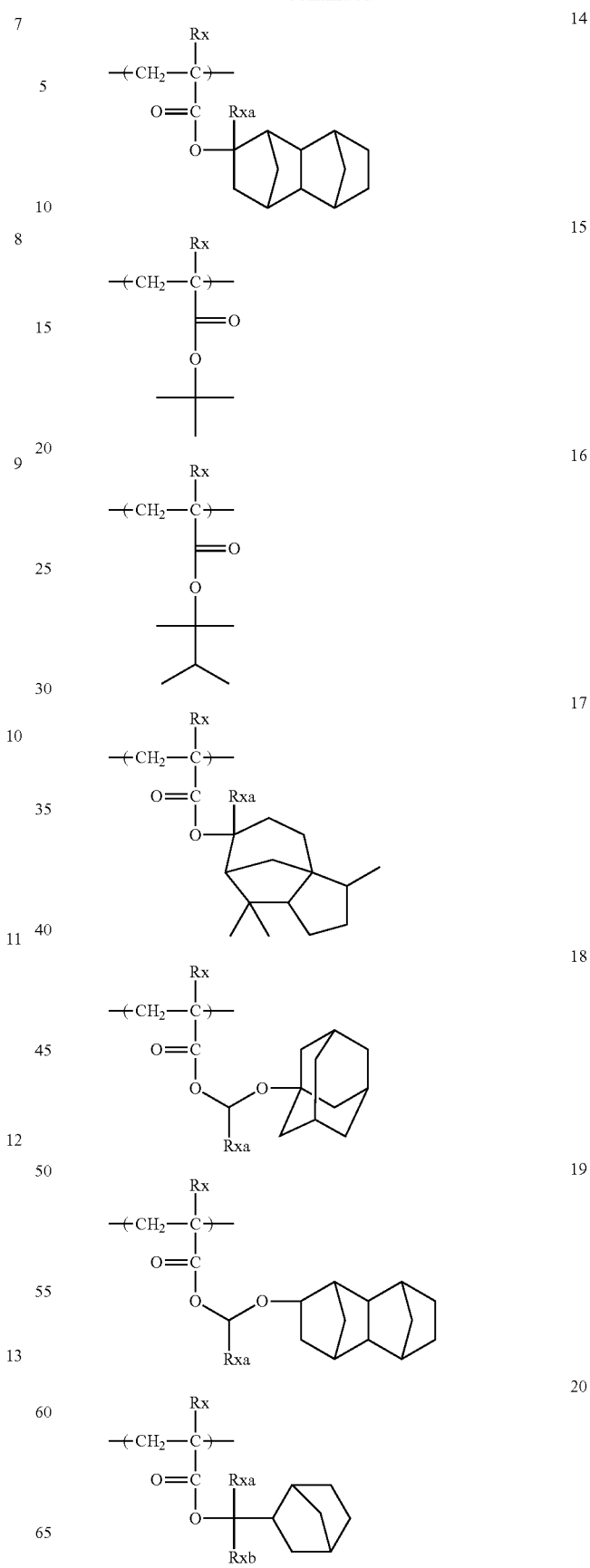

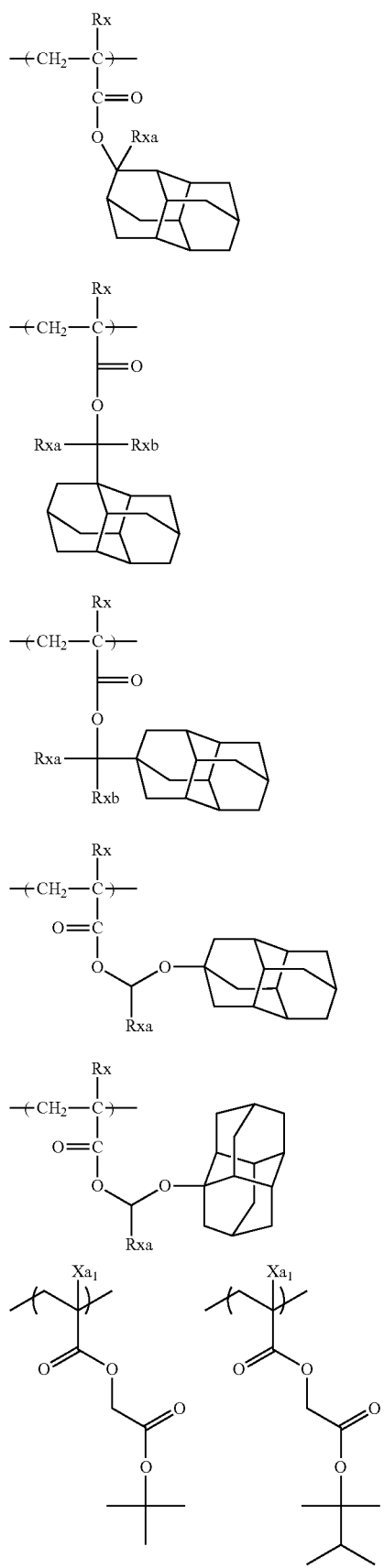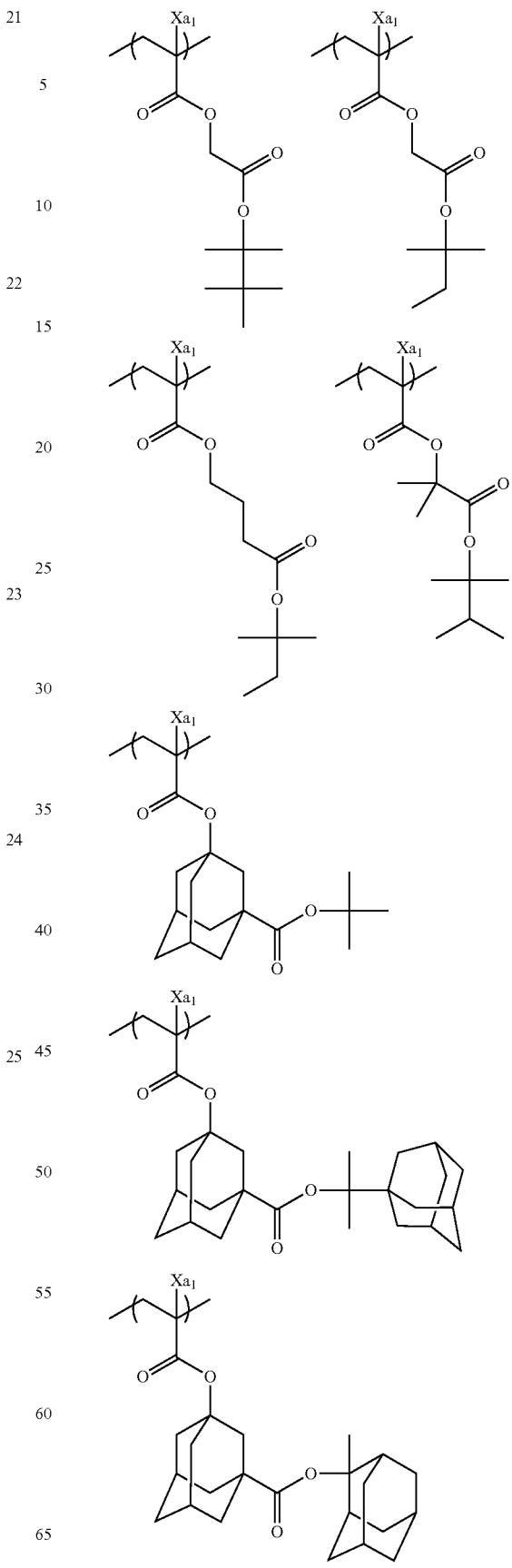

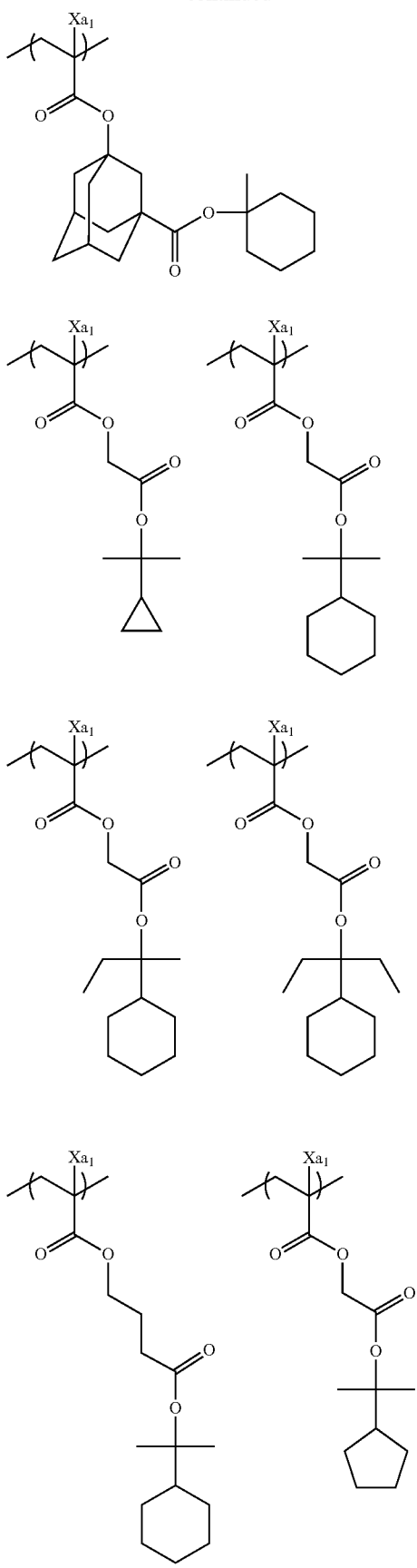
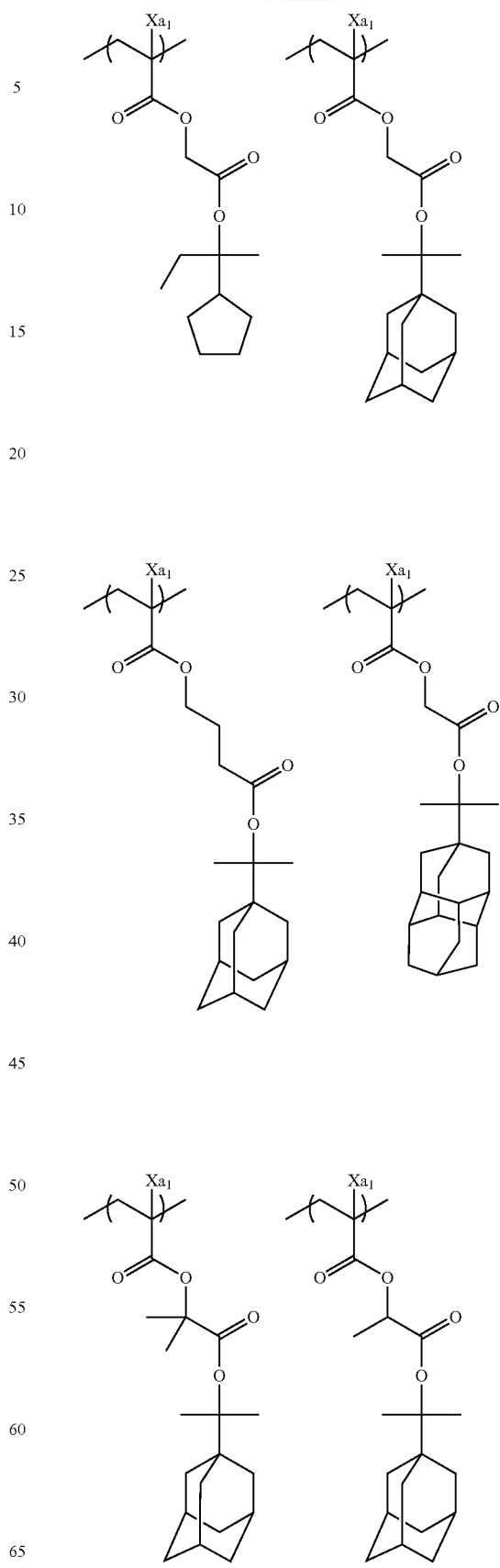

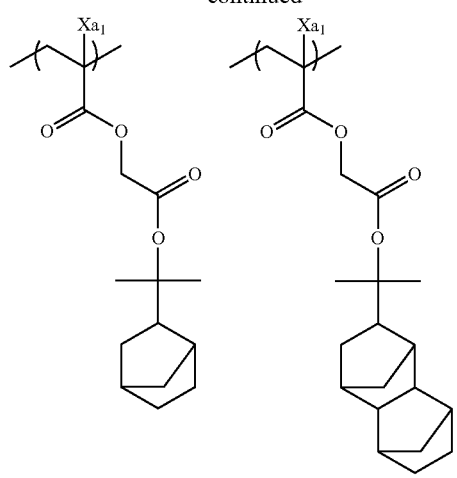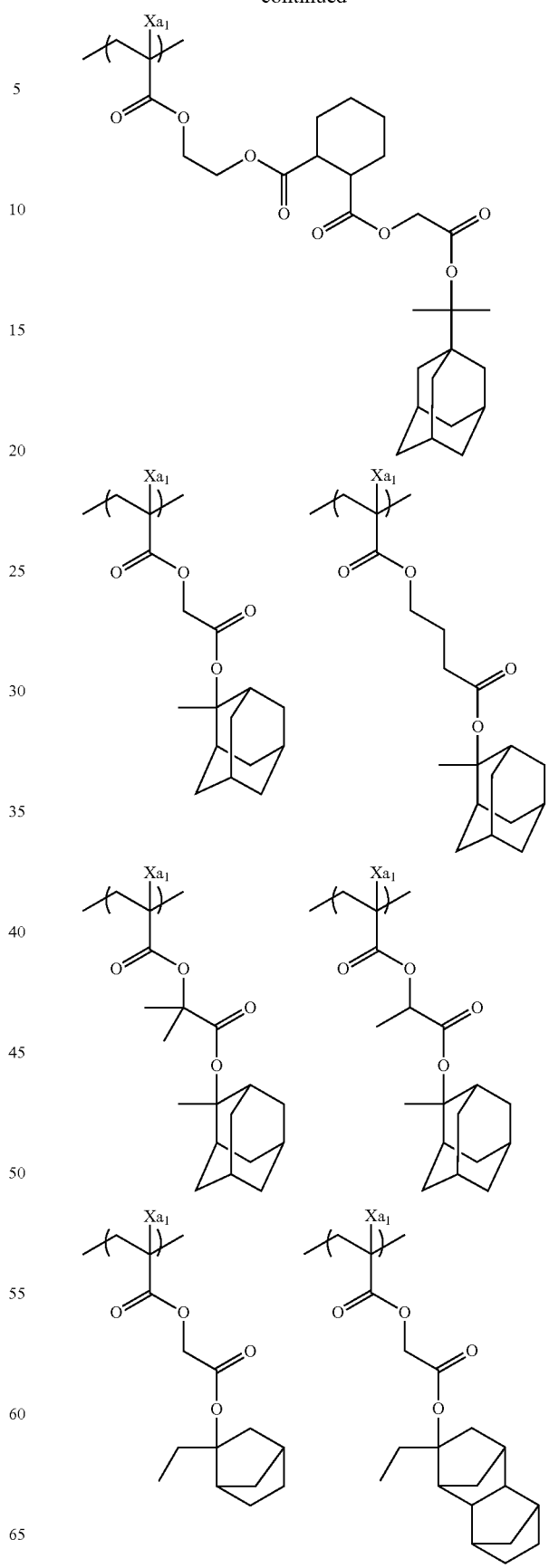

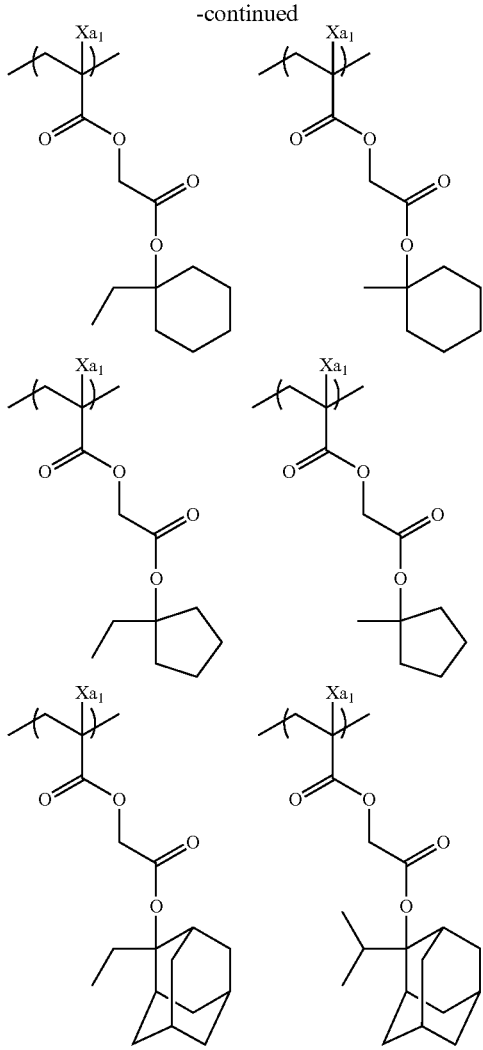

It is more preferred for the resin (A) to be a resin having, as the repeating units of the general formula (A), at least any of the repeating units of general formula (I) below and repeating units of general formula (II) below.

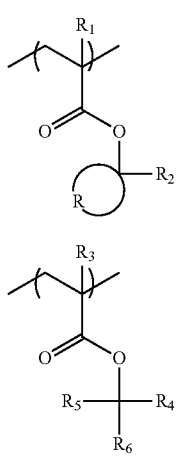

In the general formulae (I) and (II), each of $R_1$ and $R_3$ independently represents a hydrogen atom, an optionally substituted methyl group or any of the groups of the formula $—CH_2—R_9$. $R_9$ represents a monovalent organic group.

Each of $R_2$, $R_4$, $R_5$ and $R_6$ independently represents an alkyl group or a cycloalkyl group.

R represents an atomic group required for forming an alicyclic structure in cooperation with a carbon atom.

$R_1$ preferably represents a hydrogen atom, a methyl group, a trifluoromethyl group or a hydroxymethyl group.

The alkyl group represented by $R_2$ may be linear or branched, and may have a substituent.

The cycloalkyl group represented by $R_2$ may be monocyclic or polycyclic, and may have a substituent.

$R_2$ preferably represents an alkyl group, more preferably an alkyl group having 1 to 10 carbon atoms, especially 1 to 5 carbon atoms. As examples thereof, there can be mentioned a methyl group and an ethyl group.

R represents an atomic group required for forming an alicyclic structure in cooperation with a carbon atom. The alicyclic structure formed by R is preferably an alicyclic structure of a single ring, and preferably has 3 to 7 carbon atoms, more preferably 5 or 6 carbon atoms.

$R_3$ preferably represents a hydrogen atom or a methyl group, more preferably a methyl group.

Each of the alkyl groups represented by $R_4$, $R_5$ and $R_6$ may be linear or branched, and may have a substituent. The alkyl groups preferably are those each having 1 to 4 carbon atoms, such as a methyl group, an ethyl group, an n-propyl group, an isopropyl group, an n-butyl group, an isobutyl group and a t-butyl group.

Each of the cycloalkyl groups represented by $R_4$, $R_5$ and $R_6$ may be monocyclic or polycyclic, and may have a substituent. The cycloalkyl groups are preferably a cycloalkyl group of a single ring, such as a cyclopentyl group or a cyclohexyl group, and a cycloalkyl group of multiple rings, such as a norbornyl group, a tetracyclodecanyl group, a tetracyclododecanyl group or an adamantyl group.

As the repeating units of the general formula (I), there can be mentioned, for example, those of general formula (I-a) below.

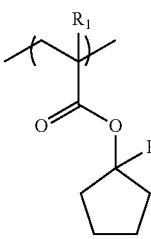

In this formula, $R_1$ and $R_2$ have the same meaning as in the general formula (I).

The repeating units of the general formula (II) are preferably those of general formula (II-1) below.

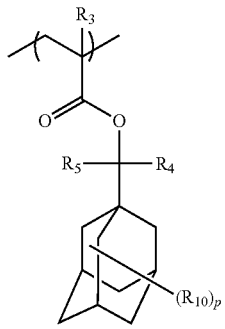

(II-1)

In the general formula (II-1),

R₃ to R₅ have the same meaning as in the general formula (II).

R₁₀ represents a substituent containing a polar group. When a plurality of R₁₀s exist, they may be identical to or different from each other. As the substituent containing a polar group, there can be mentioned, for example, a linear or branched alkyl group, or cycloalkyl group, having a hydroxyl group, a cyano group, an amino group, an alkylamido group or a sulfonamido group. An alkyl group having a hydroxyl group is preferred. An isopropyl group is especially preferred as the branched alkyl group.

In the formula, p is an integer of 0 to 15, preferably in the range of 0 to 2, and more preferably 0 or 1.

It is more preferred for the acid-decomposable resin to be a resin having, as the repeating units of the general formula (A), at least any one of the repeating units of the general formula (I) and at least any one of the repeating units of the general formula (II). It is also more preferred for the acid-decomposable resin in its other form to be a resin having, as the repeating units of the general formula (A), at least two members of the repeating units of the general formula (I).

When a plurality of acid-decomposable repeating units are simultaneously used in the resin (A), preferred combinations thereof are shown below. In the following formulae, each of Rs independently represents a hydrogen atom or a methyl group.

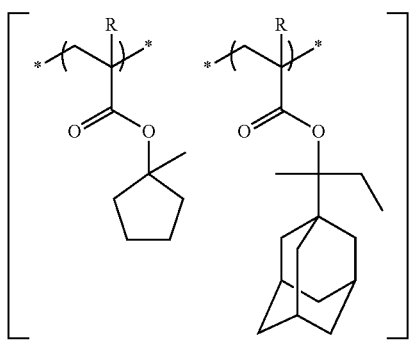

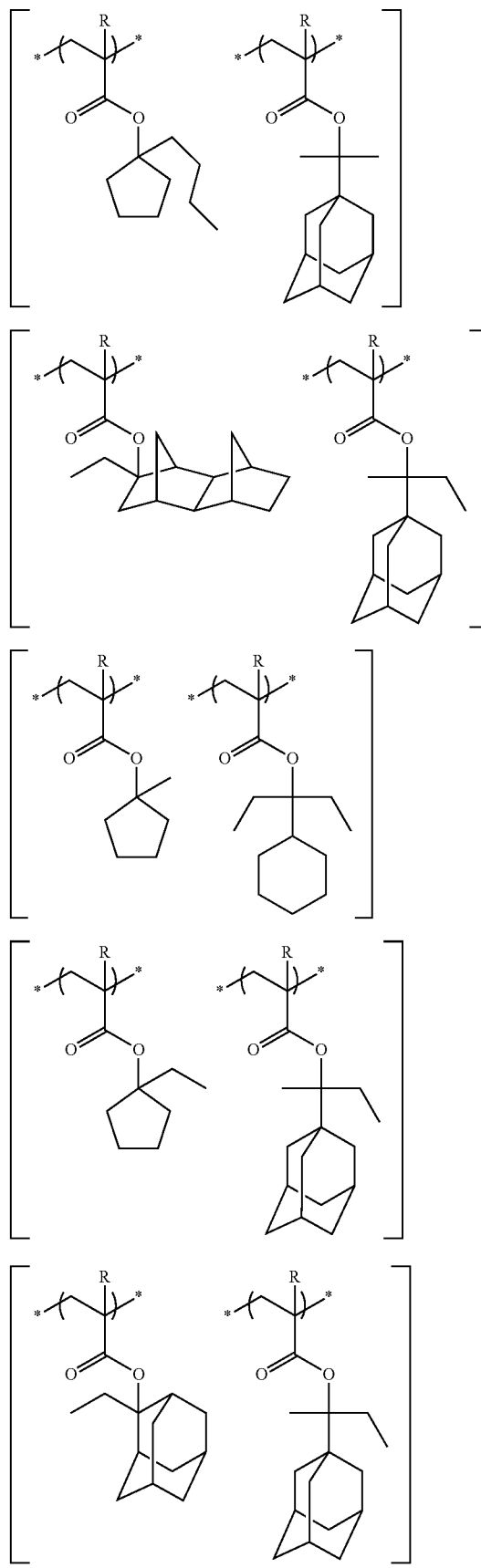

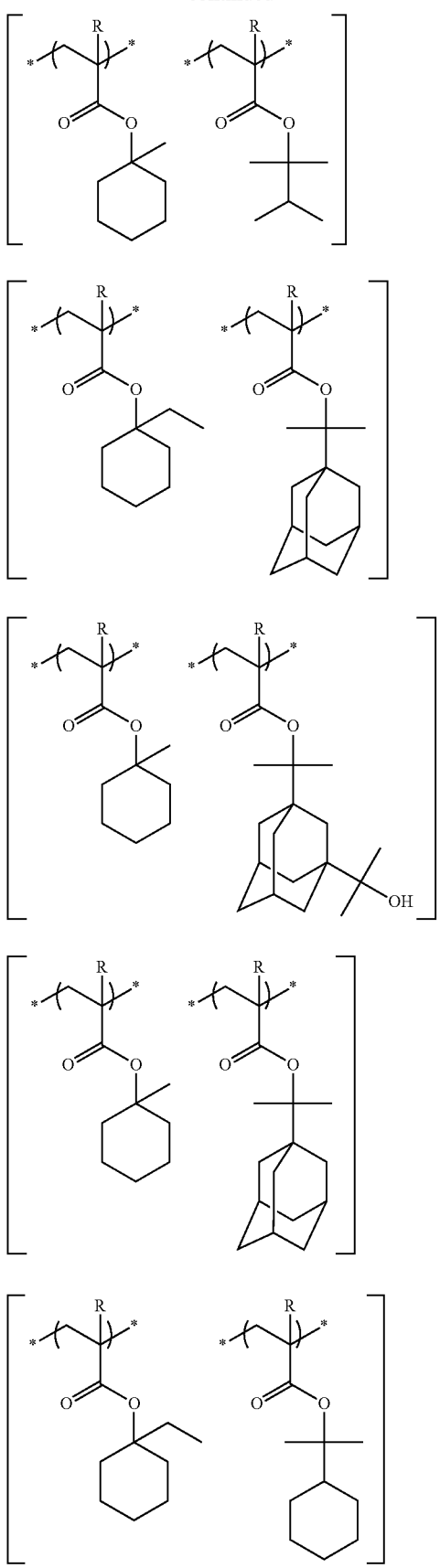
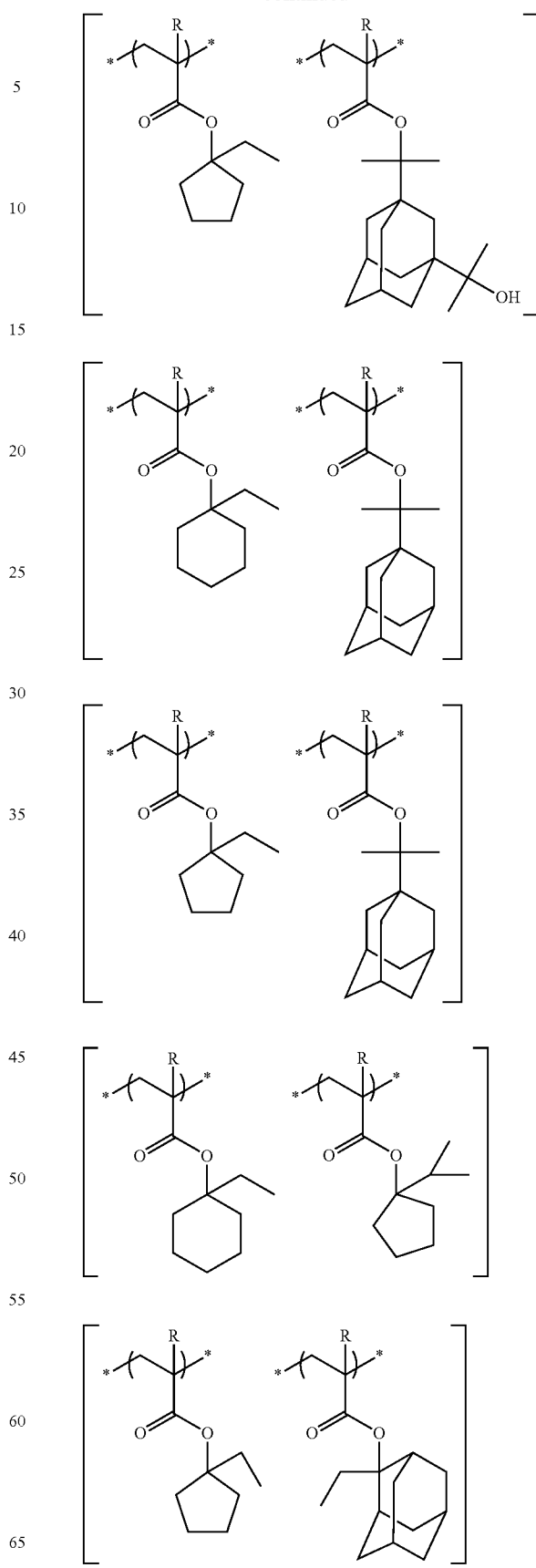

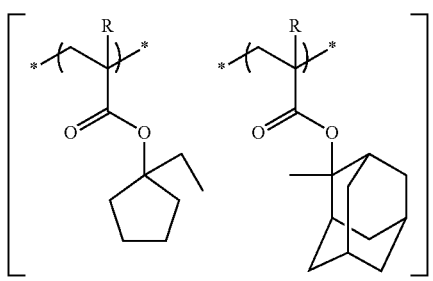

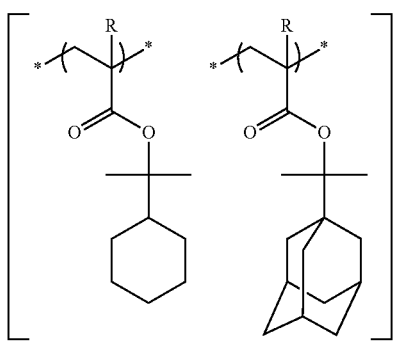

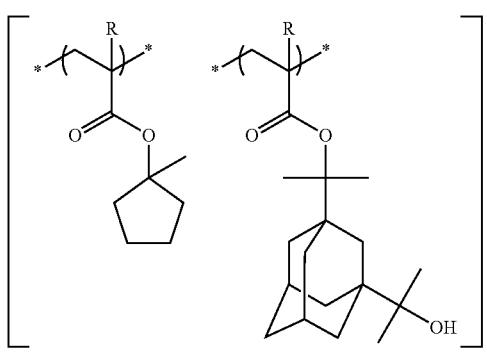

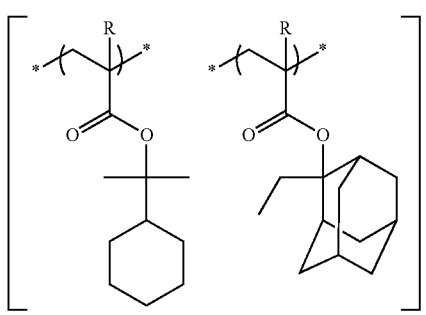

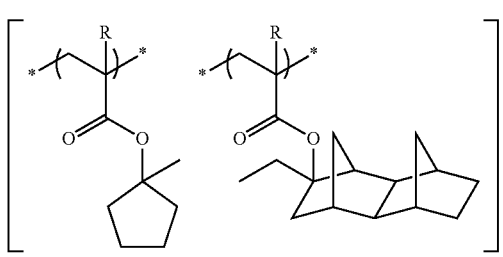

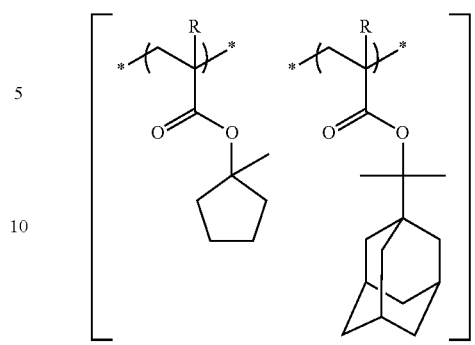

It is preferred for the acid-decomposable resin of the present invention to contain a lactone group. Any lactone groups can be employed as long as a lactone structure is contained therein. However, 5 to 7-membered ring lactone structures are preferred, and in particular, those resulting from condensation of 5 to 7-membered ring lactone structures with other cyclic structures effected in a fashion to form a bicyclo structure or spiro structure are preferred. The possession of the repeating unit having the lactone structure represented by any of the following general formulae (LC1-1) to (LC1-17) is more preferred. The group having a lactone structure may be directly bonded to the principal chain. It is especially preferred to have any of the repeating units of general formula (AII) to be given hereinafter. Improvements in line edge roughness and development defects can be attained by use of specified lactone structures.

LC1-1

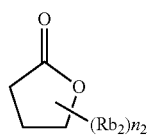

LC1-2

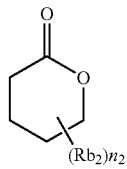

LC1-3

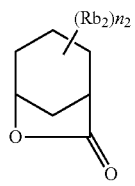

LC1-4

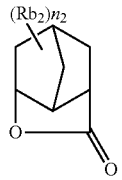

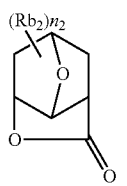 LC1-5

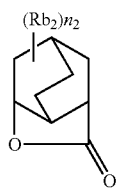 LC1-6

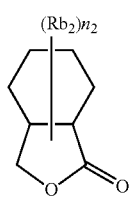 LC1-7

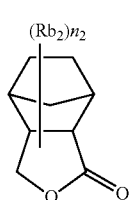 LC1-8

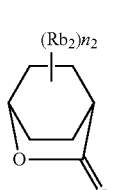 LC1-9

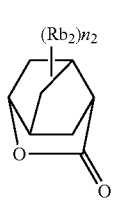 LC1-10

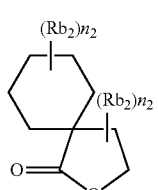 LC1-11

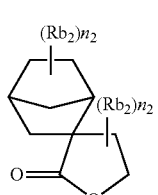 LC1-12

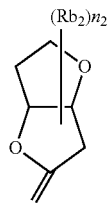 LC1-13

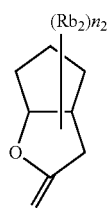 LC1-14

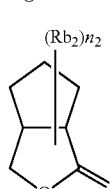 LC1-15

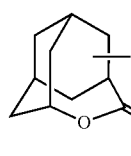 LC1-16

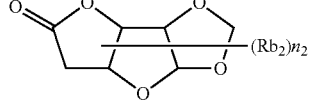 LC1-17

The inclusion of a substituent ($Rb_2$) on the portion of the lactone structure is optional. As a preferred substituent ($Rb_2$), there can be mentioned an alkyl group having 1 to 8 carbon atoms, a cycloalkyl group having 4 to 7 carbon atoms, an alkoxy group having 1 to 8 carbon atoms, an alkoxycarbonyl group having 1 to 8 carbon atoms, a carboxyl group, a halogen atom, a hydroxyl group, a cyano group, an acid-decomposable group or the like. In the formulae, $n_2$ is an integer of 0 to 4. When $n_2$ is 2 or greater, the plurality of present substituents ($Rb_2$) may be identical to or different from each other. Further, the plurality of present substituents ($Rb_2$) may be bonded with each other to thereby form a ring.

As the repeating unit with a lactone structure represented by any of the general formulae (LC1-1) to (LC1-17), there can be mentioned the repeating units represented by the following general formula (AI).

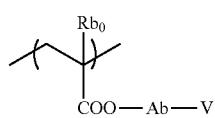

(AI)

In the general formula (AI), $Rb_0$ represents a hydrogen atom, a halogen atom or an optionally substituted alkyl group having 1 to 4 carbon atoms. As a preferred possible substituent of the alkyl group represented by $Rb_0$, there can be mentioned a hydroxyl group or a halogen atom. As the halogen atom represented by $Rb_0$, there can be mentioned a fluorine atom, a chlorine atom, a bromine atom or an iodine atom. As $Rb_0$, a hydrogen atom and a methyl group are preferred.

Ab represents a single bond, an alkylene group, a bivalent connecting group with an alicyclic hydrocarbon structure of a single ring or multiple rings, an ether group, an ester group, a carbonyl group, a carboxyl group, or a bivalent connecting group resulting from a combination thereof. A single bond and a bivalent connecting group of the formula $-Ab_1-CO_2-$ are preferred.

$Ab_1$ is a linear or branched alkylene group or a monocyclic or polycyclic alkylene group, being preferably a methylene group, an ethylene group, a cyclohexylene group, an adamantylene group or a norbornylene group.

V represents a group with a structure represented by any of the general formulae (LC1-1) to (LC1-17).

Among the lactone structures of the above general formula, those included in the following structures are especially preferred.

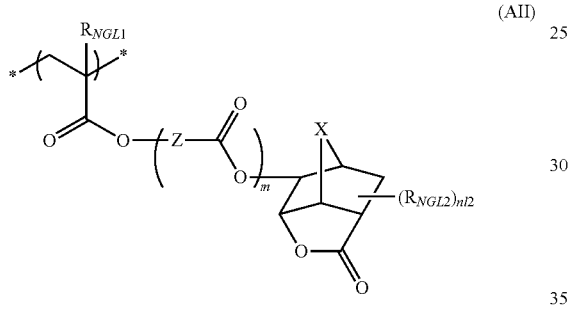

(AII)

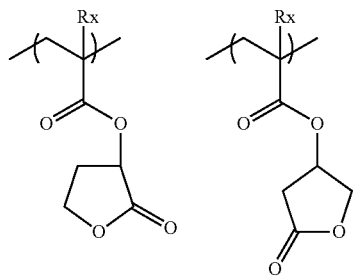

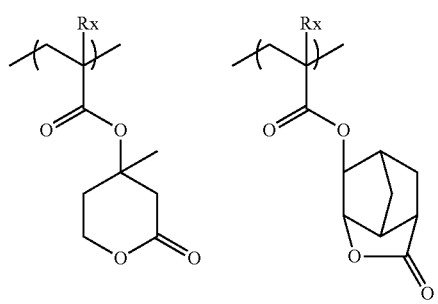

In the general formula (AII), $R_{NGL1}$ represents a hydrogen atom or an alkyl group; $R_{NGL2}$ represents an alkyl group, a cycloalkyl group, an alkoxy group, an alkoxycarbonyl group, a carboxyl group, a halogen atom, a hydroxyl group or a cyano group; X represents a methylene group, a methylmethylene group, a dimethylmethylene group, an ethylene group, an oxygen atom or a sulfur atom; Z, each independently in the instance of Zs, represents a chain or cyclic alkylene group; m represents the number of repetitions and is an integer of 0 to 3; and nl2 is an integer of 0 to 4, provided that when nl2 is 2 or greater, two or more $R_{NGL2}$s may be identical to or different from each other and that two or more $R_{NGL2}$s may be bonded to each other to thereby form a ring.

In general formula (AII), $R_{NGL2}$ is preferably a methyl group and a cyano group, more preferably a cyano group. X is preferably an oxygen atom and a methylene group, more preferably a methylene group.

Each of the repeating units having a lactone group is generally present in the form of optical isomers. Any of the optical isomers may be used. It is both appropriate to use a single type of optical isomer alone and to use a plurality of optical isomers in the form of a mixture. When a single type of optical isomer is mainly used, the optical purity (ee) thereof is preferably 90 or higher, more preferably 95 or higher.

Specific examples of the repeating units having groups with a lactone structure will be shown below, which however in no way limit the scope of the present invention.

In the following specific examples, each of Rx and R independently represents H, $CH_3$, $CF_3$ or $CH_2OH$.

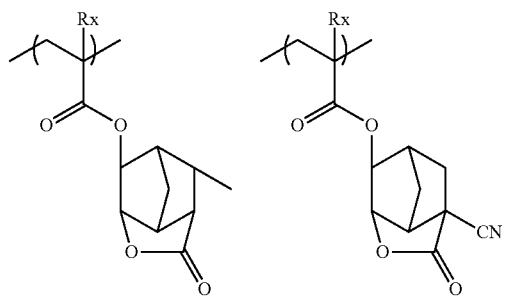

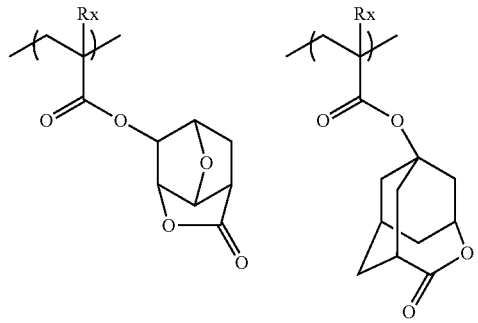

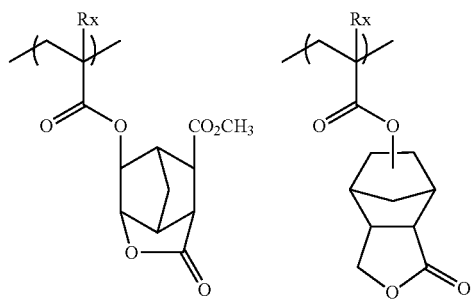

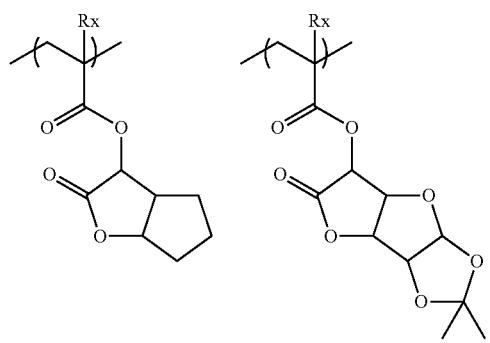
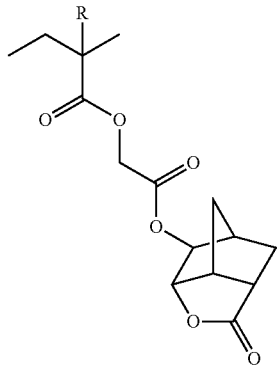
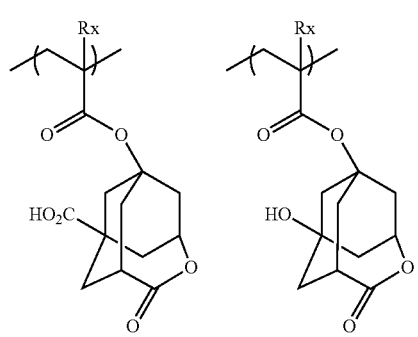
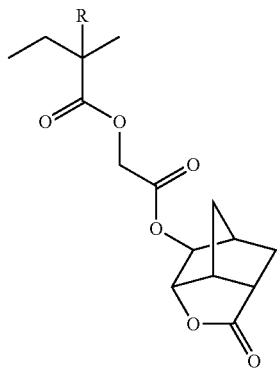
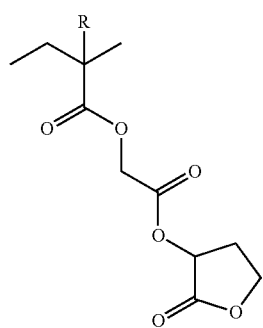
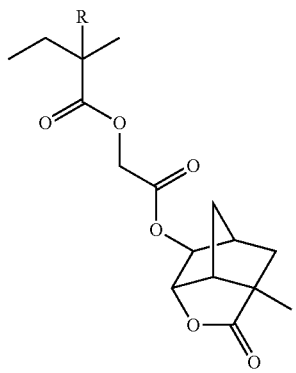
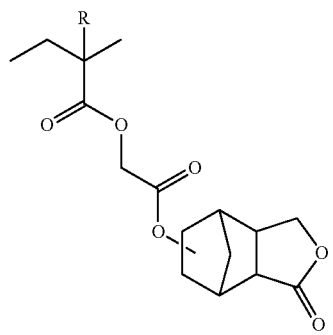
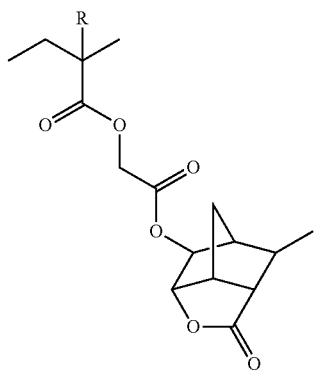
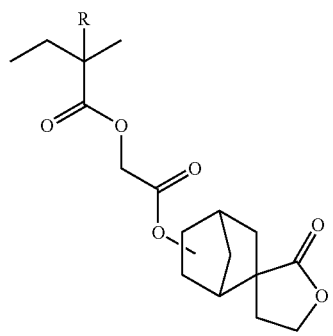

37
-continued
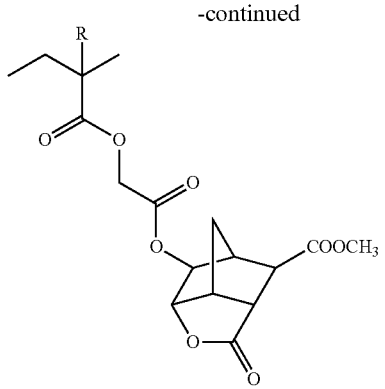
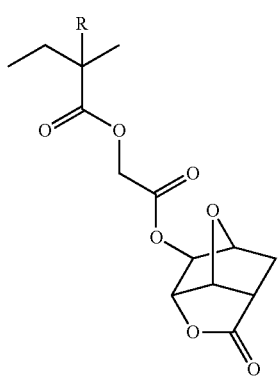
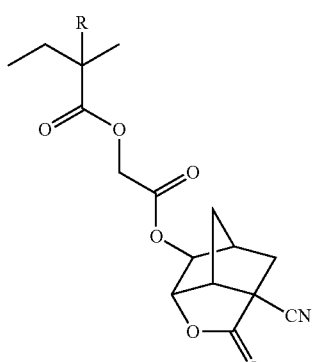
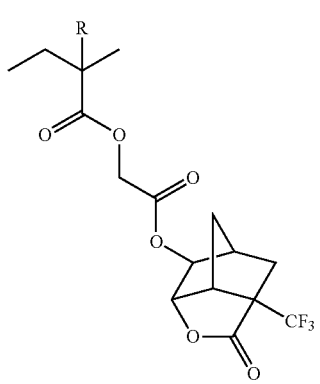
38
-continued
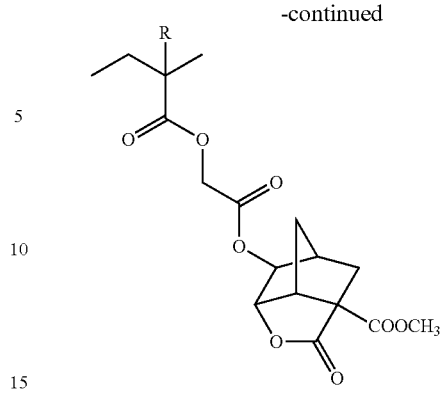
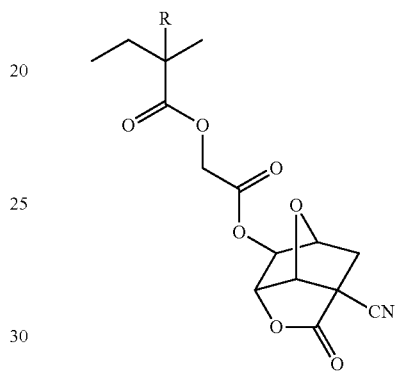
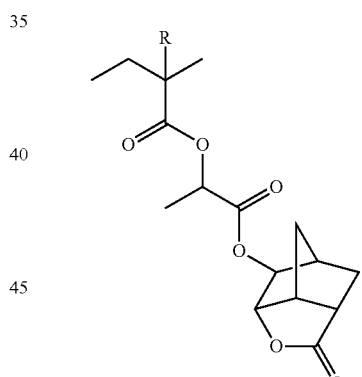
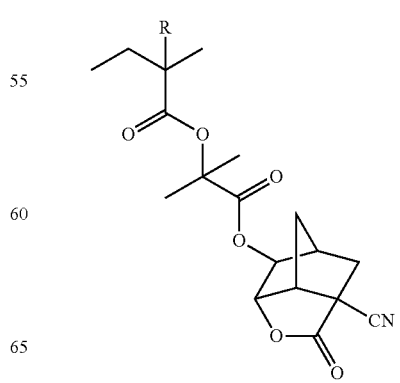

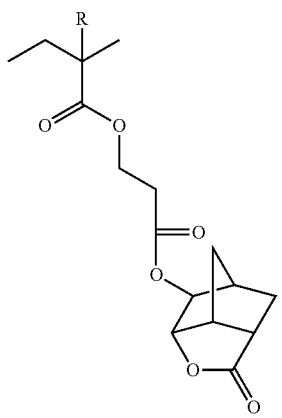
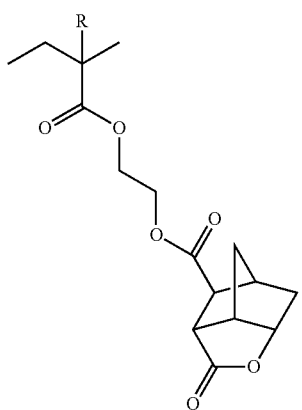
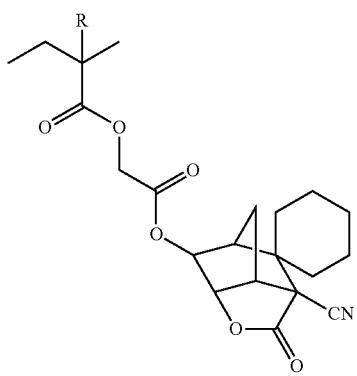
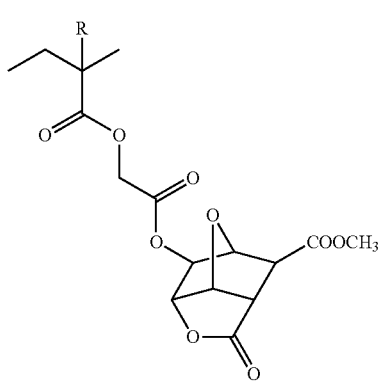
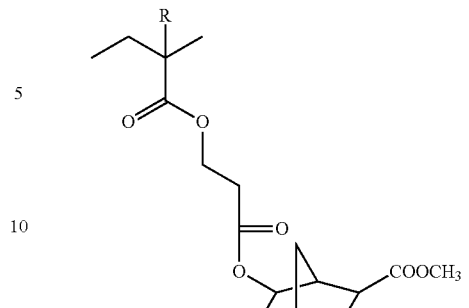
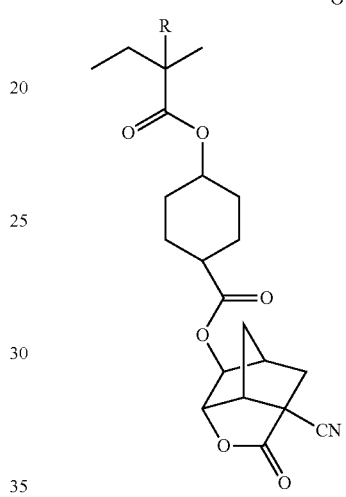

-continued

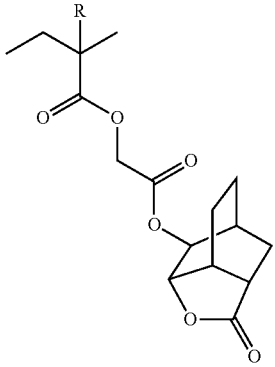

The resin (A) may have only one type of repeating unit containing a group with a lactone structure, or may have two or more types thereof. When the resin (A) has two or more types of lactone repeating units, it is preferred for the resin (A) to have two or more types from the lactone repeating units of general formula (AII) in which m is 1.

The content ratio of repeating units having a lactone group based on all the repeating units of the resin (A) is preferably in the range of 10 to 70 mol %, more preferably 15 to 60 mol % and still more preferably 20 to 50 mol %.

It is preferred for the resin (A) to contain a repeating unit having a hydroxyl group or a cyano group. The containment of this repeating unit would realize enhancements of adhesion to substrate and developer affinity. The repeating unit having a hydroxyl group or a cyano group is preferably a repeating unit having an alicyclic hydrocarbon structure substituted with a hydroxyl group or a cyano group. Regarding the alicyclic hydrocarbon structure substituted with a hydroxyl group or a cyano group, the alicyclic hydrocarbon structure is preferably an adamantyl group, a diamantyl group or a norbornyl group. As preferred alicyclic hydrocarbon structures substituted with a hydroxyl group or a cyano group, there can be mentioned a monohydroxyadamantyl group, a dihydroxyadamantyl group, a monohydroxydiamantyl group, a dihydroxydiamantyl group, a norbornyl group substituted with a cyano group or the like.

As the repeating units having the above atomic groups, there can be mentioned those of general formulae (AIIa) to (AIId) below.

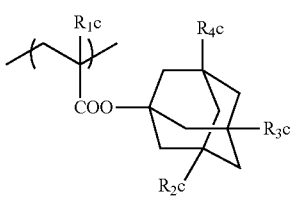
(AIIa)

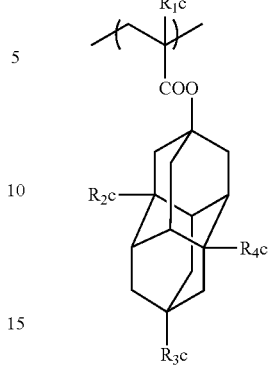
(AIIb)

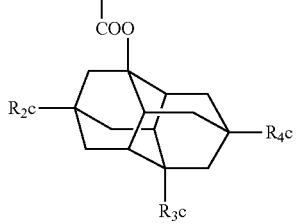
(AIIc)

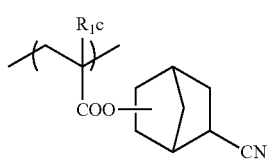
(AIId)

In general formulae (AIIa) to (AIId), $R_1c$ represents a hydrogen atom, a methyl group, a trifluoromethyl group or a hydroxymethyl group.

Each of $R_2c$ to $R_4c$ independently represents a hydrogen atom, a hydroxyl group or a cyano group, provided that at least one of the $R_2c$ to $R_4c$ represents a hydroxyl group or a cyano group. Preferably, one or two of the $R_2c$ to $R_4c$ are hydroxyl groups and the remainder is a hydrogen atom. In the general formula (AIIa), more preferably, two of the $R_2c$ to $R_4c$ are hydroxyl groups and the remainder is a hydrogen atom.

The content ratio of repeating units having a hydroxyl group or a cyano group, based on all the repeating units of the resin (A), is preferably in the range of 5 to 40 mol %, more preferably 5 to 30 mol % and still more preferably 10 to 25 mol %.

Specific examples of the repeating units having a hydroxyl group or a cyano group will be shown below, which however in no way limit the scope of the present invention.

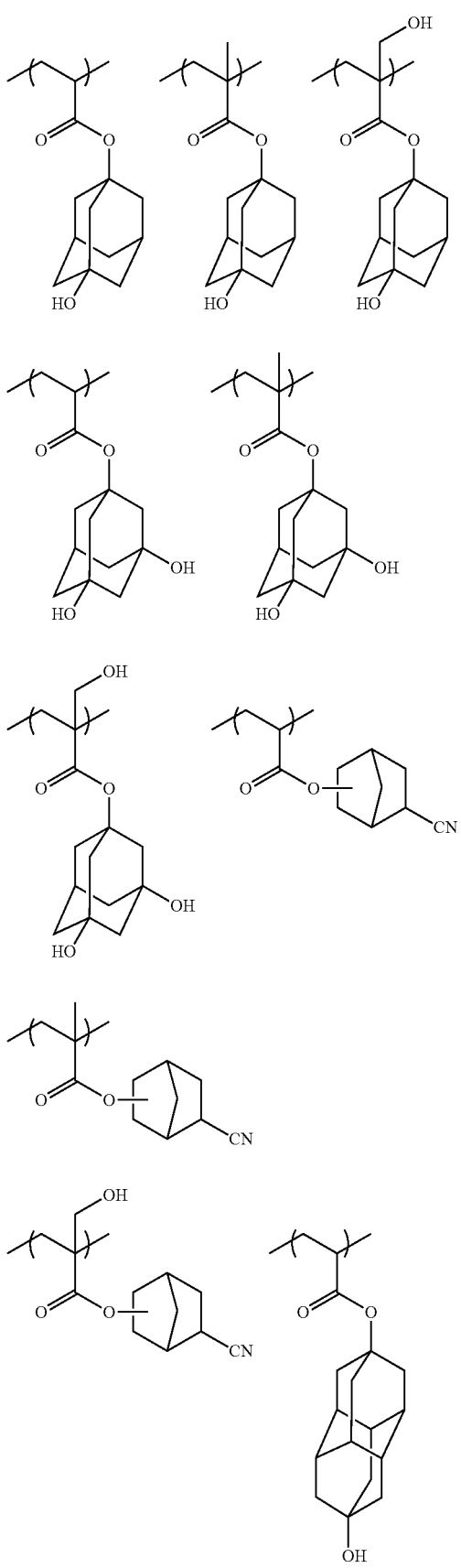
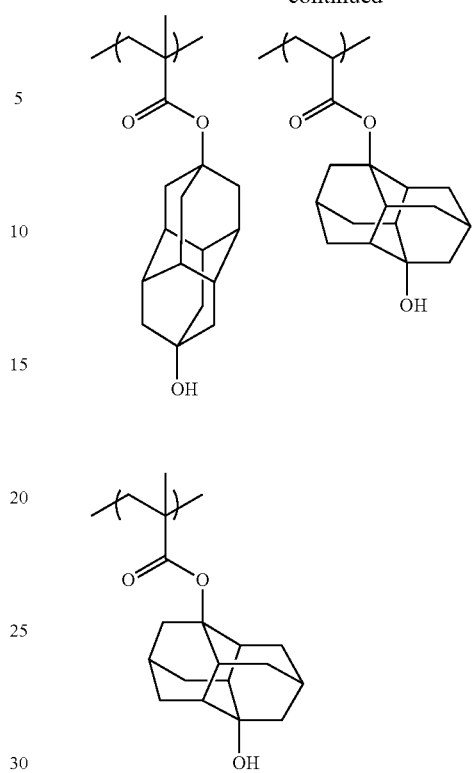

It is preferred for the resin (A) to contain a repeating unit having an alkali-soluble group. As the alkali-soluble group, there can be mentioned a carboxyl group, a sulfonamido group, a sulfonylimido group, a bisulfonylimido group or an aliphatic alcohol substituted at its α-position with an electron-withdrawing group (for example, a hexafluoroisopropanol group). The possession of a repeating unit having a carboxyl group is more preferred. The incorporation of the repeating unit having an alkali-soluble group would increase the resolving power in contact hole usage. The repeating unit having an alkali-soluble group is preferably any of a repeating unit wherein the alkali-soluble group is directly bonded to the principal chain of a resin such as a repeating unit of acrylic acid or methacrylic acid, a repeating unit wherein the alkali-soluble group is bonded via a connecting group to the principal chain of a resin and a repeating unit wherein the alkali-soluble group is introduced in a terminal of a polymer chain by the use of a chain transfer agent or polymerization initiator having the alkali-soluble group in the stage of polymerization. The connecting group may have a monocyclic or polycyclic hydrocarbon structure. The repeating unit of acrylic acid or methacrylic acid is especially preferred.

The content ratio of repeating units having an alkali-soluble group based on all the repeating units of the resin (A) is preferably in the range of 0 to 20 mol %, more preferably 3 to 15 mol % and still more preferably 5 to 10 mol %.

Specific examples of the repeating units having an alkali-soluble group will be shown below, which however in no way limit the scope of the present invention.

In the formulae, Rx represents H, CH$_3$, CH$_2$OH or CF$_3$.

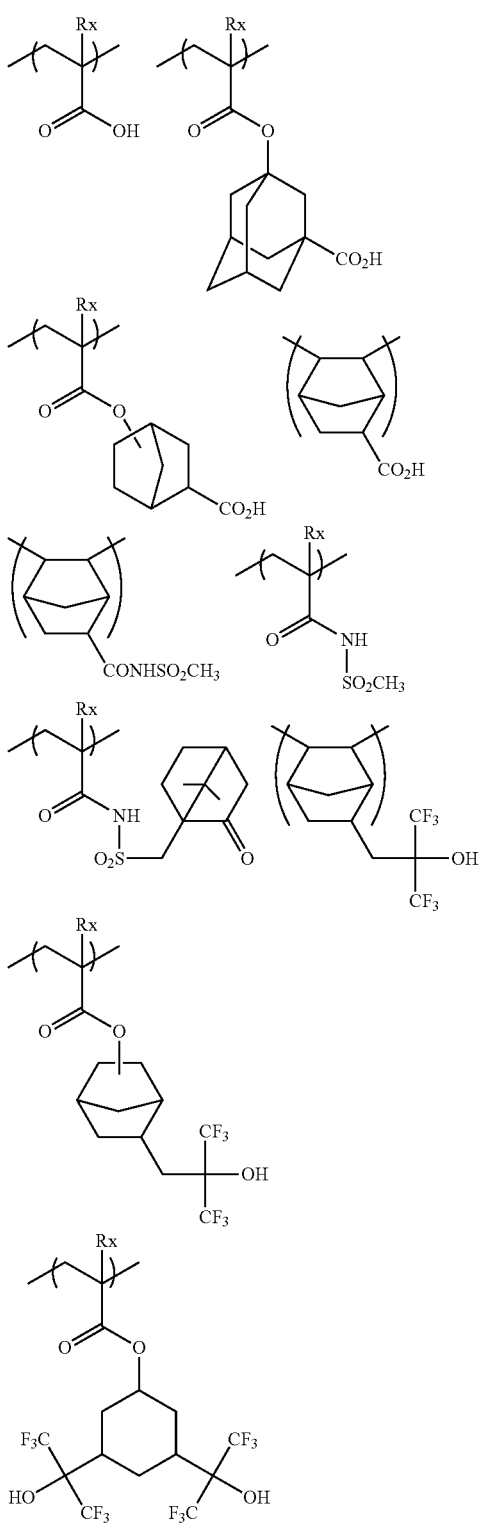

The resin (A) may further have a repeating unit having an alicyclic hydrocarbon structure and not exhibiting any acid decomposability. This would reduce any leaching of low-molecular components from an actinic-ray- or radiation-sensitive resin composition film into a liquid for liquid immersion at the time of liquid immersion exposure. As such repeating units, there can be mentioned those derived from 1-adamantyl (meth)acrylate, diamantyl (meth)acrylate, tricyclodecanyl (meth)acrylate, or cyclohexyl (meth)acrylate, The resin (A) may have, in addition to the foregoing repeating structural units, various repeating structural units for the purpose of regulating the dry etching resistance, standard developer adaptability, substrate adhesion, resist profile and generally required properties of the resist such as resolving power, heat resistance and sensitivity.

As such repeating structural units, there can be mentioned those corresponding to the following monomers, which however are nonlimiting.

The use of such repeating structural units would enable fine regulation of the required properties of the resin (A), especially:

(1) solubility in application solvents,
(2) film forming easiness (glass transition point),
(3) alkali developability,
(4) film thinning (selections of hydrophilicity/hydrophobicity and alkali-soluble group),
(5) adhesion of unexposed area to substrate,
(6) dry etching resistance, etc.

As appropriate monomers, there can be mentioned, for example, a compound having an unsaturated bond capable of addition polymerization, selected from among acrylic esters, methacrylic esters, acrylamides, methacrylamides, allyl compounds, vinyl ethers, vinyl esters and the like.

In addition, any unsaturated compound capable of addition polymerization that is copolymerizable with monomers corresponding to the above various repeating structural units may be copolymerized therewith.

The molar ratios of individual repeating structural units contained in the resin (A) are appropriately determined from the viewpoint of regulation of not only the dry etching resistance of the resist but also the standard developer adaptability, substrate adhesion, resist profile and generally required properties of the resist such as the resolving power, heat resistance and sensitivity.

When the actinic ray-sensitive or radiation-sensitive resin composition of the present invention is one for ArF exposure, it is preferred for the resin as the component (A) to have no aromatic group from the viewpoint of transparency to ArF beams. Specifically, the content ratio of repeating units having an aromatic group is preferably 3 mol % or less based on the total repeating units of the resin (A). It is more preferred if substantially no repeating unit having an aromatic group is contained in the resin (A).

Further, when the composition of the present invention comprises the resin (D) having at least a fluorine atom or a silicon atom to be described hereinbelow, it is preferred for the resin (A) not to contain a fluorine atom from the view point of enhancement of surface uneven distribution. Specifically, the content ratio of repeating units having a fluorine atom is preferably 5 mol % or less, more preferably 3 mol % or less based on the total repeating units of the resin (A). It is still more preferred if substantially no repeating unit having a fluorine atom is contained in the resin (A).

The resin (A) can be synthesized by conventional techniques (for example, radical polymerization). As general synthetic methods, there can be mentioned, for example, a batch polymerization method in which a monomer species and an initiator are dissolved in a solvent and heated so as to accomplish polymerization and a dropping polymerization method in which a solution of monomer species and initiator is added by dropping to a heated solvent over a period of 1 to 10 hours. The dropping polymerization method is preferred. As a reaction solvent, there can be mentioned, for example, an ether, such as tetrahydrofuran, 1,4-dioxane or diisopropyl ether; a ketone, such as methyl ethyl ketone or methyl isobutyl ketone; an ester solvent, such as ethyl acetate; an amide solvent, such as dimethylformamide or dimethylacetamide; or a solvent capable of dissolving the composition of the present invention, such as propylene glycol monomethyl ether acetate, propylene glycol monomethyl ether or cyclohexanone, to be hereinafter described. It is preferred to perform the polymerization with the use of the same solvent as employed in the photosensitive composition of the present invention. This would inhibit any particle generation during storage.

The polymerization reaction is preferably carried out in an atmosphere of inert gas, such as nitrogen or argon. The polymerization is initiated by the use of a commercially available radical initiator (azo initiator, peroxide, etc.) as a polymerization initiator. Among the radical initiators, an azo initiator is preferred. An azo initiator having an ester group, a cyano group or a carboxyl group is especially preferred. As preferred initiators, there can be mentioned azobisisobutyronitrile, azobisdimethylvaleronitrile, dimethyl 2,2'-azobis(2-methylpropionate) and the like. According to necessity, a supplementation of initiator or divided addition thereof may be effected. After the completion of the reaction, the reaction mixture is poured into a solvent. The desired polymer is recovered by a method for powder or solid recovery, etc. The concentration during the reaction is in the range of 5 to 50 mass %, preferably 10 to 30 mass %. The reaction temperature is generally in the range of 10 to 150° C., preferably 30 to 120° C. and more preferably 60 to 100° C.

The weight average molecular weight of the resin (A) in terms of polystyrene molecular weight as measured by GPC is preferably in the range of 1000 to 200,000, more preferably 2000 to 20,000, still more preferably 3000 to 15,000 and further preferably 3000 to 10,000. The regulation of the weight average molecular weight to 1000 to 200,000 would prevent deteriorations of heat resistance and dry etching resistance and also prevent deterioration of developability and increase of viscosity leading to a poor film forming property.

Use is made of the resin whose degree of dispersal (molecular weight distribution) is generally in the range of 1 to 3, preferably 1 to 2.6, more preferably 1 to 2 and most preferably 1.4 to 1.7. The lower the molecular weight distribution, the better the resolving power and resist profile and the smoother the side wall of the resist pattern to thereby attain excellence in roughness.

The amount of resin (A) contained in the actinic ray-sensitive or radiation-sensitive resin composition of the present invention is preferably in the range of 50 to 92 mass %, more preferably 60 to 90 mass % based on the total solid content of the composition.

In the present invention, the resins (A) may be used either individually or in combination.

(B) Compound that when Exposed to Actinic Rays or Radiation, Generates an Acid Containing a Fluorine Atom The composition of the present invention comprises a compound that when exposed to actinic rays or radiation, generates an acid containing a fluorine atom (hereinafter also referred to as a "photoacid generator" or "component (B)").

As the photoacid generator, use can be made of a member appropriately selected from among a photoinitiator for photocationic polymerization, a photoinitiator for photoradical polymerization, a photo-achromatic agent and photo-discoloring agent for dyes, any of generally known compounds that when exposed to actinic rays or radiation, generate an acid, employed in microresists, etc., and mixtures thereof.

For example, as the acid generator, there can be mentioned a diazonium salt, a phosphonium salt, a sulfonium salt, an iodonium salt, an imide sulfonate, an oxime sulfonate, diazosulfone, disulfone or o-nitrobenzyl sulfonate.

As preferred compounds among the acid generators that when exposed to actinic rays or radiation, generate an acid containing a fluorine atom, there can be mentioned those of general formulae (ZI), (ZII) and (ZIII) below.

As the acid containing a fluorine atom generated upon exposure to actinic rays or radiation, $Z^-H^+$ is generated by the compounds of general formulae (ZI) and (ZII) below, and $R_{206}$—$SO_3H$ and $R_{207}$—$SO_3H$ are generated by the compounds of general formula (ZIII) below.

It is preferred for these acids to contain six or more fluorine atoms from the viewpoint of the strength of the generated acid facilitating a deprotection reaction.

(ZI)

(ZII)

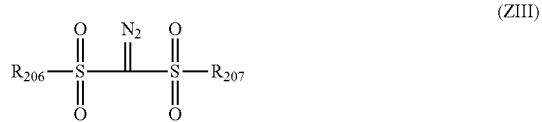

(ZIII)

In the above general formula (ZI), each of $R_{201}$, $R_{202}$ and $R_{203}$ independently represents an organic group.

$Z^-$ represents a nonnucleophilic anion. As a preferred nonnucleophilic anion, there can be mentioned a fluorine-atom-containing sulfonate anion, a fluorine-atom-containing carboxylate anion, a fluorine-atom-containing bis(alkylsulfonyl)amido anion, a fluorine-atom-containing tris(alkylsulfonyl)methide anion, $BF_4^-$, $PF_6^-$, $SbF_6^-$, etc. Fluorine-atom-containing organic anions are more preferred.

As preferred fluorine-atom-containing organic anions, there can be mentioned those of the following formulae.

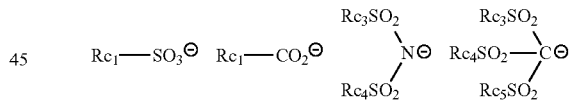

In the formulae, $Rc_1$ represents an organic group containing a fluorine atom.

As the organic group represented by $Rc_1$, there can be mentioned any of those having 1 to 30 carbon atoms, preferably a fluorinated alkyl group or aryl group or any of groups derived from linkage of two or more thereof by means of a connecting group, such as a single bond, —O—, —$CO_2$—, —S—, —$SO_3$— or —$SO_2N(Rd_1)$-. $Rd_1$ represents a hydrogen atom or an alkyl group.

Each of $Rc_3$, $Rc_4$ and $Rc_5$ independently represents an organic group. As preferred organic groups represented by $Rc_3$, $Rc_4$ and $Rc_5$, there can be mentioned those set forth above with respect to $Rc_1$. A perfluoroalkyl group having 1 to 4 carbon atoms is most preferred.

$Rc_3$ and $Rc_4$ may be bonded to each other to thereby form a ring. As the group formed by the mutual bonding of $Rc_3$ and $Rc_4$, there can be mentioned a perfluoroalkylene group or a perfluoroarylene group. A perfluoroalkylene group having 2 to 4 carbon atoms is preferred.

Especially preferred organic groups represented by $Rc_1$ and $Rc_3$ to $Rc_5$ are alkyl groups substituted at the 1-position thereof with a fluorine atom or a fluoroalkyl group and phenyl groups substituted with a fluorine atom or a fluoroalkyl group. The acidity of the acid generated by light exposure can be increased by the introduction of the fluorine atom or fluoroalkyl group, so that an enhancement of sensitivity can be realized. Also, the acidity of the acid generated by light exposure can be increased by the cyclization of $Rc_3$ and $Rc_4$ through bonding thereof, so that an enhancement of sensitivity can be realized.

Further, as preferred forms of nonnucleophilic anions $Z^-$, there can be mentioned the anions of general formula (AN1) below.

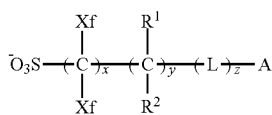
(AN1)

In the formula, each of Xfs independently represents a fluorine atom or an alkyl group substituted with at least one fluorine atom.

Each of $R^1$ and $R^2$ independently represents a member selected from among a hydrogen atom, a fluorine atom, an alkyl group and an alkyl group substituted with at least one fluorine atom. When two or more $R^1$s or $R^2$s are contained, the two or more may be identical to or different from each other.

L represents a single bond or a bivalent connecting group. When two or more Ls are contained, they may be identical to or different from each other.

A represents a group with a cyclic structure.

In the formula, x is an integer of 1 to 20, y an integer of 0 to 10 and z an integer of 0 to 10.

General formula (AN1) will be described in greater detail below.

The alkyl group of the alkyl group substituted with a fluorine atom, represented by Xf preferably has 1 to 10 carbon atoms, more preferably 1 to 4 carbon atoms. The alkyl group substituted with a fluorine atom, represented by Xf is preferably a perfluoroalkyl group.

Xf is preferably a fluorine atom or a perfluoroalkyl group having 1 to 4 carbon atoms. In particular, there can be mentioned a fluorine atom, $CF_3$, $C_2F_5$, $C_3F_7$, $C_4F_9$, $CH_2CF_3$, $CH_2CH_2CF_3$, $CH_2C_2F_5$, $CH_2CH_2C_2F_5$, $CH_2C_3F_7$, $CH_2CH_2C_3F_7$, $CH_2C_4F_9$ or $CH_2CH_2C_4F_9$. Of these, a fluorine atom and $CF_3$ are preferred.

Each of the alkyl group and the alkyl group of the alkyl group substituted with at least one fluorine atom, represented by each of $R^1$ and $R^2$ preferably has 1 to 4 carbon atoms.

In the formula, x is preferably 1 to 10, more preferably 1 to 5;

y is preferably 0 to 4, more preferably 0; and z is preferably 0 to 5, more preferably 0 to 3.

The bivalent connecting group represented by L is not particularly limited. As the same, there can be mentioned —COO—, —OCO—, —CO—, —O—, —S—, —SO—, —SO_2—, an alkylene group, a cycloalkylene group, an alkenylene group or the like. Of these, —COO—, —OCO—, —CO—, —O— and —SO_2— are preferred. —COO—, —OCO— and —SO_2— are more preferred.

The group with a cyclic structure represented by A is not particularly limited as long as a cyclic structure is contained. As the group, there can be mentioned an alicyclic group, an aryl group, a group with a heterocyclic structure (including not only those exhibiting aromaticity but also those exhibiting no aromaticity) or the like.

The alicyclic group may be monocyclic or polycyclic. Preferably, the alicyclic group is a cycloalkyl group of a single ring, such as a cyclopentyl group, a cyclohexyl group or a cyclooctyl group, or a cycloalkyl group of multiple rings, such as a norbornyl group, a tricyclodecanyl group, a tetracyclodecanyl group, a tetracyclododecanyl group or an adamantyl group. Of the mentioned groups, alicyclic groups with a bulky structure having at least 7 carbon atoms, namely, a norbornyl group, a tricyclodecanyl group, a tetracyclodecanyl group, a tetracyclododecanyl group and an adamantyl group are preferred from the viewpoint of inhibiting any in-film diffusion in the step of post-exposure bake to thereby enhance MEEF.

Moreover, as the alicyclic group, there can be mentioned an alicyclic structure with a lactone structure. As such a structure, there can be mentioned, for example, any of those of general formulae LC1-1 to LC1-17 described above with respect to the resin (A).

As the aryl group, there can be mentioned a benzene ring, a naphthalene ring, a phenanthrene ring or an anthracene ring.

As the group with a heterocyclic structure, there can be mentioned a furan ring, a thiophene ring, a benzofuran ring, a benzothiophene ring, a dibenzofuran ring, a dibenzothiophene ring, a pyridine ring or a piperidine ring. Of these, nitrogenous heterocyclic structures are preferred, and a piperidine ring is more preferred.

The above group with a cyclic structure may have a substituent. As the substituent, there can be mentioned an alkyl group (may be linear, branched or cyclic, preferably having 1 to 12 carbon atoms), an aryl group (preferably having 6 to 14 carbon atoms), a hydroxyl group, an alkoxy group, an ester group, an amido group, a urethane group, a ureido group, a thioether group, a sulfonamido group, a sulfonic ester group or the like.

In the above general formula (ZI), the number of carbon atoms of each of the organic groups represented by $R_{201}$, $R_{202}$ and $R_{203}$ is generally in the range of 1 to 30, preferably 1 to 20.

Two of $R_{201}$ to $R_{203}$ may be bonded to each other to thereby form a ring structure, and the ring within the same may contain an oxygen atom, a sulfur atom, an ester bond, an amido bond or a carbonyl group. As the group formed by bonding of two of $R_{201}$ to $R_{203}$, there can be mentioned an alkylene group (for example, a butylene group or a pentylene group).

As the organic groups represented by $R_{201}$, $R_{202}$ and $R_{203}$, there can be mentioned, for example, groups corresponding to the following compounds (ZI-1), (ZI-2), (ZI-3) and (ZI-4).

Appropriate use may be made of compounds with two or more of the structures of general formula (ZI). For example, use may be made of compounds having a structure wherein at least one of $R_{201}$ to $R_{203}$ of a compound of general formula (ZI) is bonded with at least one of $R_{201}$ to $R_{203}$ of another compound of general formula (ZI).

As more preferred (ZI) components, there can be mentioned the following compounds (ZI-1), (ZI-2), (ZI-3) and (ZI-4).

The compounds (ZI-1) are arylsulfonium compounds of general formula (ZI) wherein at least one of $R_{201}$ to $R_{203}$ is an aryl group, namely, compounds containing an arylsulfonium as a cation.

In the arylsulfonium compounds, all of the $R_{201}$ to $R_{203}$ may be aryl groups. It is also appropriate that the $R_{201}$ to $R_{203}$ are partially an aryl group and the remainder is an alkyl group or a cycloalkyl group.

As the arylsulfonium compounds, there can be mentioned, for example, a triarylsulfonium compound, a diarylalkylsulfonium compound, an aryldialkylsulfonium compound, a diarylcycloalkylsulfonium compound and an aryldicycloalkylsulfonium compound.

The aryl group of the arylsulfonium compounds is preferably a phenyl group or a naphthyl group, more preferably a phenyl group. The aryl group may be one having a heterocyclic structure containing an oxygen atom, nitrogen atom, sulfur atom or the like. As the aryl group having a heterocyclic structure, there can be mentioned, for example, a pyrrole residue, a furan residue, a thiophene residue, an indole residue, a benzofuran residue, a benzothiophene residue or the like. When the arylsulfonium compound has two or more aryl groups, the two or more aryl groups may be identical to or different from each other.

The alkyl group or cycloalkyl group contained in the arylsulfonium compound according to necessity is preferably a linear or branched alkyl group having 1 to 15 carbon atoms or a cycloalkyl group having 3 to 15 carbon atoms. As such, there can be mentioned, for example, a methyl group, an ethyl group, a propyl group, an n-butyl group, a sec-butyl group, a t-butyl group, a cyclopropyl group, a cyclobutyl group, a cyclohexyl group or the like.

The aryl group, alkyl group or cycloalkyl group represented by $R_{201}$ to $R_{203}$ may have as its substituent an alkyl group (for example, 1 to 15 carbon atoms), cycloalkyl group (for example, 3 to 15 carbon atoms), an aryl group (for example, 6 to 14 carbon atoms), an alkoxy group (for example, 1 to 15 carbon atoms), a halogen atom, a hydroxyl group or a phenylthio group. Preferred substituents are a linear or branched alkyl group having 1 to 12 carbon atoms, a cycloalkyl group having 3 to 12 carbon atoms and a linear, branched or cyclic alkoxy group having 1 to 12 carbon atoms. More preferred substituents are an alkyl group having 1 to 4 carbon atoms and an alkoxy group having 1 to 4 carbon atoms. The substituents may be contained in any one of the three $R_{201}$ to $R_{203}$, or alternatively may be contained in all three of $R_{201}$ to $R_{203}$. When $R_{201}$ to $R_{203}$ represent an aryl group, the substituent preferably lies at the p-position of the aryl group.

Now, the compounds (ZI-2) will be described.

The compounds (ZI-2) are compounds of formula (ZI) wherein each of $R_{201}$ to $R_{203}$ independently represents an organic group having no aromatic ring. The aromatic rings include an aromatic ring having a heteroatom.

The organic group having no aromatic ring represented by $R_{201}$ to $R_{203}$ generally has 1 to 30 carbon atoms, preferably 1 to 20 carbon atoms.

Preferably, each of $R_{201}$ to $R_{203}$ independently represents an alkyl group, a cycloalkyl group, an allyl group or a vinyl group. More preferred groups are a linear or branched 2-oxoalkyl group, a 2-oxocycloalkyl group and an alkoxycarbonylmethyl group. Especially preferred is a linear or branched 2-oxoalkyl group.

As preferred alkyl groups and cycloalkyl groups represented by $R_{201}$ to $R_{203}$, there can be mentioned a linear or branched alkyl group having 1 to 10 carbon atoms (for example, a methyl group, an ethyl group, a propyl group, a butyl group or a pentyl group) and a cycloalkyl group having 3 to 10 carbon atoms (a cyclopentyl group, a cyclohexyl group or a norbornyl group). As more preferred alkyl groups, there can be mentioned a 2-oxoalkyl group and an alkoxycarbonylmethyl group. As more preferred cycloalkyl group, there can be mentioned a 2-oxocycloalkyl group.

The 2-oxoalkyl group may be linear or branched. A group having >C=O at the 2-position of the alkyl group is preferred.

The 2-oxocycloalkyl group is preferably a group having >C=O at the 2-position of the cycloalkyl group.

As preferred alkoxy groups of the alkoxycarbonylmethyl group, there can be mentioned alkoxy groups having 1 to 5 carbon atoms (a methoxy group, an ethoxy group, a propoxy group, a butoxy group and a pentoxy group).

The $R_{201}$ to $R_{203}$ may be further substituted with a halogen atom, an alkoxy group (for example, 1 to 5 carbon atoms), a hydroxyl group, a cyano group or a nitro group.

Two of $R_{201}$ to $R_{203}$ may be bonded to each other to thereby form a ring structure, and the ring within the same may contain an oxygen atom, a sulfur atom, an ester bond, an amido bond or a carbonyl group.

The compounds (ZI-3) are those represented by the following general formula (ZI-3) which have a phenacylsulfonium salt structure.

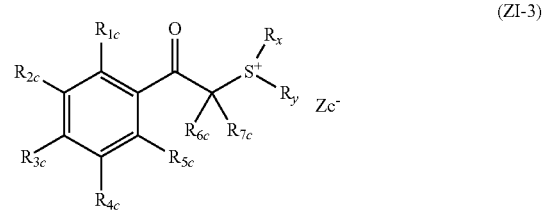

(ZI-3)

In general formula (ZI-3), each of $R_{1c}$ to $R_{5c}$ independently represents a hydrogen atom, an alkyl group, a cycloalkyl group, an alkoxy group, a halogen atom or a phenylthio group.

Each of $R_{6c}$ and $R_{7c}$ independently represents a hydrogen atom, an alkyl group, a cycloalkyl group, halogen atom, a cyano group or an aryl group.

Each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group.

Any two or more of $R_{1c}$ to $R_{5c}$, and $R_{6c}$ and $R_{7c}$, and $R_x$ and $R_y$ may be bonded with each other to thereby form a ring structure. This ring structure may contain an oxygen atom, a sulfur atom, an ester bond or an amido bond. As the group formed by bonding of any two or more of $R_{1c}$ to $R_{5c}$, and $R_{6c}$ and $R_{7c}$, and $R_x$ and $R_y$, there can be mentioned a butylene group, a pentylene group or the like.

$Zc^-$ represents a nonnucleophilic anion. There can be mentioned the same nonnucleophilic anions as mentioned with respect to the $Z^-$ of the general formula (ZI).

The alkyl group represented by $R_{1c}$ to $R_{7c}$ may be linear or branched. As such, there can be mentioned, for example, an alkyl group having 1 to 20 carbon atoms, preferably a linear or branched alkyl group having 1 to 12 carbon atoms (for example, a methyl group, an ethyl group, a linear or branched propyl group, a linear or branched butyl group or a linear or branched pentyl group). As the cycloalkyl group, there can be mentioned, for example, a cycloalkyl group having 3 to 8 carbon atoms (for example, a cyclopentyl group or a cyclohexyl group).

The alkoxy group represented by $R_{1c}$ to $R_{5c}$ may be linear, or branched, or cyclic. As such, there can be mentioned, for example, an alkoxy group having 1 to 10 carbon atoms, preferably a linear or branched alkoxy group having 1 to 5 carbon atoms (for example, a methoxy group, an ethoxy group, a linear or branched propoxy group, a linear or branched butoxy group or a linear or branched pentoxy group) and a cycloalkoxy group having 3 to 8 carbon atoms (for example, a cyclopentyloxy group or a cyclohexyloxy group).

Preferably, any one of $R_{1c}$ to $R_{5c}$ is a linear or branched alkyl group, a cycloalkyl group or a linear, branched or cyclic alkoxy group. More preferably, the sum of carbon atoms of $R_{1c}$ to $R_{5c}$ is in the range of 2 to 15. Accordingly, there can be attained an enhancement of solvent solubility and inhibition of particle generation during storage.

Each of the aryl groups represented by $R_{6c}$ and $R_{7c}$ preferably has 5 to 15 carbon atoms. As such, there can be mentioned, for example, a phenyl group or a naphthyl group.

When $R_{6c}$ and $R_{7c}$ are bonded to each other to thereby form a ring, the group formed by the bonding of $R_{6c}$ and $R_{7c}$ is preferably an alkylene group having 2 to 10 carbon atoms. As such, there can be mentioned, for example, an ethylene group, a propylene group, a butylene group, a pentylene group, a hexylene group or the like. Further, the ring formed by the bonding of $R_{6c}$ and $R_{7c}$ may have a heteroatom, such as an oxygen atom, in the ring.

As the alkyl groups and cycloalkyl groups represented by $R_x$ and $R_y$, there can be mentioned the same alkyl groups and cycloalkyl groups as set forth above with respect to $R_{1c}$ to $R_{7c}$.

As the 2-oxoalkyl group and 2-oxocycloalkyl group, there can be mentioned the alkyl group and cycloalkyl group represented by $R_{1c}$ to $R_{7c}$ having >C=O at the 2-position thereof.

With respect to the alkoxy group of the alkoxycarbonylalkyl group, there can be mentioned the same alkoxy groups as mentioned above with respect to $R_{1c}$ to $R_{5c}$. As the alkyl group thereof, there can be mentioned, for example, an alkyl group having 1 to 12 carbon atoms, preferably a linear alkyl group having 1 to 5 carbon atoms (e.g., a methyl group or an ethyl group).

The allyl groups are not particularly limited. However, preferred use is made of an unsubstituted allyl group or an allyl group substituted with a cycloalkyl group of a single ring or multiple rings.

The vinyl groups are not particularly limited. However, preferred use is made of an unsubstituted vinyl group or a vinyl group substituted with a cycloalkyl group of a single ring or multiple rings.

As the ring structure that may be formed by the mutual bonding of $R_x$ and $R_y$, there can be mentioned a 5-membered or 6-membered ring, especially preferably a 5-membered ring (namely, a tetrahydrothiophene ring), formed by bivalent $R_x$ and $R_y$ (for example, a methylene group, an ethylene group, a propylene group or the like) in cooperation with the sulfur atom of general formula (ZI-3).

Each of $R_x$ and $R_y$ is preferably an alkyl group or cycloalkyl group having preferably 4 or more carbon atoms. The alkyl group or cycloalkyl group has more preferably 6 or more carbon atoms and still more preferably 8 or more carbon atoms.

The compounds (ZI-4) are those of general formula (ZI-4) below.

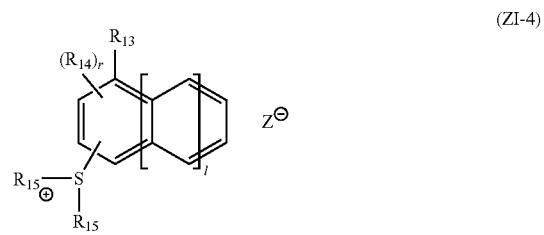

(ZI-4)

In general formula (ZI-4), $R_{13}$ represents any of a hydrogen atom, a fluorine atom, a hydroxyl group, an alkyl group, a cycloalkyl group, an alkoxy group, an alkoxycarbonyl group and a group with a cycloalkyl skeleton of a single ring or multiple rings. These groups may have substituents.

$R_{14}$, each independently in the instance of $R_{14}$s, represents any of an alkyl group, a cycloalkyl group, an alkoxy group, an alkoxycarbonyl group, an alkylcarbonyl group, an alkylsulfonyl group, a cycloalkylsulfonyl group and a group with a cycloalkyl skeleton of a single ring or multiple rings. These groups may have substituents.

Each of $R_{15}$s independently represents an alkyl group, a cycloalkyl group or a naphthyl group, provided that the two $R_{15}$s may be bonded to each other to thereby form a ring. These groups may have substituents.

In the formula, l is an integer of 0 to 2, and r is an integer of 0 to 8.

$Z^-$ represents a nonnucleophilic anion. As such, there can be mentioned any of the same nonnucleophilic anions as mentioned with respect to the $Z^-$ of the general formula (ZI).

In general formula (ZI-4), the alkyl groups represented by $R_{13}$, $R_{14}$ and $R_{15}$ may be linear or branched and preferably each have 1 to 10 carbon atoms. As such, there can be mentioned a methyl group, an ethyl group, an n-propyl group, an i-propyl group, an n-butyl group, a 2-methylpropyl group, a 1-methylpropyl group, a t-butyl group, an n-pentyl group, a neopentyl group, an n-hexyl group, an n-heptyl group, an n-octyl group, a 2-ethylhexyl group, an n-nonyl group, an n-decyl group and the like. Of these alkyl groups, a methyl group, an ethyl group, an n-butyl group, a t-butyl group and the like are preferred.

As the cycloalkyl groups represented by $R_{13}$, $R_{14}$ and $R_{15}$, there can be mentioned cyclopropyl, cyclobutyl, cyclopentyl, cyclohexyl, cycloheptyl, cyclooctyl, cyclododecanyl, cyclopentenyl, cyclohexenyl, cyclooctadienyl, norbornyl, tricyclodecanyl, tetracyclodecanyl, adamantyl and the like. Cyclopropyl, cyclopentyl, cyclohexyl and cyclooctyl are especially preferred.

The alkoxy groups represented by $R_{13}$ and $R_{14}$ may be linear or branched and preferably each have 1 to 10 carbon atoms. As such, there can be mentioned, for example, a methoxy group, an ethoxy group, an n-propoxy group, an i-propoxy group, an n-butoxy group, a 2-methylpropoxy group, a 1-methylpropoxy group, a t-butoxy group, an n-pentyloxy group, a neopentyloxy group, an n-hexyloxy group, an n-heptyloxy group, an n-octyloxy group, a 2-ethylhexyloxy group, an n-nonyloxy group, an n-decyloxy group and the like. Of these alkoxy groups, a methoxy group, an ethoxy group, an n-propoxy group, an n-butoxy group and the like are preferred.

The alkoxycarbonyl group represented by $R_{13}$ and $R_{14}$ may be linear or branched and preferably has 2 to 11 carbon atoms. As such, there can be mentioned, for example, a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, an n-pentyloxycarbonyl group, a neopentyloxycarbonyl group, an n-hexyloxycarbonyl group, an n-heptyloxycarbonyl group, an n-octyloxycarbonyl group, a 2-ethylhexyloxycarbonyl group, an n-nonyloxycarbonyl group, an n-decyloxycarbonyl group and the like. Of these alkoxycarbonyl groups, a methoxycarbonyl group, an ethoxycarbonyl group, an n-butoxycarbonyl group and the like are preferred.

As the groups with a cycloalkyl skeleton of a single ring or multiple rings represented by $R_{13}$ and $R_{14}$, there can be mentioned, for example, a cycloalkyloxy group of a single ring or multiple rings and an alkoxy group with a cycloalkyl group of a single ring or multiple rings. These groups may further have substituents.

With respect to each of the cycloalkyloxy groups of a single ring or multiple rings represented by $R_{13}$ and $R_{14}$, the sum of carbon atoms thereof is preferably 7 or greater, more preferably in the range of 7 to 15. Further, having a cycloalkyl skeleton of a single ring is preferred. The cycloalkyloxy group of a single ring of which the sum of carbon atoms is 7 or greater is one composed of a cycloalkyloxy group, such as a cyclopropyloxy group, a cyclobutyloxy group, a cyclopentyloxy group, a cyclohexyloxy group, a cycloheptyloxy group, a cyclooctyloxy group or a cyclododecanyloxy group, optionally having a substituent selected from among an alkyl group such as methyl, ethyl, propyl, butyl, pentyl, hexyl, heptyl, octyl, dodecyl, 2-ethylhexyl, isopropyl, sec-butyl, t-butyl or isoamyl, a hydroxyl group, a halogen atom (fluorine, chlorine, bromine or iodine), a nitro group, a cyano group, an amido group, a sulfonamido group, an alkoxy group such as methoxy, ethoxy, hydroxyethoxy, propoxy, hydroxypropoxy or butoxy, an alkoxycarbonyl group such as methoxycarbonyl or ethoxycarbonyl, an acyl group such as formyl, acetyl or benzoyl, an acyloxy group such as acetoxy or butyryloxy, a carboxyl group and the like, provided that the sum of carbon atoms thereof, including those of any optional substituent introduced in the cycloalkyl group, is 7 or greater.

As the cycloalkyloxy group of multiple rings of which the sum of carbon atoms is 7 or greater, there can be mentioned a norbornyloxy group, a tricyclodecanyloxy group, a tetracyclodecanyloxy group, an adamantyloxy group or the like.

With respect to each of the alkyloxy groups having a cycloalkyl skeleton of a single ring or multiple rings represented by $R_{13}$ and $R_{14}$, the sum of carbon atoms thereof is preferably 7 or greater, more preferably in the range of 7 to 15. Further, the alkoxy group having a cycloalkyl skeleton of a single ring is preferred. The alkoxy group having a cycloalkyl skeleton of a single ring of which the sum of carbon atoms is 7 or greater is one composed of an alkoxy group, such as methoxy, ethoxy, propoxy, butoxy, pentyloxy, hexyloxy, heptoxy, octyloxy, dodecyloxy, 2-ethylhexyloxy, isopropoxy, sec-butoxy, t-butoxy or isoamyloxy, substituted with the above optionally substituted cycloalkyl group of a single ring, provided that the sum of carbon atoms thereof, including those of the substituents, is 7 or greater. For example, there can be mentioned a cyclohexylmethoxy group, a cyclopentylethoxy group, a cyclohexylethoxy group or the like. A cyclohexylmethoxy group is preferred.

As the alkoxy group having a cycloalkyl skeleton of multiple rings of which the sum of carbon atoms is 7 or greater, there can be mentioned a norbornylmethoxy group, a norbornylethoxy group, a tricyclodecanylmethoxy group, a tricyclodecanylethoxy group, a tetracyclodecanylmethoxy group, a tetracyclodecanylethoxy group, an adamantylmethoxy group, an adamantylethoxy group and the like. Of these, a norbornylmethoxy group, a norbornylethoxy group and the like are preferred.

With respect to the alkyl group of the alkylcarbonyl group represented by $R_{14}$, there can be mentioned the same specific examples as mentioned above with respect to the alkyl groups represented by $R_{13}$ to $R_{15}$.

The alkylsulfonyl and cycloalkylsulfonyl groups represented by $R_{14}$ may be linear, branched or cyclic and preferably each have 1 to 10 carbon atoms. As such, there can be mentioned, for example, a methanesulfonyl group, an ethanesulfonyl group, an n-propanesulfonyl group, an n-butanesulfonyl group, a tert-butanesulfonyl group, an n-pentanesulfonyl group, a neopentanesulfonyl group, an n-hexanesulfonyl group, an n-heptanesulfonyl group, an n-octanesulfonyl group, a 2-ethylhexanesulfonyl group, an n-nonanesulfonyl group, an n-decanesulfonyl group, a cyclopentanesulfonyl group, a cyclohexanesulfonyl group and the like. Of these alkylsulfonyl and cycloalkylsulfonyl groups, a methanesulfonyl group, an ethanesulfonyl group, an n-propanesulfonyl group, an n-butanesulfonyl group, a cyclopentanesulfonyl group, a cyclohexanesulfonyl group and the like are preferred.

Each of the groups may have a substituent. As such a substituent, there can be mentioned, for example, a halogen atom (e.g., a fluorine atom), a hydroxyl group, a carboxyl group, a cyano group, nitro group, an alkoxy group, an alkoxyalkyl group, an alkoxycarbonyl group, an alkoxycarbonyloxy group or the like.

As the alkoxy group, there can be mentioned, for example, a linear, branched or cyclic alkoxy group having 1 to 20 carbon atoms, such as a methoxy group, an ethoxy group, an n-propoxy group, an i-propoxy group, an n-butoxy group, a 2-methylpropoxy group, a 1-methylpropoxy group, a t-butoxy group, a cyclopentyloxy group or a cyclohexyloxy group.

As the alkoxyalkyl group, there can be mentioned, for example, a linear, branched or cyclic alkoxyalkyl group having 2 to 21 carbon atoms, such as a methoxymethyl group, an ethoxymethyl group, a 1-methoxyethyl group, a 2-methoxyethyl group, a 1-ethoxyethyl group or a 2-ethoxyethyl group.

As the alkoxycarbonyl group, there can be mentioned, for example, a linear, branched or cyclic alkoxycarbonyl group having 2 to 21 carbon atoms, such as a methoxycarbonyl group, an ethoxycarbonyl group, an n-propoxycarbonyl group, an i-propoxycarbonyl group, an n-butoxycarbonyl group, a 2-methylpropoxycarbonyl group, a 1-methylpropoxycarbonyl group, a t-butoxycarbonyl group, a cyclopentyloxycarbonyl group or a cyclohexyloxycarbonyl group.

As the alkoxycarbonyloxy group, there can be mentioned, for example, a linear, branched or cyclic alkoxycarbonyloxy group having 2 to 21 carbon atoms, such as a methoxycarbonyloxy group, an ethoxycarbonyloxy group, an n-propoxycarbonyloxy group, an i-propoxycarbonyloxy group, an n-butoxycarbonyloxy group, a t-butoxycarbonyloxy group, a cyclopentyloxycarbonyloxy group or a cyclohexyloxycarbonyloxy group.

The cyclic structure that may be formed by the bonding of the two $R_{15}$s to each other is preferably a 5- or 6-membered ring, especially a 5-membered ring (namely, a tetrahydrothiophene ring) formed by two bivalent $R_{15}$s in cooperation with the sulfur atom of general formula (ZI-4). The cyclic structure may condense with an aryl group or a cycloalkyl group. The bivalent $R_{15}$s may have substituents. As such substituents, there can be mentioned, for example, a hydroxyl group, a carboxyl group, a cyano group, a nitro group, an alkoxy group, an alkoxyalkyl group, an alkoxycarbonyl group, an alkoxycarbonyloxy group and the like as mentioned above. It is especially preferred for the $R_{15}$ of general formula (ZI-4) to be a methyl group, an ethyl group, the above-mentioned bivalent group allowing two $R_{15}$s to be bonded to each other so as to form a tetrahydrothiophene ring structure in cooperation with the sulfur atom of the general formula (ZI-4), or the like.

Each of $R_{13}$ and $R_{14}$ may have a substituent. As such a substituent, there can be mentioned, for example, a hydroxyl group, an alkoxy group, an alkoxycarbonyl group, a halogen atom (especially, a fluorine atom) or the like.

In the formula, l is preferably 0 or 1, more preferably 1, and r is preferably 0 to 2.

Specific examples of the cations of the compounds (ZI-2) and (ZI-3) of the present invention will be shown below.

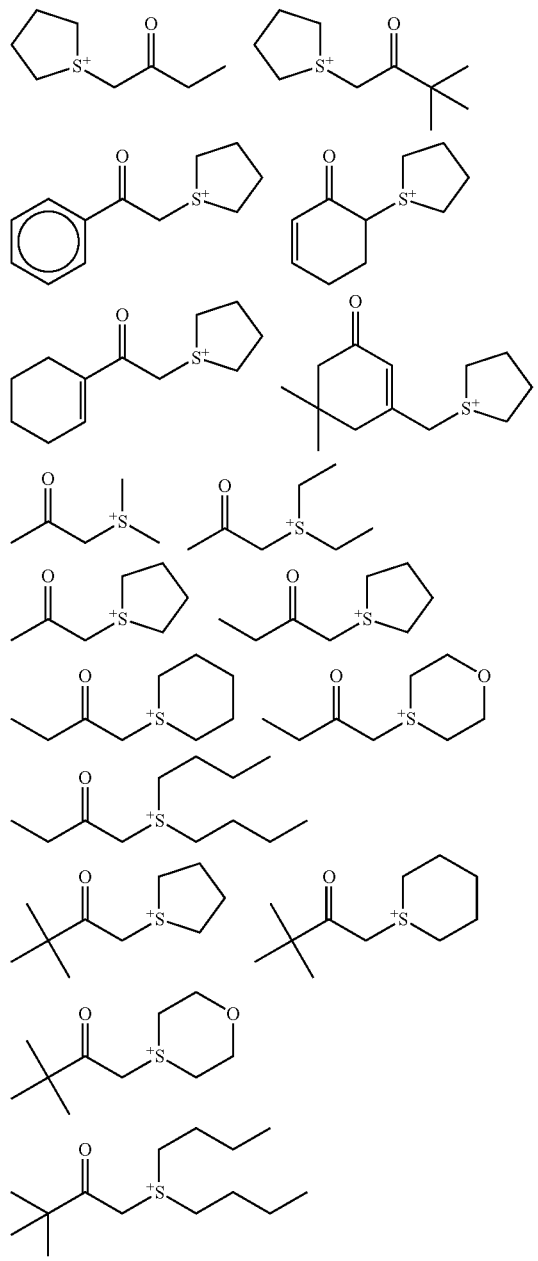

-continued

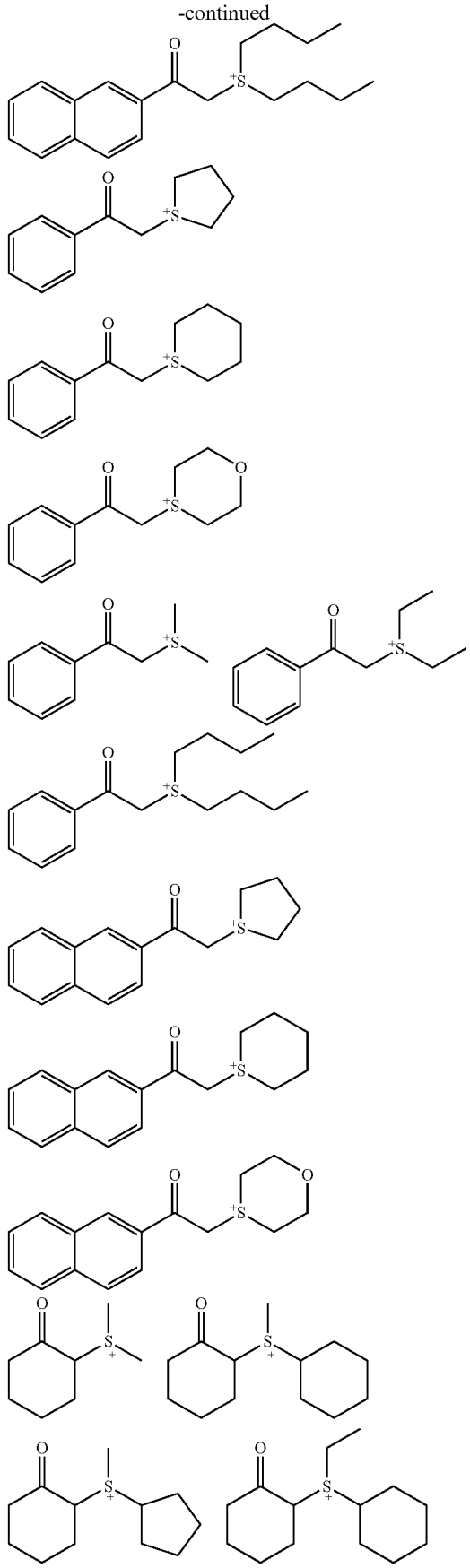

59
-continued
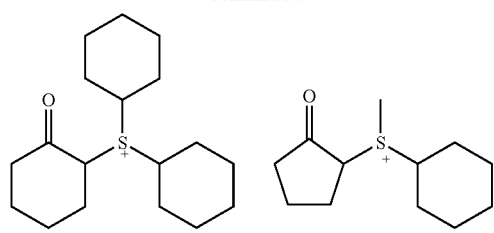
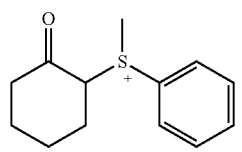
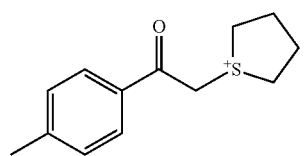
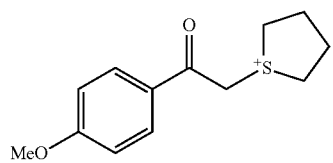
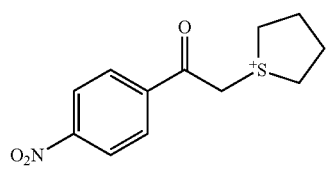
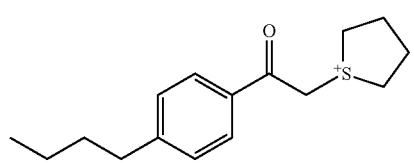
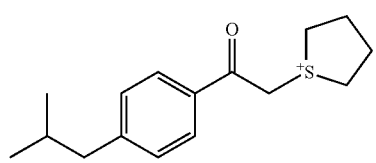
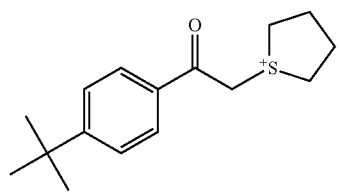
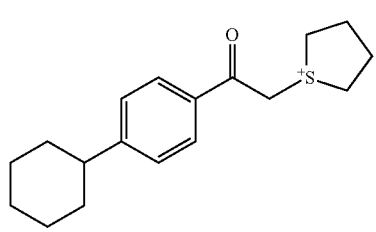
60
-continued
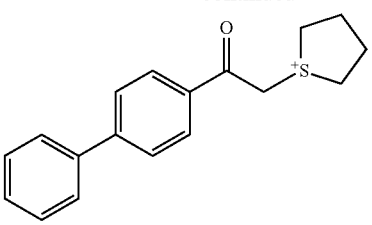
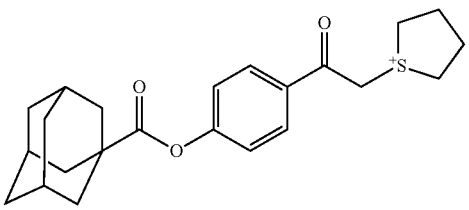
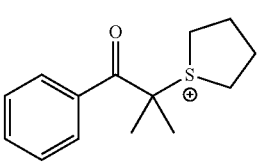
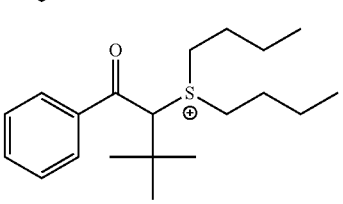
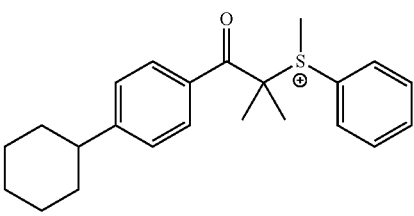
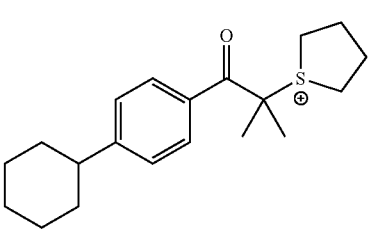
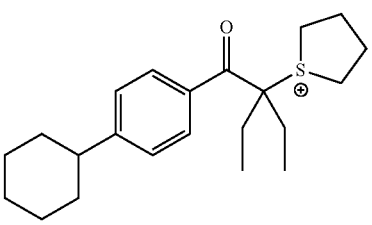
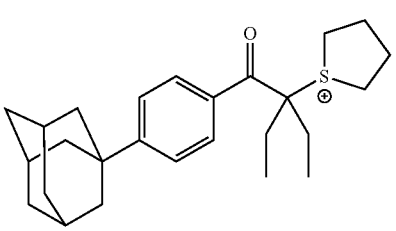

-continued
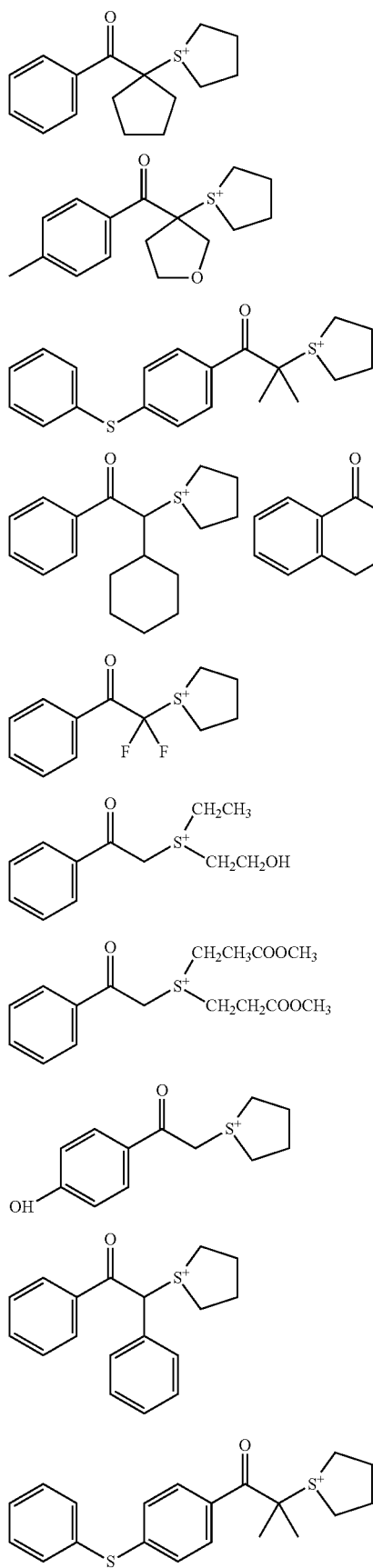
-continued
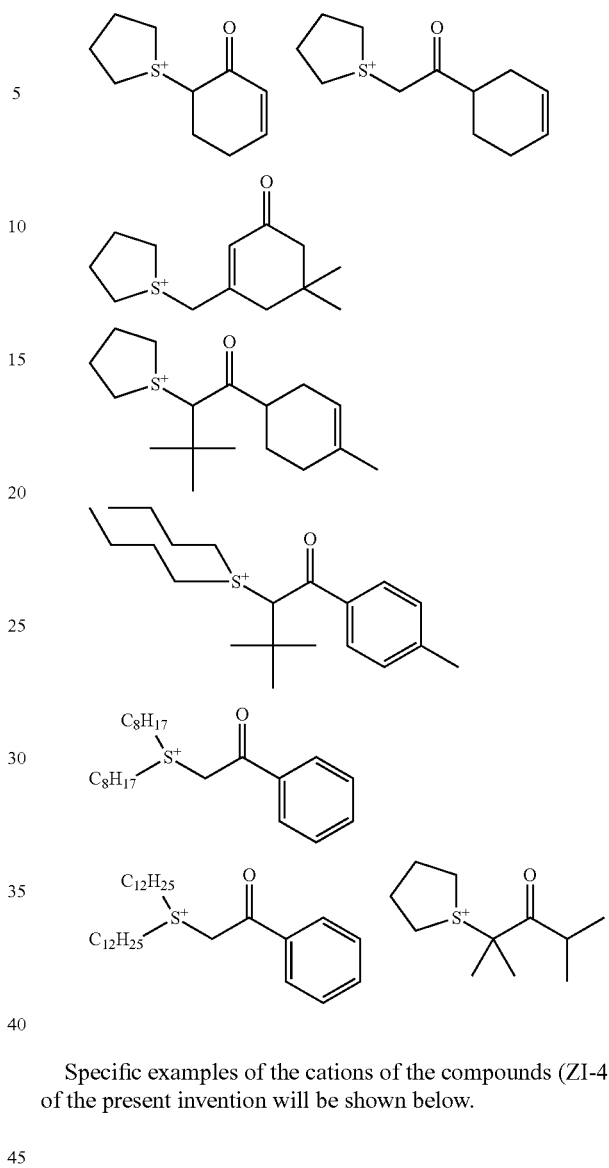
Specific examples of the cations of the compounds (ZI-4) of the present invention will be shown below.
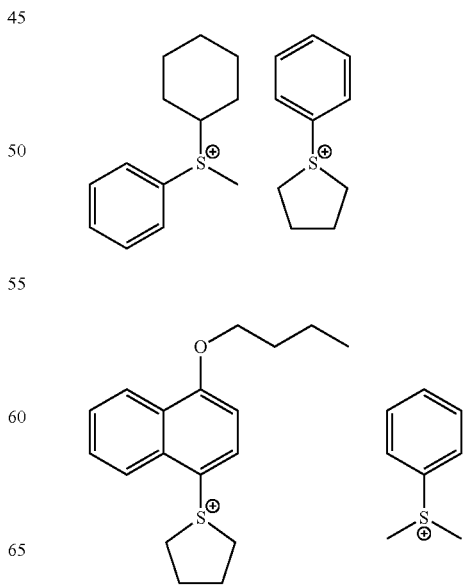

-continued
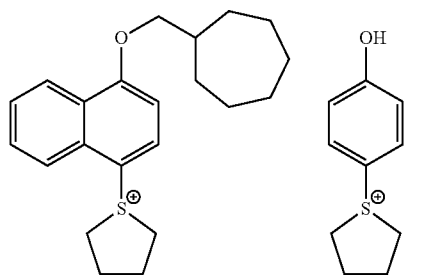
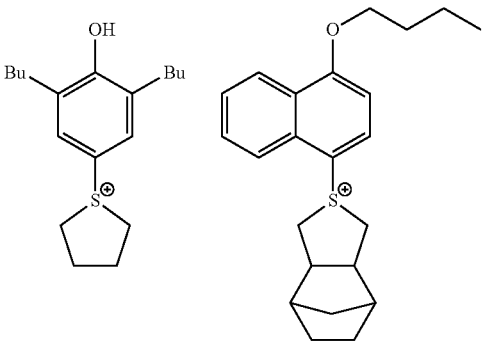
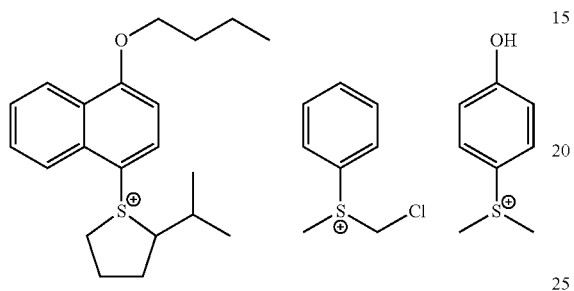
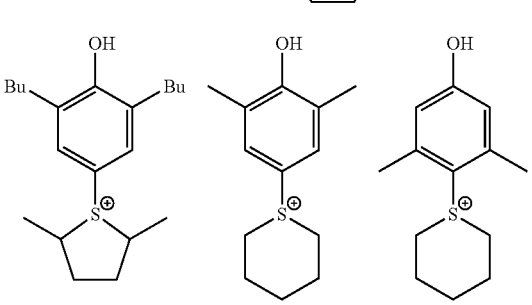
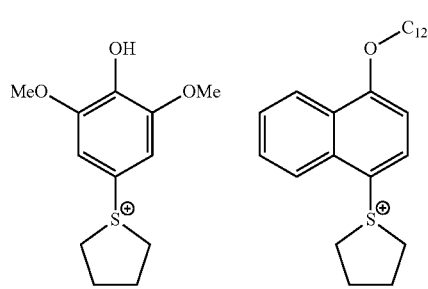
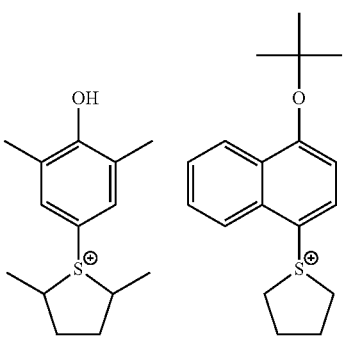
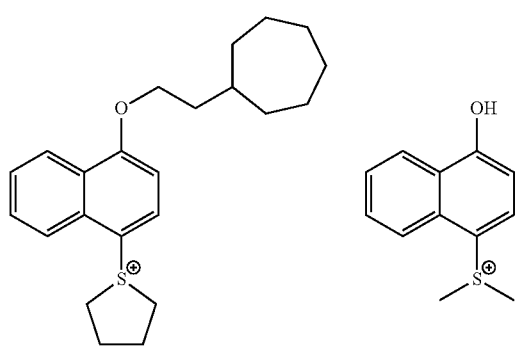
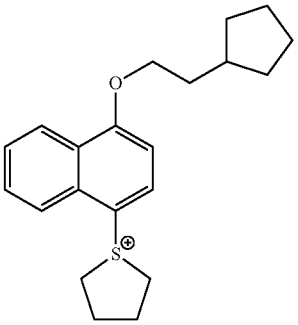
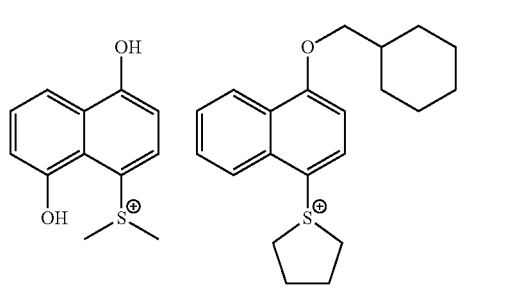
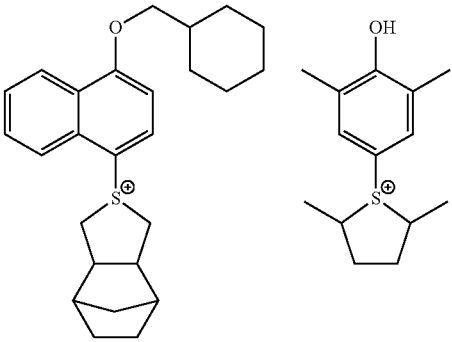

65
-continued
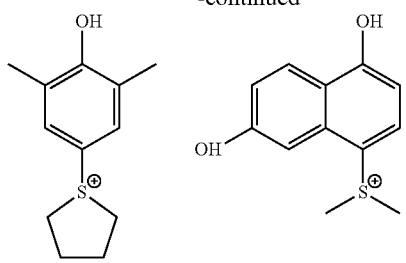
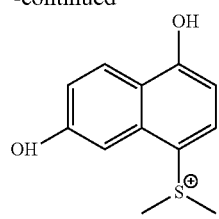
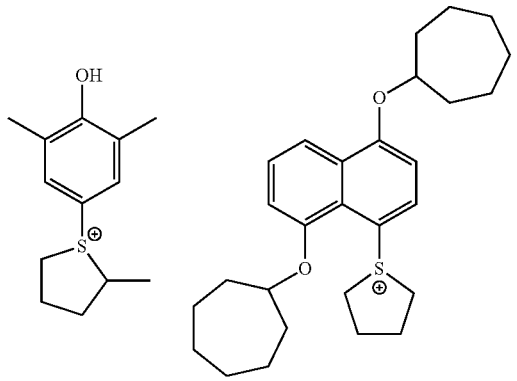
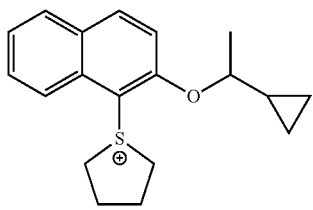
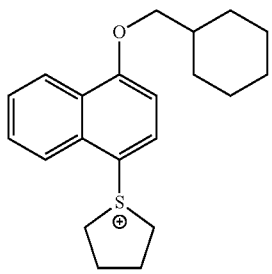
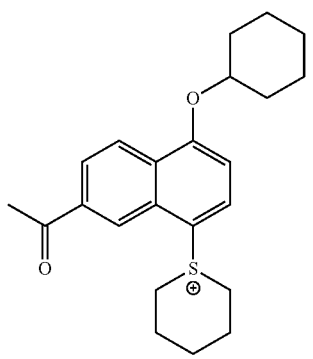
66
-continued
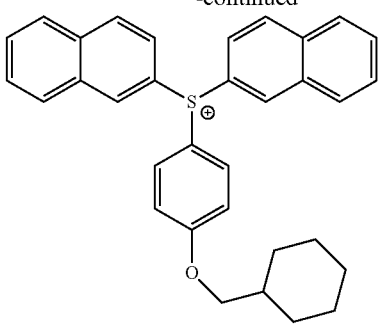
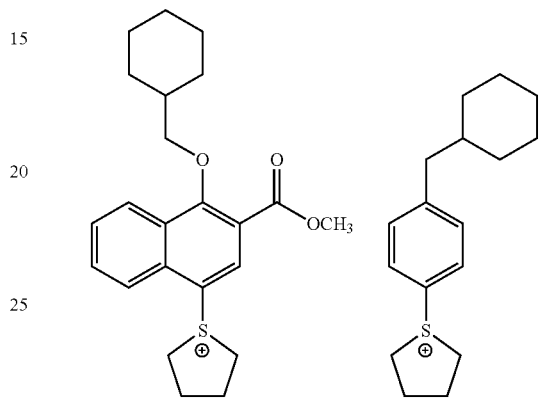
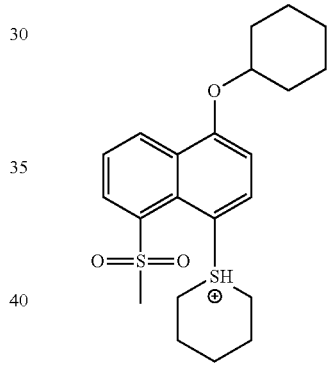
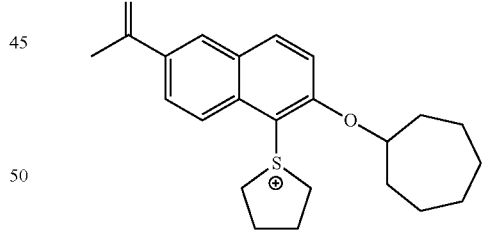
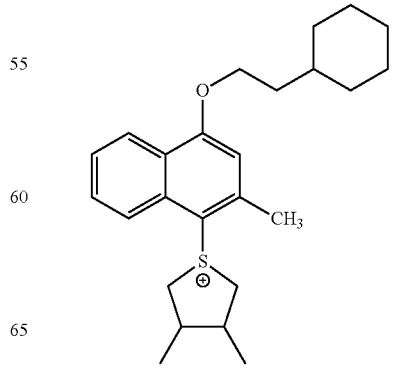

67
-continued
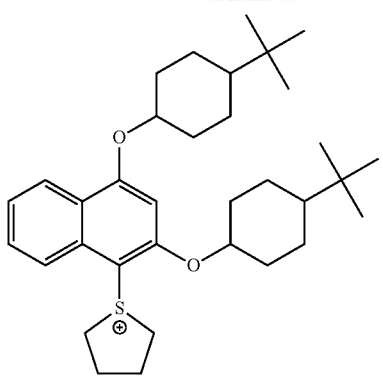
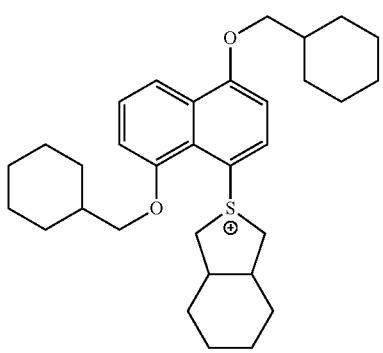
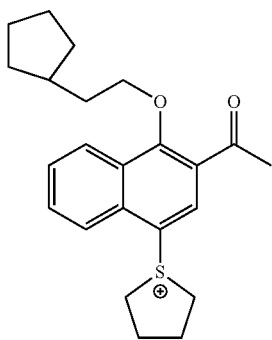
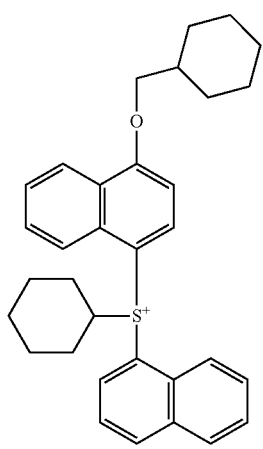
68
-continued
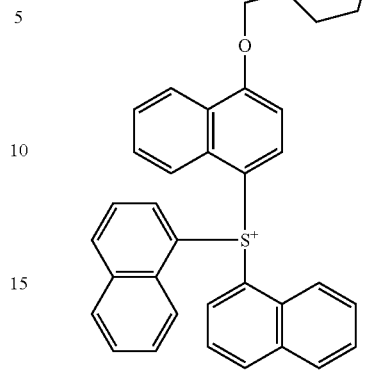
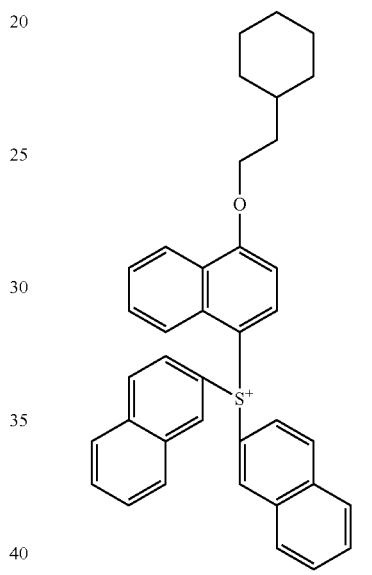
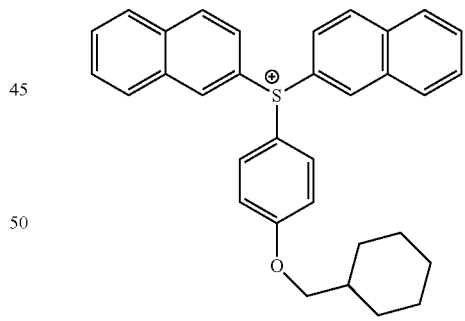
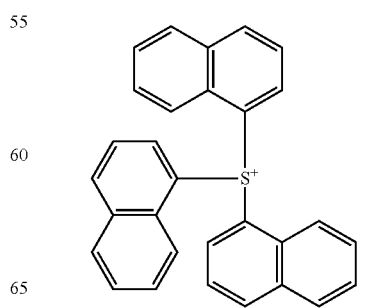

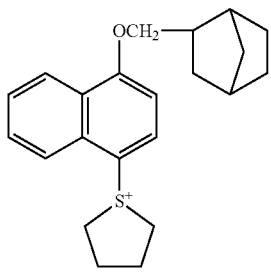

Now, general formulae (ZII) and (ZIII) will be described.

In general formulae (ZII) and (ZIII), each of $R_{204}$ to $R_{207}$ independently represents an aryl group, an alkyl group or a cycloalkyl group. At least $R_{206}$ or $R_{207}$ contains a fluorine atom.

The aryl group represented by each of $R_{204}$ to $R_{207}$ is preferably a phenyl group or a naphthyl group, more preferably a phenyl group.

The alkyl groups represented by $R_{204}$ to $R_{207}$ may be linear or branched. As preferred groups, there can be mentioned a linear or branched alkyl group having 1 to 10 carbon atoms (for example, a methyl group, an ethyl group, a propyl group, a butyl group or a pentyl group).

As preferred cycloalkyl groups represented by $R_{204}$ to $R_{207}$, there can be mentioned a cycloalkyl group having 3 to 10 carbon atoms (a cyclopentyl group, a cyclohexyl group or a norbornyl group).

The groups represented by $R_{204}$ to $R_{207}$ may have substituents. As the substituents that may be introduced in the groups represented by $R_{204}$ to $R_{207}$, there can be mentioned, for example, an alkyl group (for example, 1 to 15 carbon atoms), a cycloalkyl group (for example, 3 to 15 carbon atoms), an aryl group (for example, 6 to 15 carbon atoms), an alkoxy group (for example, 1 to 15 carbon atoms), a halogen atom, a hydroxyl group, a phenylthio group and the like.

$Z^-$ represents a nonnucleophilic anion. As such, there can be mentioned any of the same nonnucleophilic anions as mentioned above with respect to the $Z^-$ of the general formula (ZI).

The compounds of the general formulae (ZI) to (ZIII) are preferably used as a compound that when exposed to actinic rays or radiation, generates an acid containing a fluorine atom.

It is preferred for the compound (B) to be a compound that when exposed to actinic rays or radiation, generates an aliphatic sulfonic acid containing a fluorine atom or a benzenesulfonic acid containing a fluorine atom.

Preferably, the compound (B) has a triphenylsulfonium structure.

Further, preferably, the compound (B) is a triphenylsulfonium salt compound having at its cation part an unfluorinated alkyl group or cycloalkyl group.

Preferred examples of the compounds that when exposed to actinic rays or radiation, generate an acid will be shown below. With respect to compounds having no fluorine atom among the compounds shown below by way of examples, they can be used together with photoacid generators (B) having fluorine atoms.

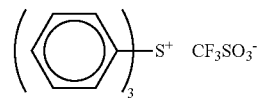
(z1)

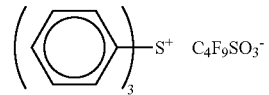
(z2)

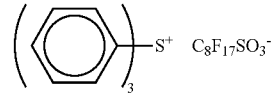
(z3)

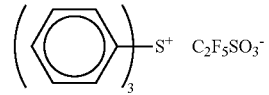
(z4)

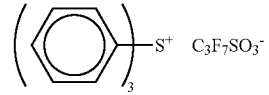
(z5)

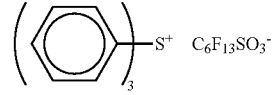
(z6)

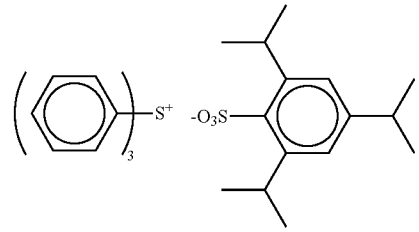
(z7)

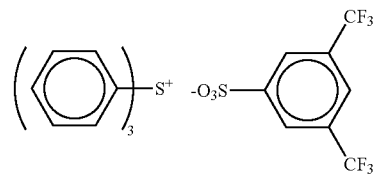
(z8)

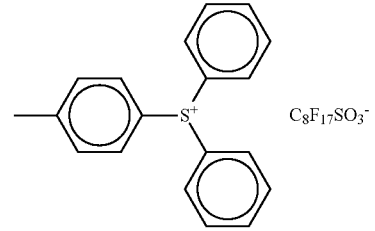
(z9)

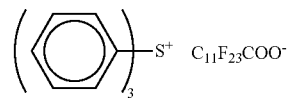
(z10)

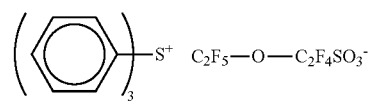
(z11)

-continued
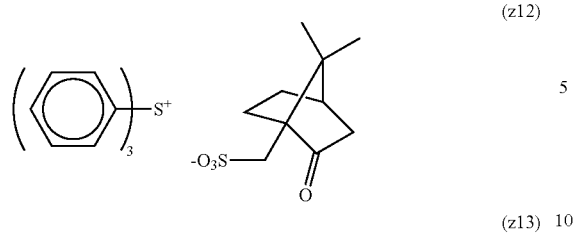
(z12)
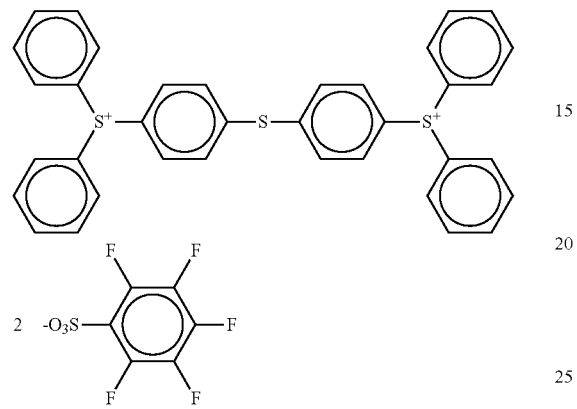
(z13)
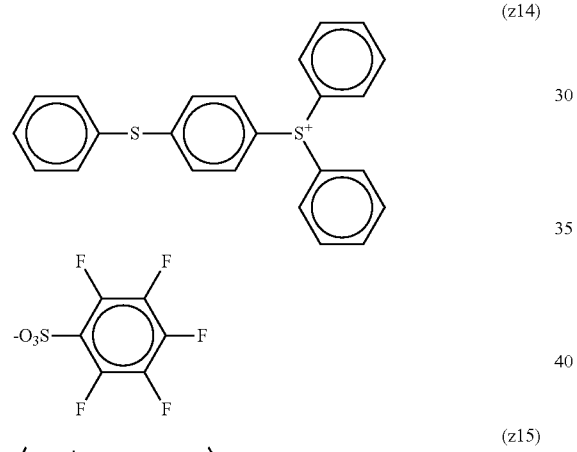
(z14)
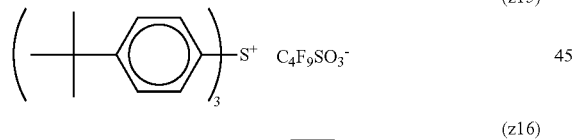
(z15)
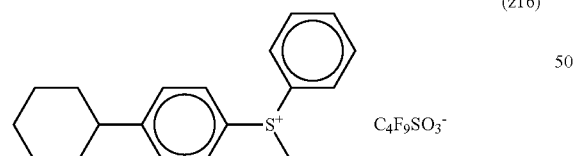
(z16)
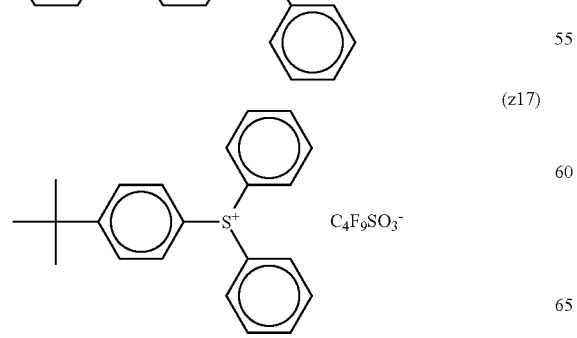
(z17)
-continued
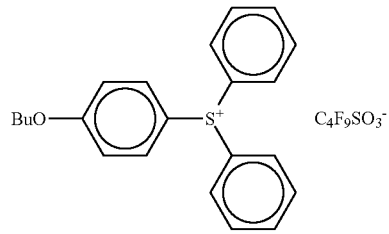
(z18)
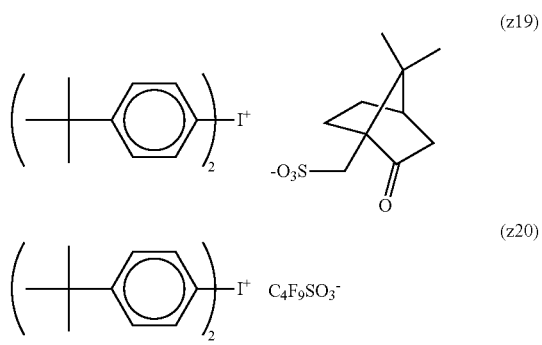
(z19)
(z20)
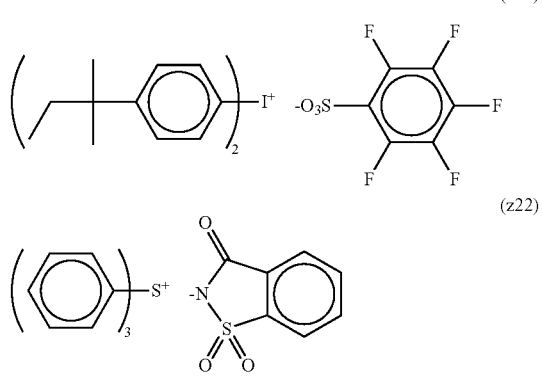
(z21)
(z22)
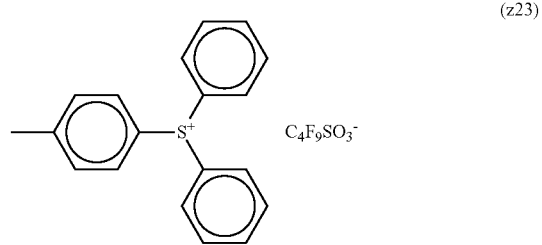
(z23)
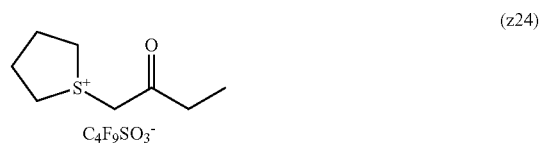
(z24)
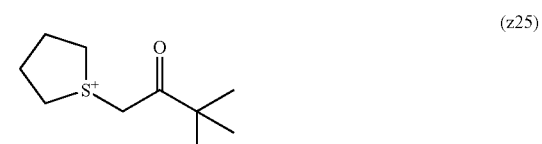
(z25)
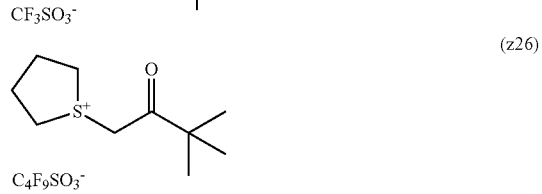
(z26)

-continued
(z27) 
(z28) 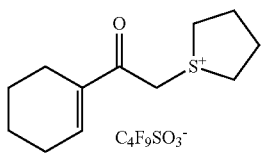
(z29) 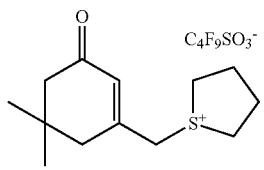
(z30) 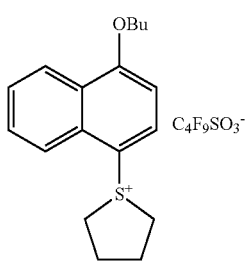
(z31) 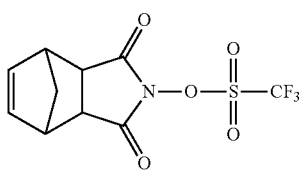
(z32) 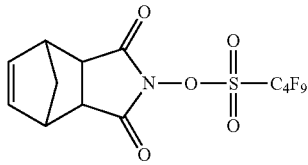
(z33) 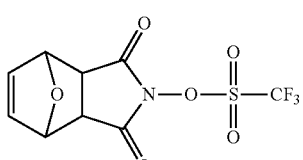
(z34) 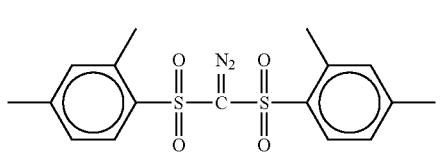
(z35) 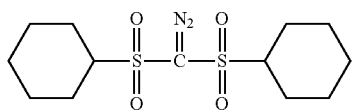
-continued
(z36) 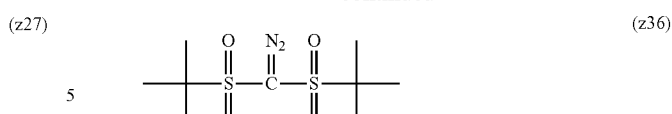
(z37) 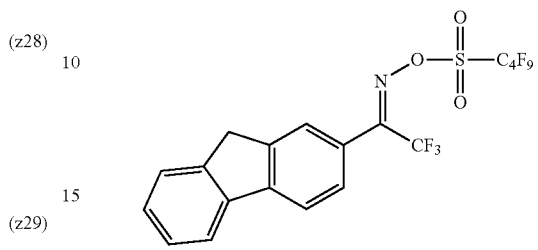
(z38) 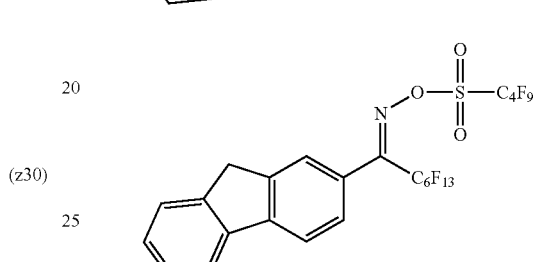
(z39) 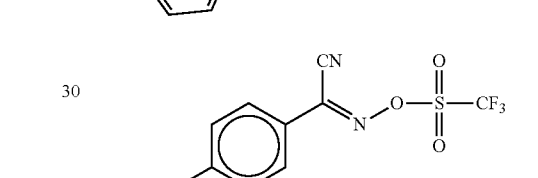
(z40) 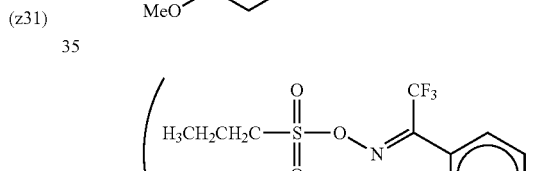
(z41) 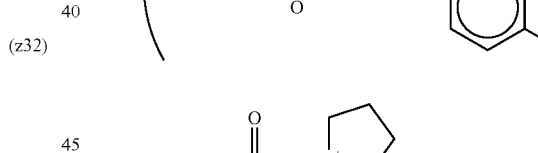
(z42) 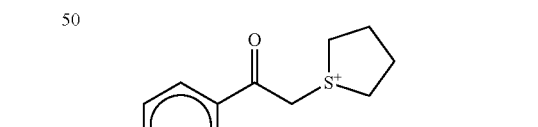
(z43) 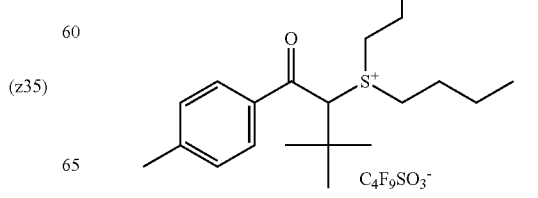

-continued
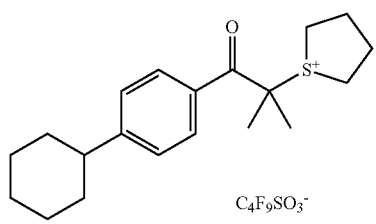 (z44)
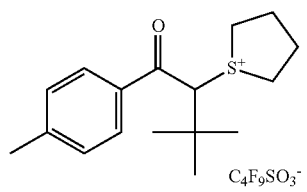 (z45)
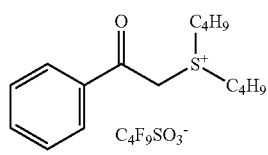 (z46)
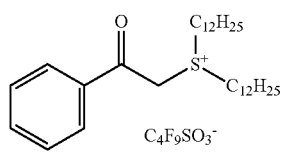 (z47)
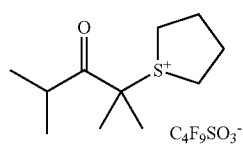 (z48)
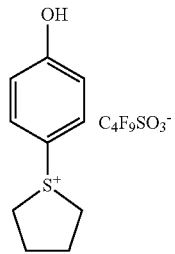 (z49)
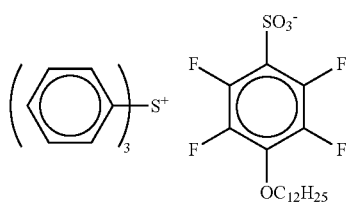 (z50)
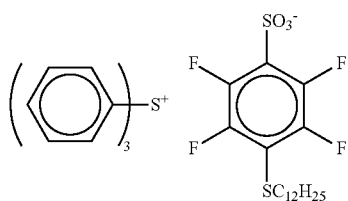 (z51)
-continued
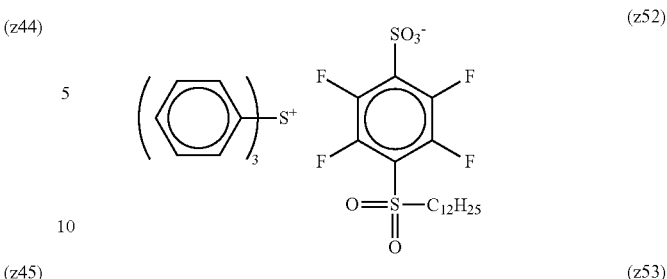 (z52)
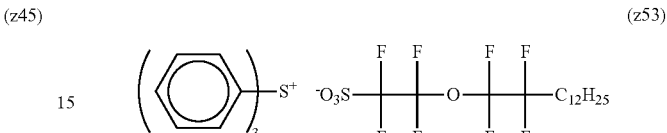 (z53)
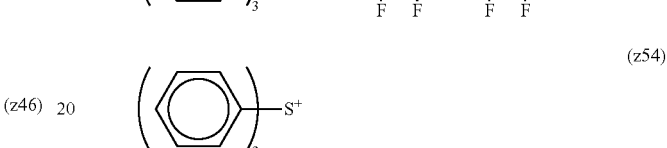 (z54)
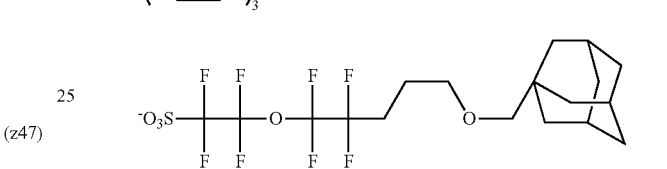 (z55)
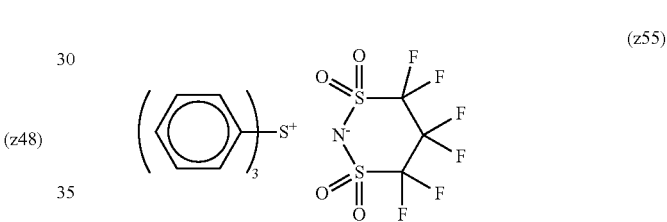 (z56)
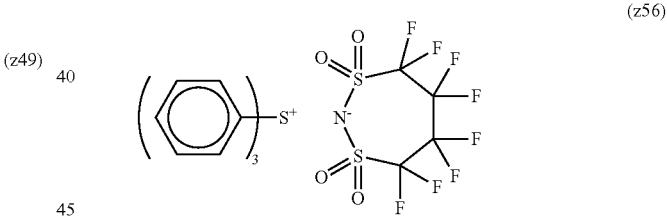 (z57)
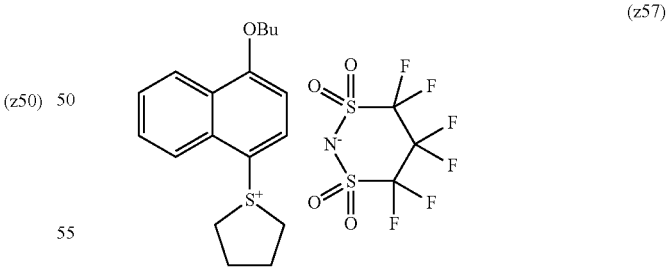 (z58)
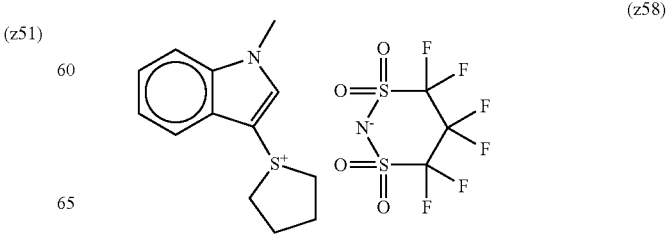

(z59) 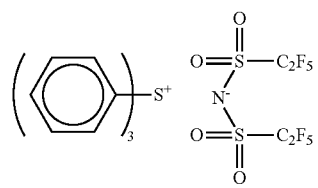
(z60) 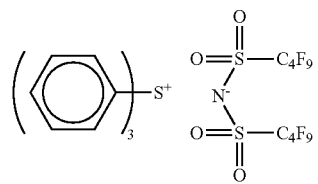
(z61) 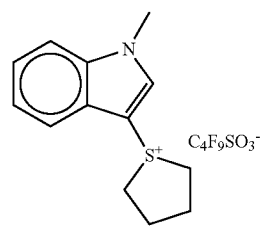
(z62) 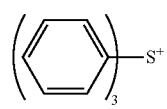
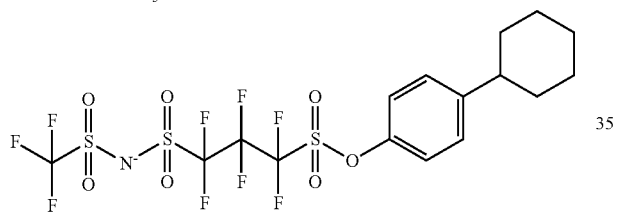
(z63) 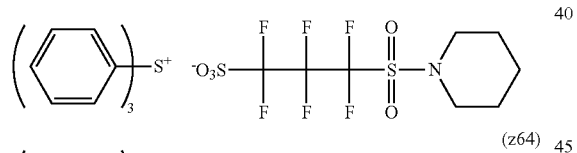
(z64) 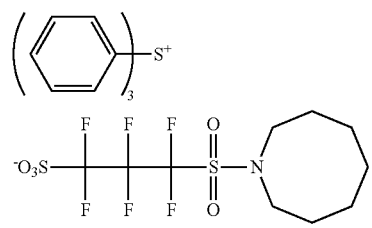
(z65) 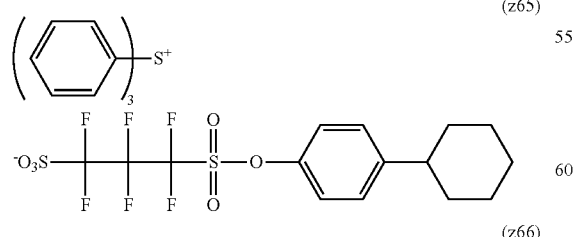
(z66) 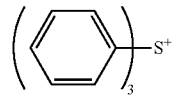
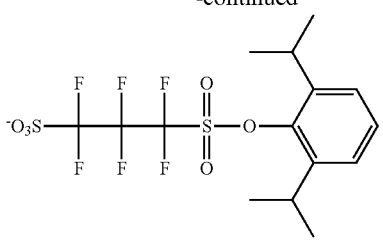
(z67) 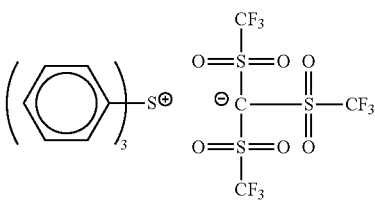
(z68) 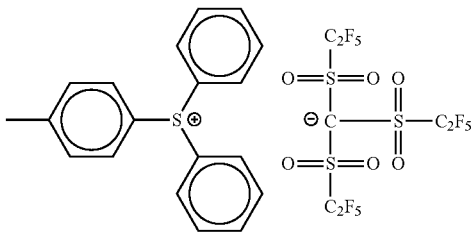
(z69) 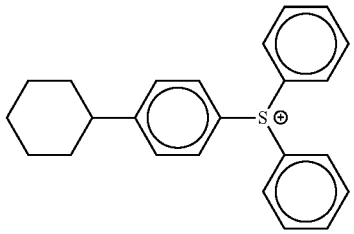
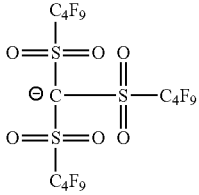
(z70) 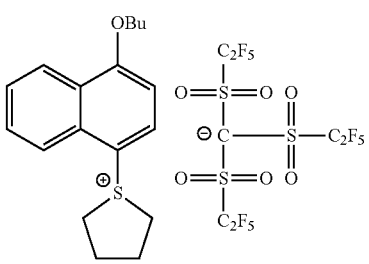
(z71) 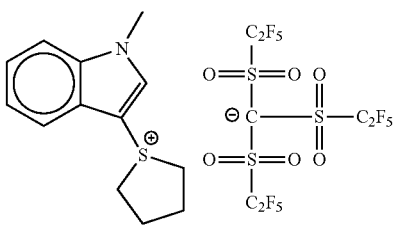

-continued
(z72)
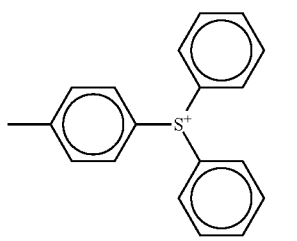
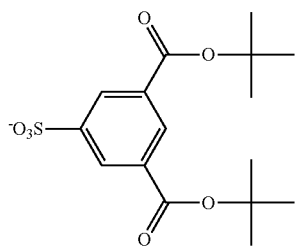
(z73)
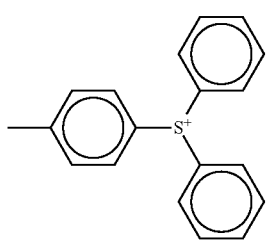
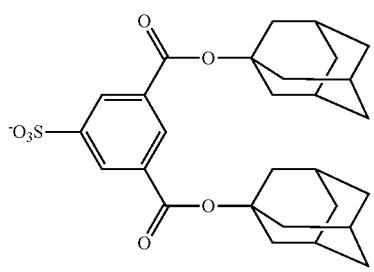
(z74)
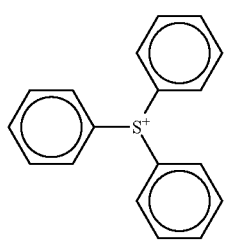
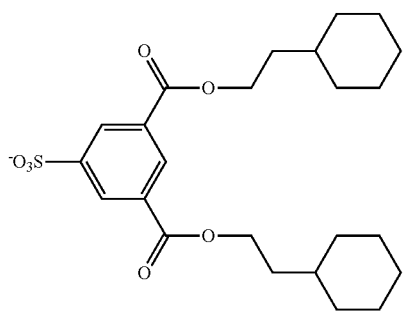
-continued
(z75)
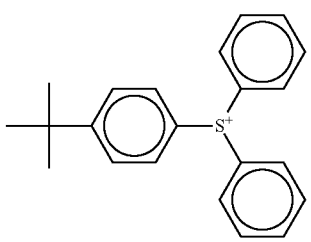
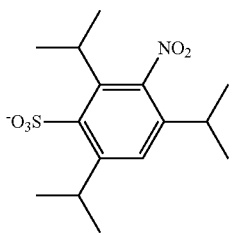
(z76)
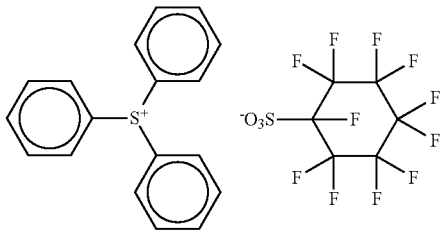
(z77)
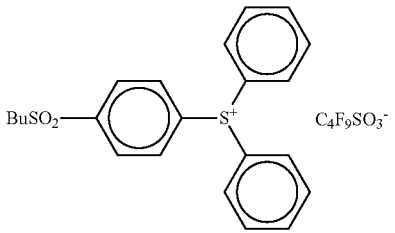
(z78)
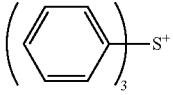
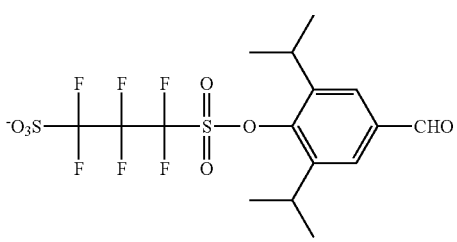
(z79)
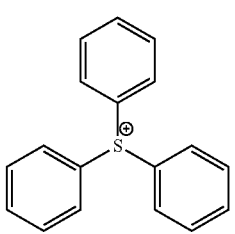

-continued
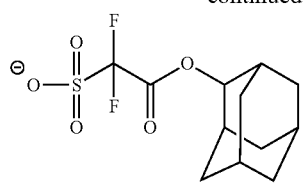
(z80)
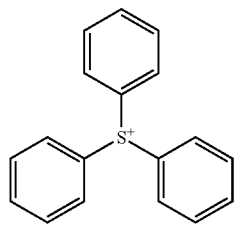
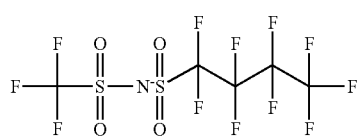
(z81)
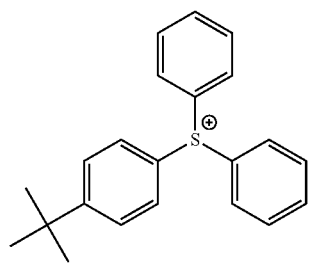
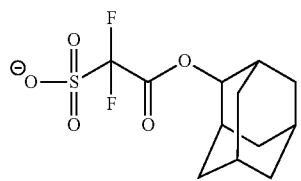
(z82)
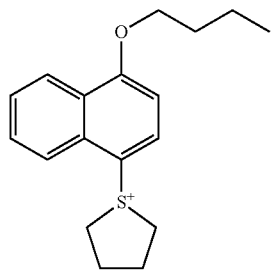
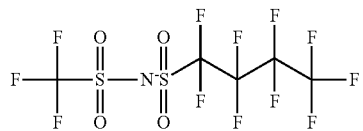
(z83)
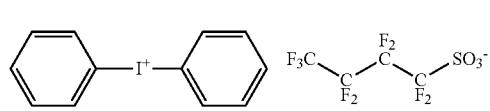
-continued
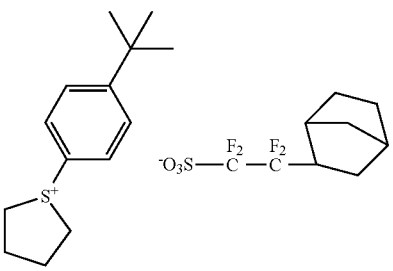
(z84)
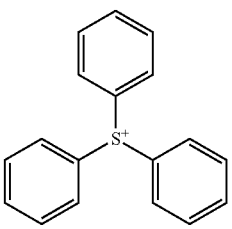
(z85)
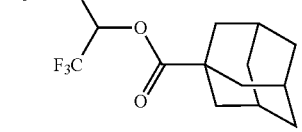
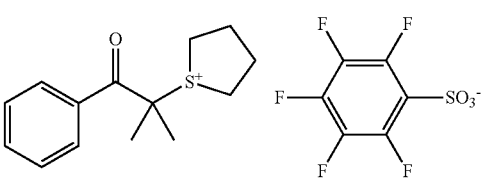
(z86)
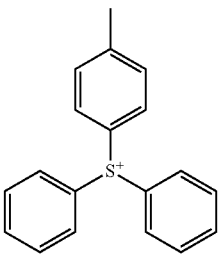
(z87)
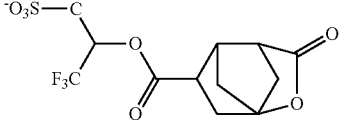
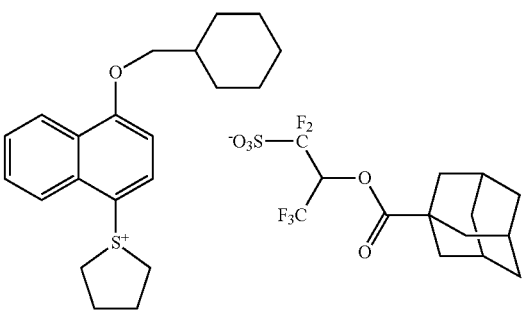
(z88)

The photoacid generators (B) can be used alone or in combination.

The content of photoacid generator (B) in the composition is in the range of 8 to 20 mass %, preferably 9 to 15 mass %, based on the total solids of the actinic-ray- or radiation-sensitive resin composition. In particular, when the photoacid generator has any of the structures of the general formulae (ZI-3) and (ZI-4), the content is preferably in the range of 9 to 20 mass %, more preferably 12 to 20 mass %. When the content of the photoacid generator is less than 8 mass %, the deprotection within the pattern would not satisfactorily advance to thereby tend to invite a deterioration of pattern strength. On the other hand, when the content of photoacid generator exceeds 20 mass %, the problem that the exposure amount margin of line width decreases would occur.

(C) Solvent

The solvent that is usable in the preparation of the composition is not particularly limited as long as it can dissolve the components of the composition. For example, preferred use is made of a solvent containing either one or two or more members selected from among an alkylene glycol monoalkyl ether carboxylate (propylene glycol monomethyl ether acetate or the like), an alkylene glycol monoalkyl ether (propylene glycol monomethyl ether or the like), an alkyl lactate (ethyl lactate, methyl lactate or the like), a cyclolactone (γ-butyrolactone or the like, preferably having 4 to 10 carbon atoms), a linear or cyclic ketone (2-heptanone, cyclohexanone or the like, preferably having 4 to 10 carbon atoms), an alkylene carbonate (ethylene carbonate, propylene carbonate or the like), an alkyl carboxylate (preferably an alkyl acetate such as butyl acetate), an alkyl alkoxyacetate (ethyl ethoxypropionate) and the like. As other useful solvents, there can be mentioned, for example, those described in section [0244] et seq. of US 2008/0248425 A1 and the like.

Among the above solvents, an alkylene glycol monoalkyl ether carboxylate and an alkylene glycol monoalkyl ether are preferred.

These solvents may be used alone or in combination. When a plurality of solvents are mixed together, it is preferred to mix a hydroxylated solvent with a non-hydroxylated solvent. The mass ratio of hydroxylated solvent to non-hydroxylated solvent is in the range of 1/99 to 99/1, preferably 10/90 to 90/10 and more preferably 20/80 to 60/40.

The hydroxylated solvent is preferably an alkylene glycol monoalkyl ether. The non-hydroxylated solvent is preferably an alkylene glycol monoalkyl ether carboxylate.

(D) Resin Having at Least a Fluorine Atom or a Silicon Atom

Exposure (liquid immersion exposure) may be carried out after filling the interstice between a film of actinic-ray- or radiation-sensitive resin composition and a lens with a liquid (liquid immersion medium, liquid for liquid immersion) of refractive index higher than that of air at the time of exposure to actinic rays or radiation. If so, a resin (hereinafter also referred to as "hydrophobic resin (HR)") having at least a fluorine atom or a silicon atom may be added to the composition of the present invention. The resolution can be enhanced by the exposure through the liquid immersion medium. The useful liquid immersion medium is preferably water. Water is preferred from the viewpoint of a refractive index with a low temperature coefficient, easy procurement and easy handling.

Further, from the viewpoint of refractive index increase, use can be made of a medium having a refractive index of 1.5 or higher. Such a medium may be an aqueous solution or an organic solvent.

When water is used as a liquid for liquid immersion, an additive intended for an increase of refractive index, etc. may be added to water in slight proportion. Examples of such additives are particularized in Chapter 12 of "Process and Material of Liquid Immersion Lithography" published by CMC Publishing Co., Ltd. On the other hand, the presence of a substance being opaque in 193-nm light or presence of an impurity whose refractive index is greatly different from that of water would invite a distortion of optical image projected on the film of actinic-ray- or radiation-sensitive resin. Accordingly, it is preferred to use distilled water as the liquid immersion water. Further, use may be made of water having been purified through an ion exchange filter or the like. Desirably, the electrical resistance of pure water is 18.3 MΩcm or higher, and the TOC (organic matter concentration) thereof is 20 ppb or below. Prior deaeration of the water is desired.

The addition of the hydrophobic resin (HR) to the composition of the present invention would bring about an uneven localization of the hydrophobic resin (HR) on the surface layer of the film. Thus, when the liquid immersion medium is water, there would be attained an increase of receding contact angle on the surface of the film with reference to water upon formation of the film and accordingly an enhancement of the liquid immersion water tracking property. The hydrophobic resin (HR) is not limited as long as it is a resin having at least a fluorine atom or a silicon atom, the addition of which increases the receding contact angle on the surface. The receding contact angle of the film is preferably in the range of 60° to 90°, more preferably 70° or greater. The amount of hydrophobic resin added can be appropriately regulated so that the receding contact angle of the film falls within the above range. However, it is preferred for the addition amount to fall within the range of 0.1 to 10 mass %, more preferably 0.1 to 5 mass % based on the total solids of the actinic-ray- or radiation-sensitive resin composition. Although the hydrophobic resin (HR) is unevenly localized on the surface of the film as mentioned above, differing from surfactants, the hydrophobic resin does not necessarily have to have a hydrophilic group in its molecule and does not need to contribute toward uniform mixing of polar/nonpolar substances.

The receding contact angle refers to a contact angle determined when the contact line at a droplet-substrate interface draws back. It is known that the receding contact angle is useful in the simulation of droplet mobility in a dynamic condition. In a simple definition, the receding contact angle can be defined as the contact angle exhibited at the recession of the droplet interface at the time of, after application of a droplet discharged from a needle tip onto a substrate, re-indrawing the droplet into the needle. Generally, the receding contact angle can be measured according to a method of contact angle measurement known as the dilation/contraction method.

In the operation of liquid immersion exposure, it is needed for the liquid for liquid immersion to move on a wafer while tracking the movement of an exposure head involving high-speed scanning on the wafer and thus forming an exposure pattern. Therefore, the contact angle of the liquid for liquid immersion with respect to the resist film in dynamic condition is important, and it is required for the resist to be capable of tracking the high-speed scanning of the exposure head without leaving any droplets.

The fluorine atom or silicon atom of the hydrophobic resin (HR) may be present in the principal chain of the resin or may be a substituent on the side chain thereof.

The hydrophobic resin (HR) is preferably a resin having an alkyl group containing a fluorine atom, a cycloalkyl group containing a fluorine atom or an aryl group containing a fluorine atom as a partial structure containing a fluorine atom.

The alkyl group containing a fluorine atom (preferably having 1 to 10 carbon atoms, more preferably 1 to 4 carbon atoms) is a linear or branched alkyl group having at least one hydrogen atom thereof substituted with a fluorine atom. Further, other substituents may be possessed.

The cycloalkyl group containing a fluorine atom is a cycloalkyl group of a single ring or multiple rings having at least one hydrogen atom thereof substituted with a fluorine atom. Further, other substituents may be contained.

As the aryl group containing a fluorine atom, there can be mentioned one having at least one hydrogen atom of an aryl group, such as a phenyl or naphthyl group, substituted with a fluorine atom. Further, other substituents may be contained.

As preferred alkyl groups containing a fluorine atom, cycloalkyl groups containing a fluorine atom and aryl groups containing a fluorine atom, there can be mentioned groups of the following general formulae (F2) to (F4), which however in no way limit the scope of the present invention.

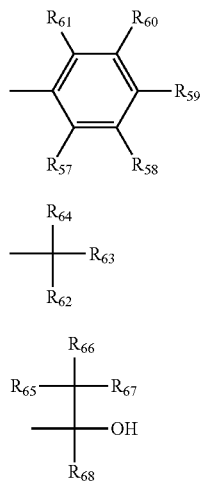

(F2)

(F3)

(F4)

In general formulae (F2) to (F4), each of $R_{57}$ to $R_{68}$ independently represents a hydrogen atom, a fluorine atom or an alkyl group, provided that at least one of each of $R_{57}$-$R_{61}$, $R_{62}$-$R_{64}$ and $R_{65}$-$R_{68}$ represents a fluorine atom or an alkyl group (preferably having 1 to 4 carbon atoms) having at least one hydrogen atom thereof substituted with a fluorine atom. It is preferred that all of $R_{57}$-$R_{61}$ and $R_{65}$-$R_{67}$ represent fluorine atoms. Each of $R_{62}$, $R_{63}$ and $R_{68}$ preferably represents an alkyl group (especially having 1 to 4 carbon atoms) having at least one hydrogen atom thereof substituted with a fluorine atom, more preferably a perfluoroalkyl group having 1 to 4 carbon atoms. $R_{62}$ and $R_{63}$ may be bonded with each other to thereby form a ring.

Specific examples of the groups of the general formula (F2) include a p-fluorophenyl group, a pentafluorophenyl group, a 3,5-di(trifluoromethyl)phenyl group and the like.

Specific examples of the groups of the general formula (F3) include a trifluoromethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2, 3,3-tetrafluorocyclobutyl group, a perfluorocyclohexyl group and the like. Of these, a hexafluoroisopropyl group, a heptafluoroisopropyl group, a hexafluoro(2-methyl)isopropyl group, an octafluoroisobutyl group, a nonafluoro-t-butyl group and a perfluoroisopentyl group are preferred. A hexafluoroisopropyl group and a heptafluoroisopropyl group are more preferred.

Specific examples of the groups of the general formula (F4) include —C(CF$_3$)$_2$OH, —C(C$_2$F$_5$)$_2$OH, —C(CF$_3$)(CF$_3$)OH, —CH(CF$_3$)OH and the like. —C(CF$_3$)$_2$OH is preferred.

Specific examples of the repeating units having a fluorine atom will be shown below, which however in no way limit the scope of the present invention.

In the specific examples, X$_1$ represents a hydrogen atom, —CH$_3$, —F or —CF$_3$.

X$_2$ represents —F or —CF$_3$.

Further, as the specific examples, there can be mentioned the repeating units having fluorine atoms contained in the resins (HR-1) to (HR-65) below.

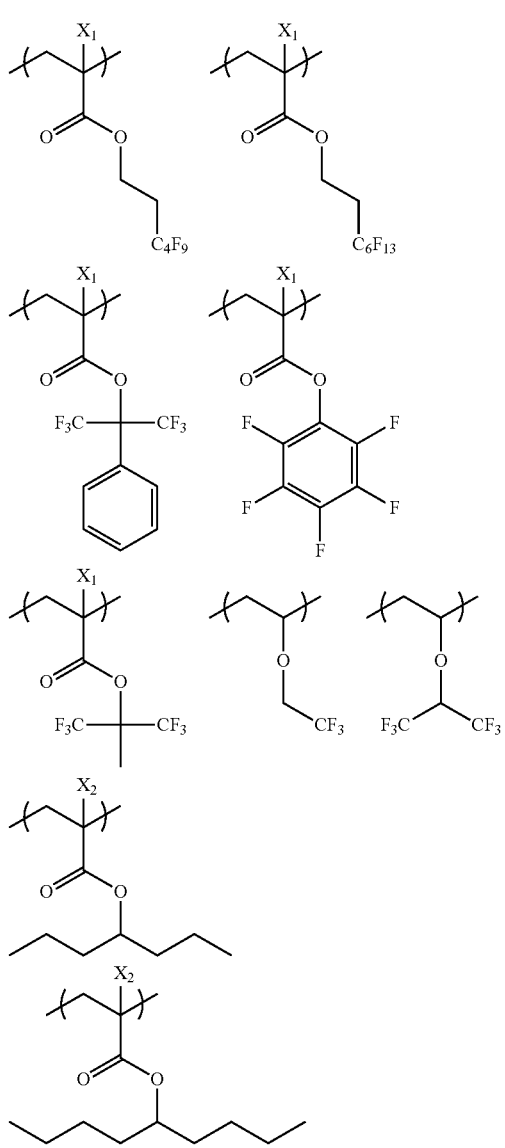

-continued

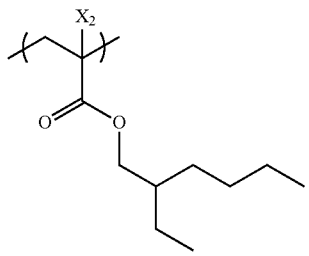

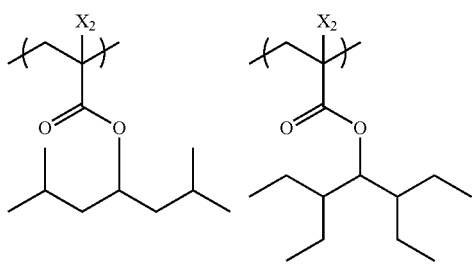

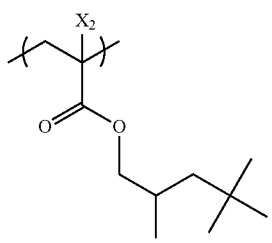

The hydrophobic resin (HR) is preferably a resin having an alkylsilyl structure (preferably a trialkylsilyl group) or a cyclosiloxane structure as a partial structure having a silicon atom.

As the alkylsilyl structure or cyclosiloxane structure, there can be mentioned, for example, any of the groups of the following general formulae (CS-1) to (CS-3) or the like.

(CS-1)

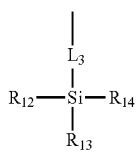

(CS-2)

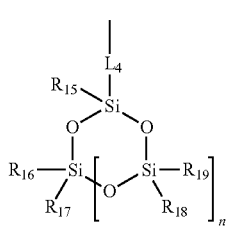

-continued (CS-3)

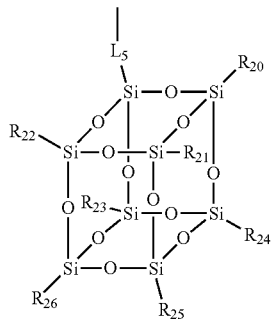

In the general formulae (CS-1) to (CS-3), each of $R_{12}$ to $R_{26}$ independently represents a linear or branched alkyl group (preferably having 1 to 20 carbon atoms) or a cycloalkyl group (preferably having 3 to 20 carbon atoms).

Each of $L_3$ to $L_5$ represents a single bond or a bivalent connecting group. As the bivalent connecting group, there can be mentioned any one or a combination of two or more groups selected from the group consisting of an alkylene group, a phenylene group, an ether group, a thioether group, a carbonyl group, an ester group, an amido group, a urethane group and a urea group.

In the formulae, n is an integer of 1 to 5.

Specific examples of the repeating units having the groups of the general formulae (CS-1) to (CS-3) will be shown below, which however in no way limit the scope of the present invention. Further, as the specific examples, there can be mentioned the repeating units having silicon atoms contained in the resins (HR-1) to (HR-65) below.

In the specific examples, $X_1$ represents a hydrogen atom, —$CH_3$, —F or —$CF_3$.

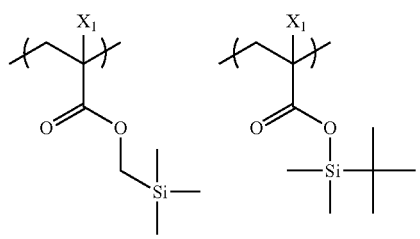

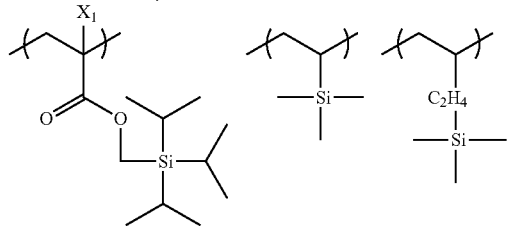

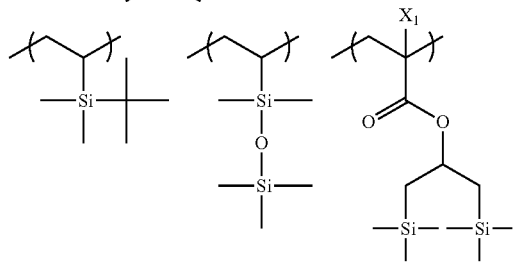

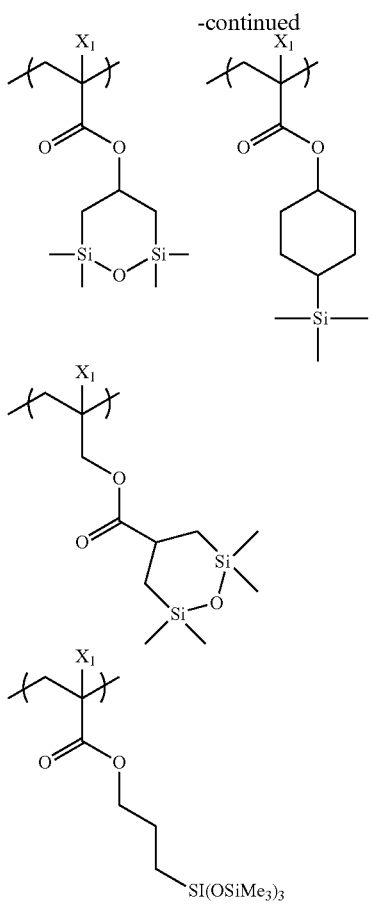

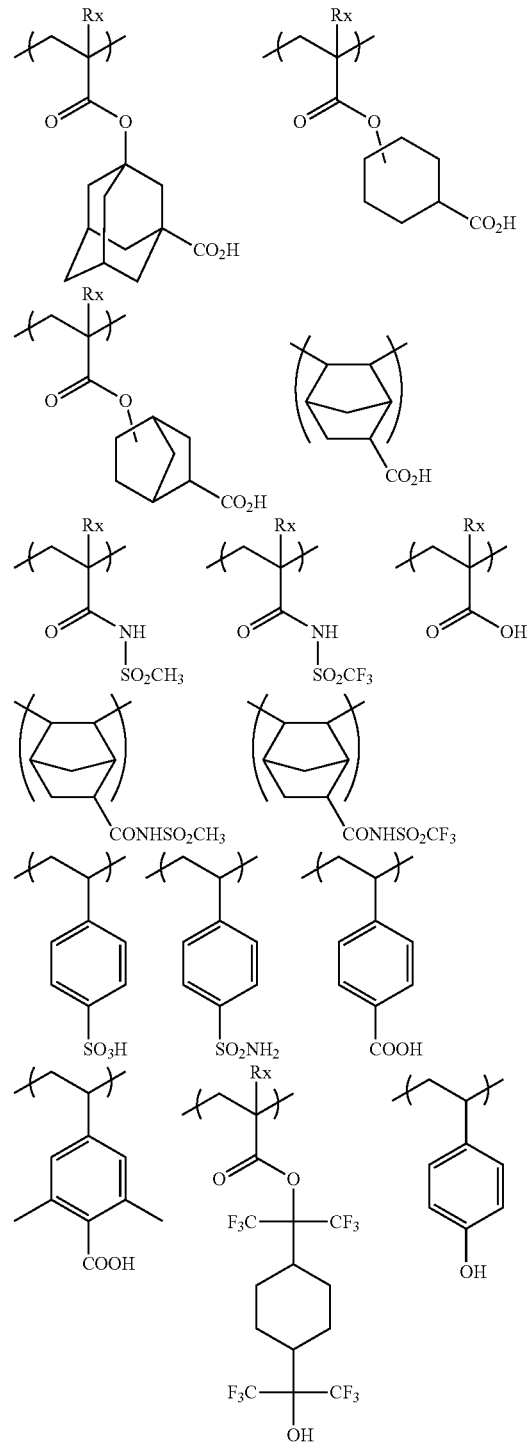

Moreover, the hydrophobic resin (HR) may have at least one group selected from among the following groups (x) to (z):

(x) an alkali soluble group,
(y) a group that is decomposed by the action of an alkali developer, resulting in an increase of solubility in the alkali developer, and
(z) a group that is decomposed by the action of an acid.

As the alkali soluble group (x), there can be mentioned a phenolic hydroxyl group, a carboxylate group, a fluoroalcohol group, a sulfonate group, a sulfonamido group, a sulfonylimido group, an (alkylsulfonyl)(alkylcarbonyl)methylene group, an (alkylsulfonyl)(alkylcarbonyl)imido group, a bis(alkylcarbonyl)methylene group, a bis(alkylcarbonyl)imido group, a bis(alkylsulfonyl)methylene group, a bis(alkylsulfonyl)imido group, a tris(alkylcarbonyl)methylene group, a tris(alkylsulfonyl)methylene group or the like.

As preferred alkali soluble groups, there can be mentioned a fluoroalcohol group (preferably hexafluoroisopropanol), a sulfonimido group and a bis(carbonyl)methylene group.

As the repeating unit having an alkali soluble group (x), preferred use is made of any of a repeating unit resulting from direct bonding of an alkali soluble group to the principal chain of a resin like a repeating unit of acrylic acid or methacrylic acid, a repeating unit resulting from bonding, via a connecting group, of an alkali soluble group to the principal chain of a resin and a repeating unit resulting from polymerization with the use of a chain transfer agent or polymerization initiator having an alkali soluble group to thereby introduce the same in a polymer chain terminal.

The content ratio of repeating units having an alkali soluble group (x) is preferably in the range of 1 to 50 mol %, more preferably 3 to 35 mol % and still more preferably 5 to 20 mol % based on all the repeating units of the polymer.

Specific examples of the repeating units having an alkali soluble group (x) will be shown below, which however in no way limit the scope of the present invention. Further, as the specific examples, there can be mentioned the repeating units having an alkali soluble group (x) contained in the resins (HR-1) to (HR-65) below.

In the formulae, Rx represents H, $CH_3$, $CF_3$ or $CH_2OH$.

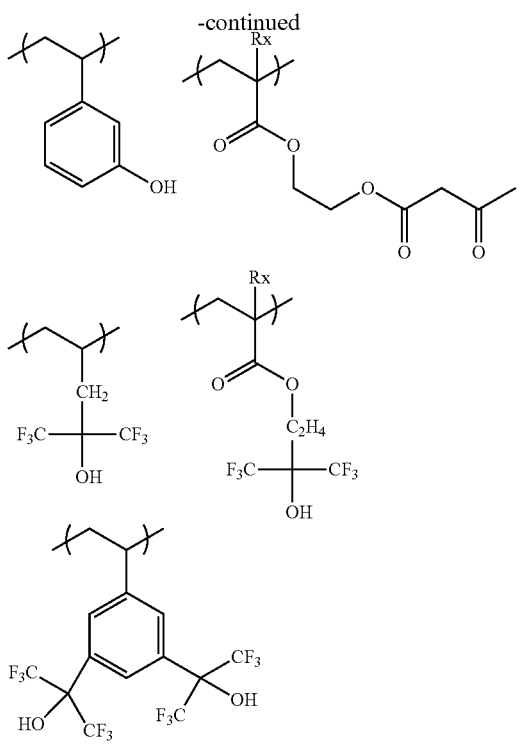

As the group (y) that is decomposed by the action of an alkali developer, resulting in an increase of solubility in the alkali developer, there can be mentioned, for example, a group having a lactone structure, an acid anhydride group, an acid imide group or the like. A group having a lactone structure is preferred.

As the repeating unit having a group (y) that is decomposed by the action of an alkali developer, resulting in an increase of solubility in the alkali developer, preferred use is made of both of a repeating unit resulting from bonding of a group (y) that is decomposed by the action of an alkali developer, resulting in an increase of solubility in the alkali developer, to the principal chain of a resin such as a repeating unit of acrylic ester or methacrylic ester, and a repeating unit resulting from polymerization with the use of a chain transfer agent or polymerization initiator having a group (y) resulting in an increase of solubility in an alkali developer to thereby introduce the same in a polymer chain terminal.

The content of repeating units having a group (y) resulting in an increase of solubility in an alkali developer is preferably in the range of 1 to 40 mol %, more preferably 3 to 30 mol % and still more preferably 5 to 15 mol % based on all the repeating units of the polymer.

As specific examples of the repeating units having a group (y) resulting in an increase of solubility in an alkali developer, there can be mentioned those similar to the repeating units having a lactone structure set forth with respect to the resins as the component (A).

As the repeating unit having a group (z) that is decomposed by the action of an acid in the hydrophobic resin (HR), there can be mentioned those similar to the repeating units having an acid decomposable group set forth with respect to the resin (A). The content of repeating units having a group (z) that is decomposed by the action of an acid in the hydrophobic resin (HR) is preferably in the range of 1 to 80 mol %, more preferably 10 to 80 mol % and still more preferably 20 to 60 mol % based on all the repeating units of the polymer.

The hydrophobic resin (HR) may further have any of the repeating units of the following general formula (III).

In general formula (III),
R represents a hydrogen atom, an alkyl group, an alkyl group substituted with a fluorine atom, a cyano group or —$CH_2$—O-$Rac_2$ group, wherein $Rac_2$ represents a hydrogen atom, an alkyl group or an acyl group.

$R_4$ represents a group having any of an alkyl group, a cycloalkyl group, an aryl group, an alkenyl group and a cycloalkenyl group.

$L_6$ represents a single bond or a bivalent connecting group.

In general formula (III), R is preferably a hydrogen atom, a methyl group, a hydroxymethyl group or a trifluoromethyl group, especially preferably a hydrogen atom or a methyl group.

The alkyl group represented by $R_4$ is preferably a linear or branched alkyl group having 3 to 20 carbon atoms. The cycloalkyl group is preferably a cycloalkyl group having 3 to 20 carbon atoms. The aryl group is preferably a phenyl group having no substituent or a phenyl group substituted with an alkyl group (preferably having 1 to 6 carbon atoms). The alkenyl group is preferably an alkenyl group having 3 to 20 carbon atoms. The cycloalkenyl group is preferably a cycloalkenyl group having 3 to 20 carbon atoms.

The bivalent connecting group represented by $L_6$ is preferably an alkylene group (preferably having 1 to 5 carbon atoms), an arylene group (preferably a phenylene group), an ester bond or an oxy group.

When the hydrophobic resin (HR) has a fluorine atom, the content ratio of fluorine atom(s) is preferably in the range of 5 to 80 mass %, more preferably 10 to 80 mass %, based on the molecular weight of the hydrophobic resin (HR). The repeating unit containing a fluorine atom preferably exists in the hydrophobic resin (HR) in an amount of 10 to 100 mol %, more preferably 30 to 100 mol %.

When the hydrophobic resin (HR) has a silicon atom, the content ratio of silicon atom(s) is preferably in the range of 2 to 50 mass %, more preferably 2 to 30 mass %, based on the molecular weight of the hydrophobic resin (HR). The repeating unit containing a silicon atom preferably exists in the hydrophobic resin (HR) in an amount of 10 to 100 mol %, more preferably 20 to 100 mol %.

The weight average molecular weight of the hydrophobic resin (HR) in terms of standard polystyrene molecular weight is preferably in the range of 1000 to 100,000, more preferably 1000 to 50,000 and still more preferably 2000 to 15,000.

The content ratio of the hydrophobic resin (HR) can be appropriately regulated so that the receding contact angle of the film falls within the above range. However, the content ratio is preferably in the range of 0.01 to 10 mass %, more preferably 0.1 to 5 mass % based on the total solids of the actinic-ray- or radiation-sensitive resin composition.

Impurities, such as metals, should naturally be of low quantity in the hydrophobic resin (HR), as for the resin as the component (A). The content ratio of residual monomers and oligomer components is preferably 0 to 10 mass %, more preferably 0 to 5 mass % and still more preferably 0 to 1 mass %. Accordingly, there can be obtained an actinic-ray- or radiation-sensitive resin composition being free from a change of in-liquid foreign matter, sensitivity, etc. over time. From the viewpoint of resolving power, resist profile, side wall of resist pattern, roughness, etc., the molecular weight distribution (Mw/Mn, also referred to as the degree of dispersal) thereof is preferably in the range of 1 to 5, more preferably 1 to 3 and still more preferably 1 to 2.

A variety of commercially available products can be used as the hydrophobic resin (HR), and also the hydrophobic resin can be synthesized (for example, radical polymerization) and purified in accordance with customary methods. As for detailed synthesis/purification methods, reference can be made to the methods described above with respect to the main resins of the resist, the description of Chapter 2 "Polymer Synthesis" of "5-th Edition Experimental Chemistry Course 26 Polymer Chemistry" issued by Maruzen Co., Ltd., etc.

Specific examples of the hydrophobic resins (HR) will be shown below. The following Table 1 shows the molar ratio of individual repeating units (corresponding to individual repeating units in order from the left), weight average molecular weight and degree of dispersal with respect to each of the resins.

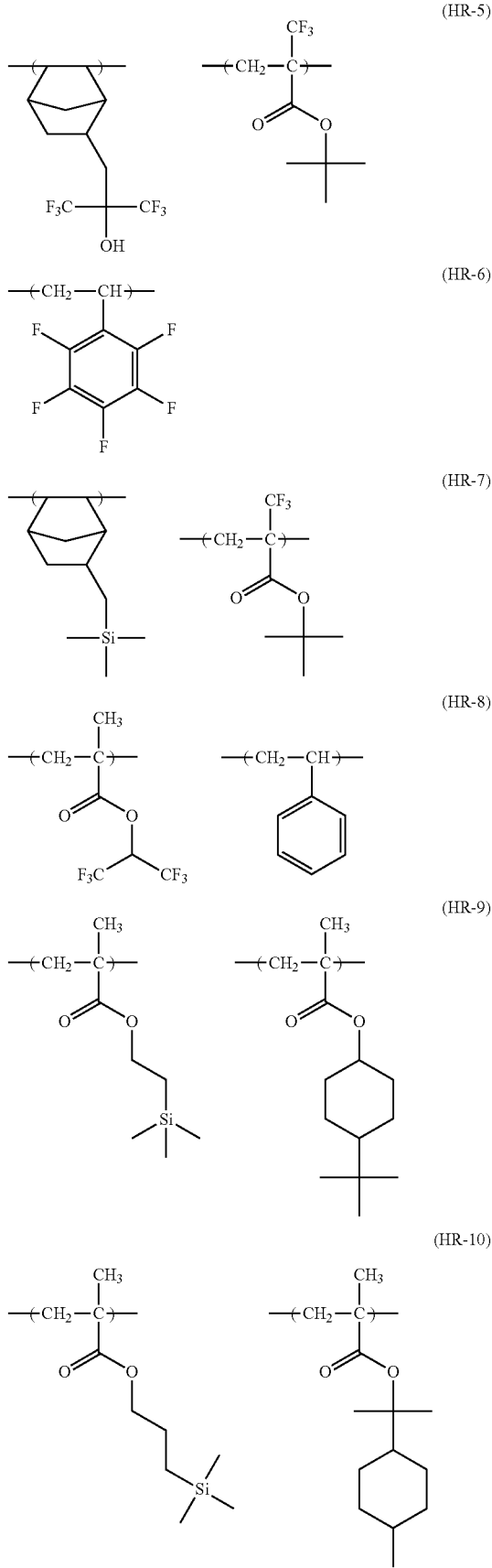

-continued
(HR-11)
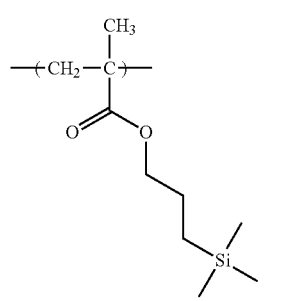
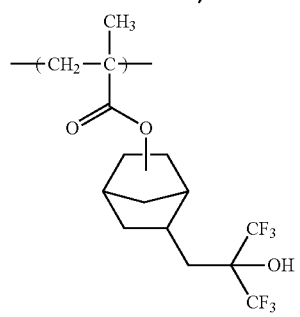
(HR-12)
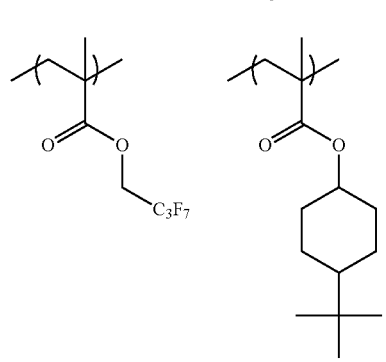
(HR-13)
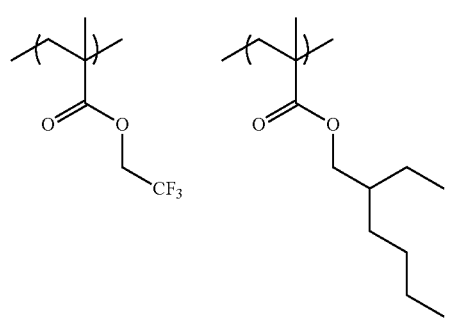
(HR-14)
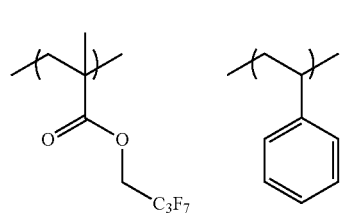
(HR-15)
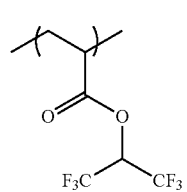
-continued
(HR-16)
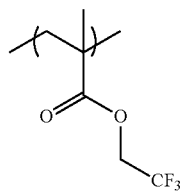
(HR-17)
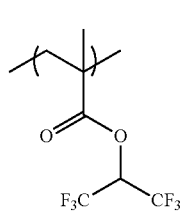
(HR-18)
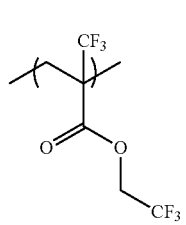 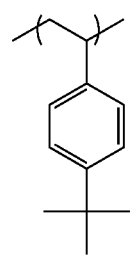
(HR-19)
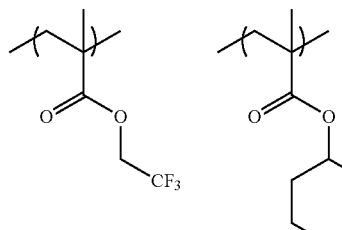
(HR-20)
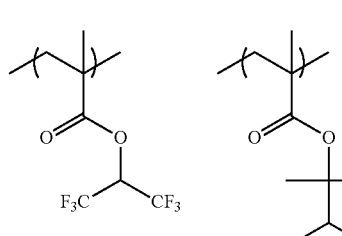
(HR-21)
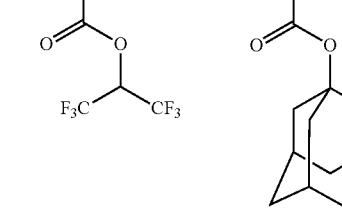

(HR-22)
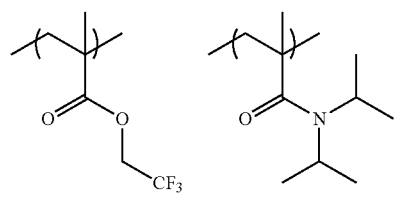
(HR-23)
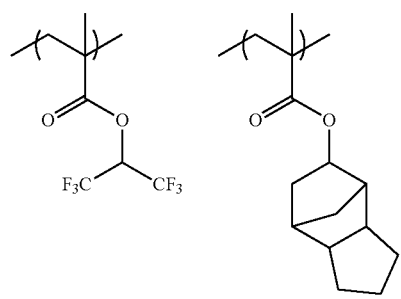
(HR-24)
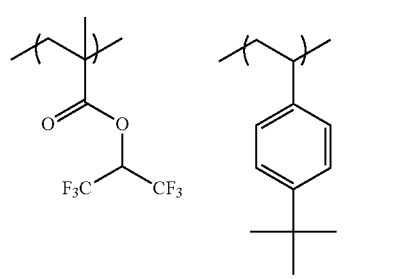
(HR-25)
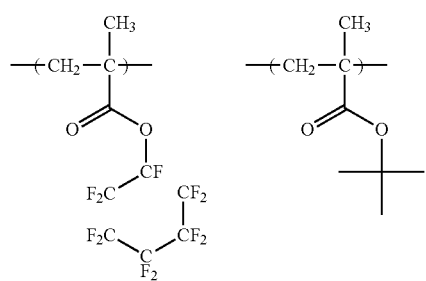
(HR-26)
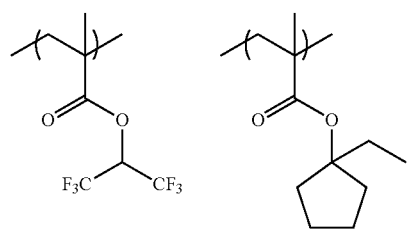
(HR-27)
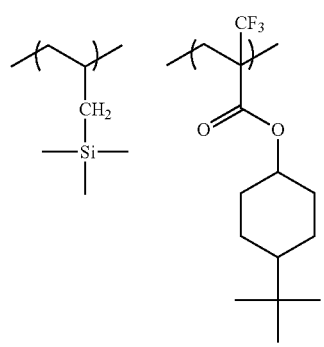
(HR-28)
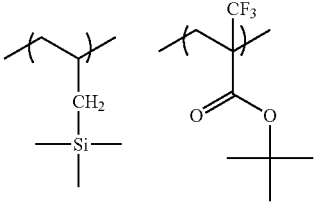
(HR-29)
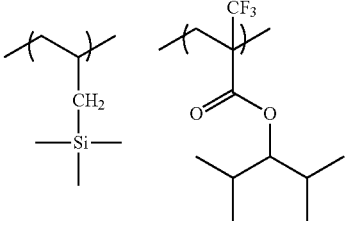
(HR-30)
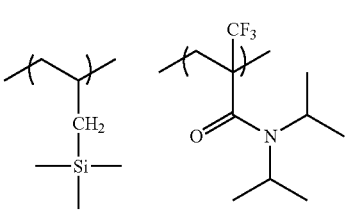
(HR-31)
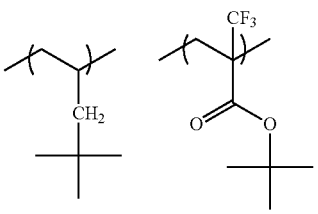
(HR-32)
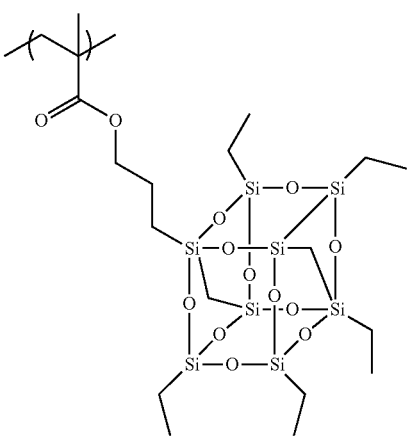
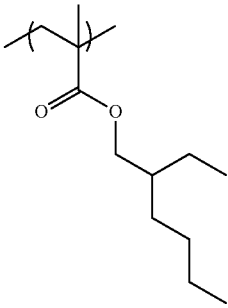

(HR-33)
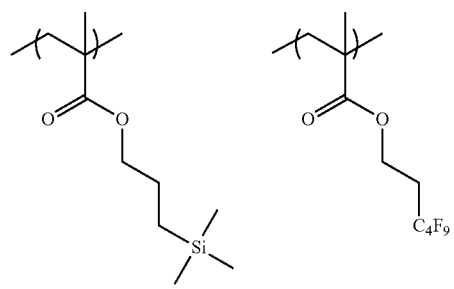
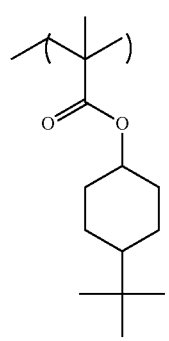
(HR-34)
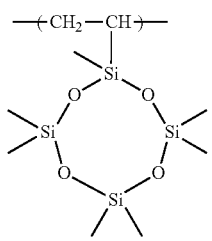 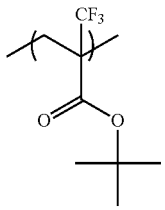
(HR-35)
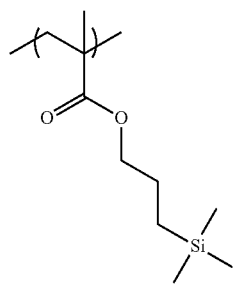
(HR-36)
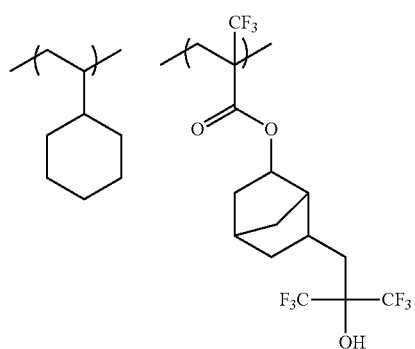
(HR-37)
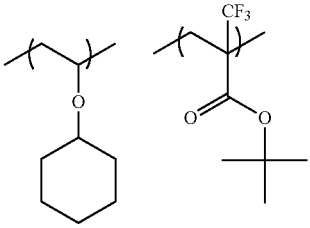
(HR-38)
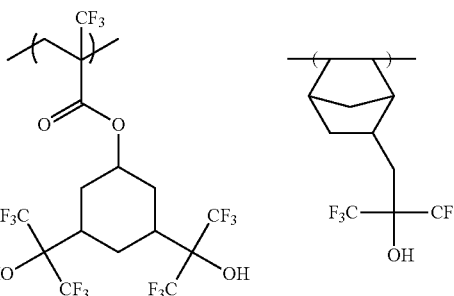
(HR-39)
(HR-40)
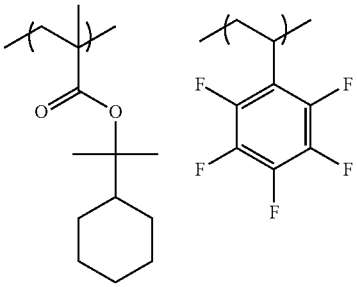
(HR-41)
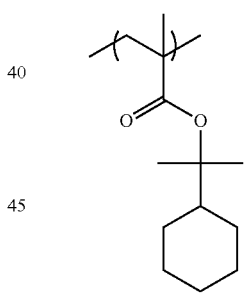 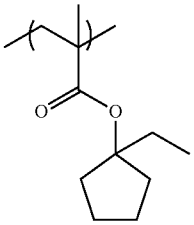
(HR-42)
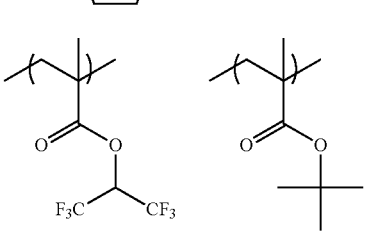

(HR-43)
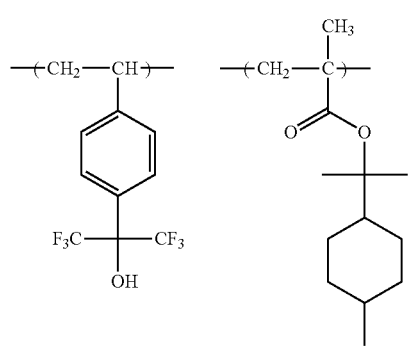
(HR-44)
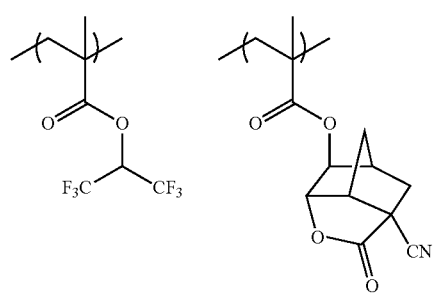
(HR-45)
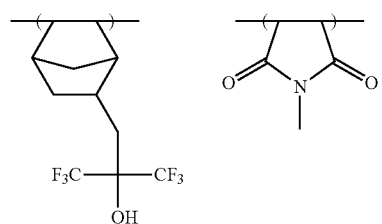
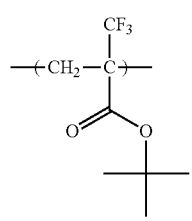
(HR-46)
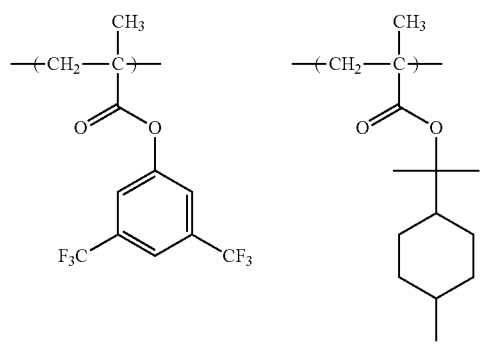
(HR-47)
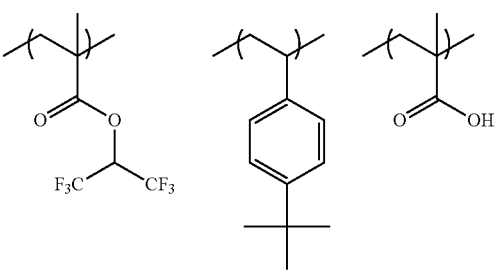
(HR-48)
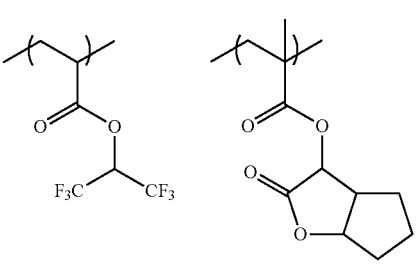
(HR-49)
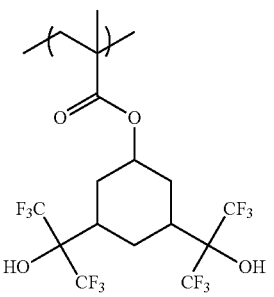
(HR-50)
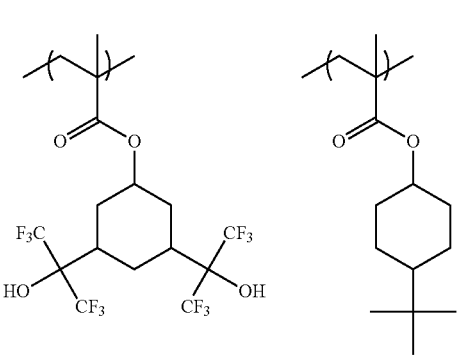
(HR-51)
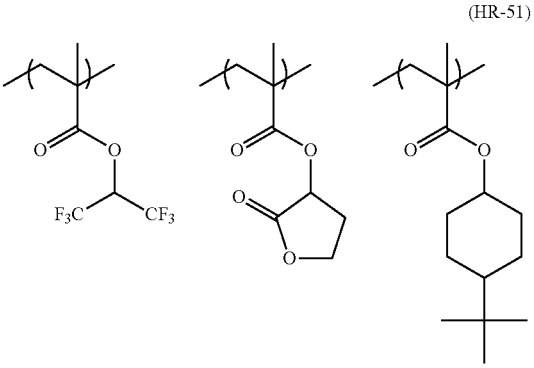

(HR-52)
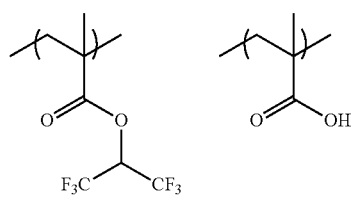
(HR-53)
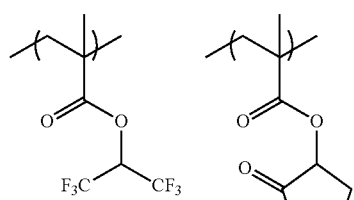
(HR-54)
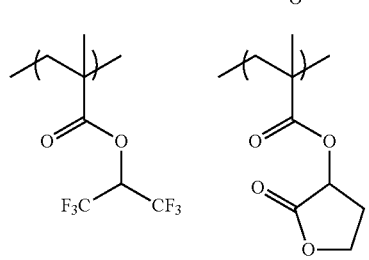
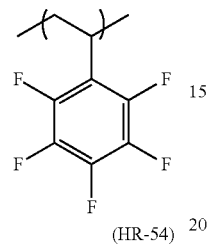
(HR-55)
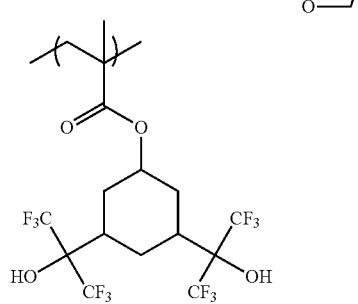
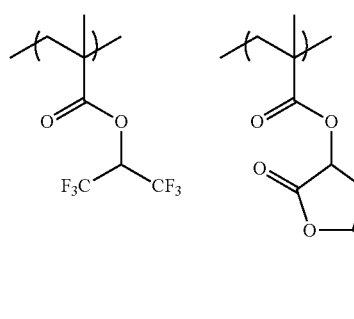
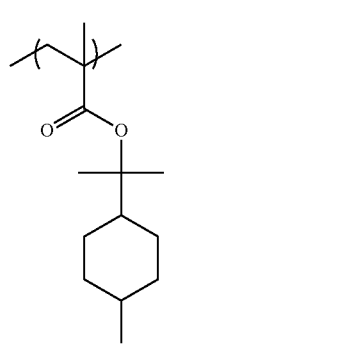
(HR-56)
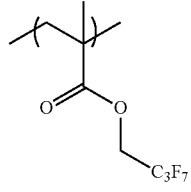
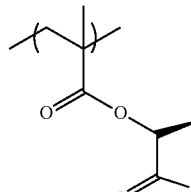
(HR-57)
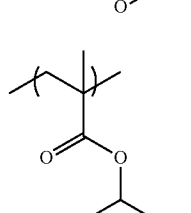
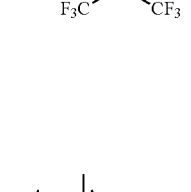
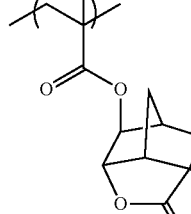
(HR-58)
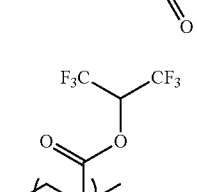
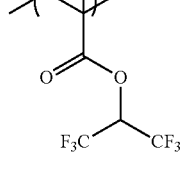
(HR-59)
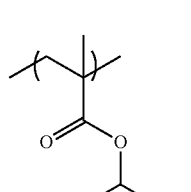
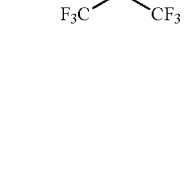

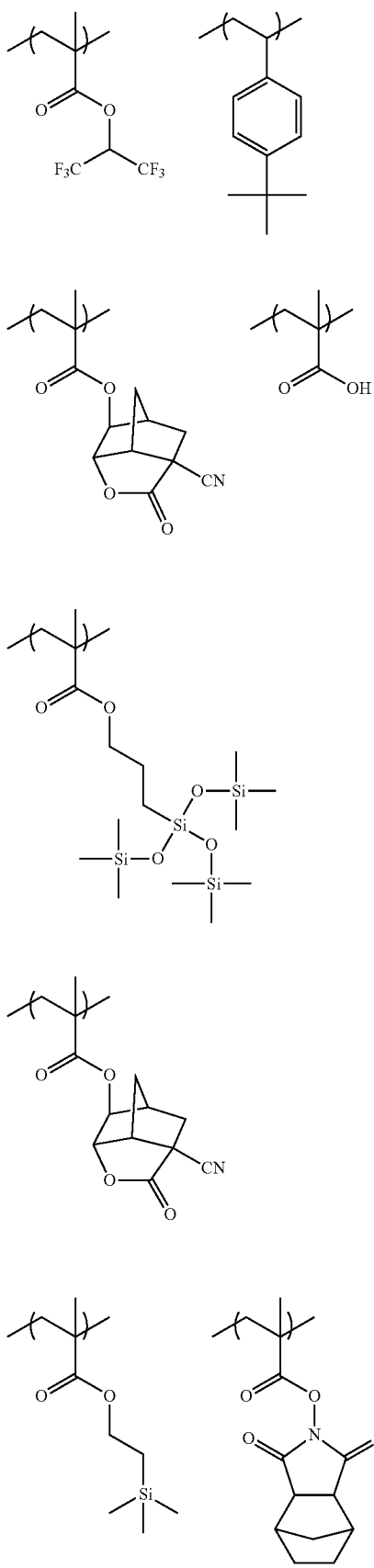
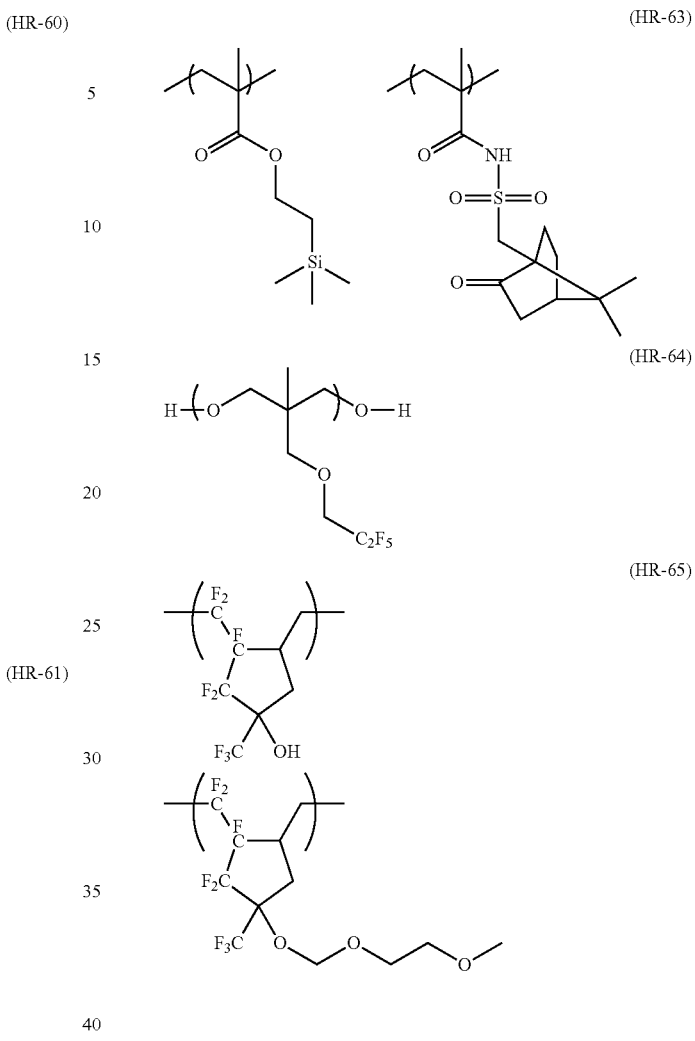
TABLE 1
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |

TABLE 1-continued

| Resin | Composition | Mw | Mw/Mn |
|---|---|---|---|
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

For the liquid immersion exposure, apart from the above method of adding a polymer to the composition, the method of providing a film that is highly insoluble in the liquid for liquid immersion (hereinafter also referred to as a "top coat") can be employed.

The expected performance of the top coat, the method of using the same, etc. are described in Chapter 7 of "Process and Material of Liquid Immersion Lithography" published by CMC Publishing Co., Ltd.

From the viewpoint of 193 nm transparency, the top coat preferably consists of a polymer not abundantly containing an aromatic moiety. As such, there can be mentioned, for example, a hydrocarbon polymer, an acrylic ester polymer, polymethacrylic acid, polyacrylic acid, polyvinyl ether, a siliconized polymer, a fluoropolymer or the like. The above-mentioned hydrophobic resins (HR) can be appropriately used as the top coat, and commercially available top coat materials can also be appropriately used.

(E) Basic Compound

The actinic-ray- or radiation-sensitive resin composition of the present invention preferably contains a basic compound.

The basic compound is preferably a nitrogenous organic basic compound. Such useful basic compounds are not particularly limited. However, for example, the compounds of categories (1) to (4) below are preferably used.

(1) Compounds of General Formula (BS-1) Below

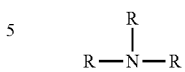

(BS-1)

In the general formula (BS-1),
each of Rs independently represents any of a hydrogen atom, an alkyl group (linear or branched), a cycloalkyl group (monocyclic or polycyclic), an aryl group and an aralkyl group, provided that in no event all three Rs are hydrogen atoms.

The number of carbon atoms of the alkyl group represented by R is not particularly limited. However, it is generally in the range of 1 to 20, preferably 1 to 12.

The number of carbon atoms of the cycloalkyl group represented by R is not particularly limited. However, it is generally in the range of 3 to 20, preferably 5 to 15.

The number of carbon atoms of the aryl group represented by R is not particularly limited. However, it is generally in the range of 6 to 20, preferably 6 to 10. In particular, a phenyl group, a naphthyl group and the like can be mentioned.

The number of carbon atoms of the aralkyl group represented by R is not particularly limited. However, it is generally in the range of 7 to 20, preferably 7 to 11. In particular, a benzyl group and the like can be mentioned.

In the alkyl group, cycloalkyl group, aryl group and aralkyl group represented by R, a hydrogen atom thereof may be replaced by a substituent. As the substituent, there can be mentioned, for example, an alkyl group, a cycloalkyl group, an aryl group, an aralkyl group, a hydroxyl group, a carboxyl group, an alkoxy group, an aryloxy group, an alkylcarbonyloxy group, an alkyloxycarbonyl group or the like.

In the compounds of the general formula (BS-1), preferably, only one of the three Rs is a hydrogen atom, and also preferably, none of the Rs is a hydrogen atom.

Specific examples of the compounds of the general formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, 2,4,6-tri(t-butyl) aniline and the like.

In the general formula (BS-1), any of the compounds in which at least one of the Rs is a hydroxylated alkyl group can be mentioned as a preferred form of the compounds. Specific examples of the compounds include triethanolamine, N,N-dihydroxyethylaniline and the like.

With respect to the alkyl group represented by R, an oxygen atom may be present in the alkyl chain to thereby form an oxyalkylene chain. The oxyalkylene chain preferably consists of —CH$_2$CH$_2$O—. As particular examples thereof, there can be mentioned tris(methoxyethoxyethyl)amine, compounds shown by way of example in column 3 line 60 et seq. of U.S. Pat. No. 6,040,112 and the like.

(2) Compound with Nitrogenous Heterocyclic Structure

The heterocyclic structure may optionally have aromaticity. It may have a plurality of nitrogen atoms, and also may have a heteroatom other than nitrogen. For example, there can be mentioned compounds with an imidazole structure (2-phenylbenzoimidazole, 2,4,5-triphenylimidazole and the like), compounds with a piperidine structure (N-hydroxyethylpiperidine, bis(1,2,2,6,6-pentamethyl-4-piperidyl) sebacate and the like), compounds with a pyridine structure (4-dimethylaminopyridine and the like) and compounds with an antipyrine structure (antipyrine, hydroxyantipyrine and the like).

Further, compounds with two or more ring structures can be appropriately used. For example, there can be mentioned 1,5-diazabicyclo[4.3.0]non-5-ene, 1,8-diazabicyclo[5.4.0]undec-7-ene and the like.

(3) Amine Compound with Phenoxy Group

The amine compounds with a phenoxy group are those having a phenoxy group at the end of the alkyl group of each of the amine compound opposite to the nitrogen atom. The phenoxy group may have a substituent, such as an alkyl group, an alkoxy group, a halogen atom, a cyano group, a nitro group, a carboxyl group, a carboxylic ester group, a sulfonic ester group, an aryl group, an aralkyl group, an acyloxy group, an aryloxy group or the like.

Compounds having at least one oxyalkylene chain between the phenoxy group and the nitrogen atom are preferred. The number of oxyalkylene chains in each molecule is preferably in the range of 3 to 9, more preferably 4 to 6. Among the oxyalkylene chains, —$CH_2CH_2O$— is preferred.

Particular examples thereof include 2-[2-{2-(2,2-dimethoxy-phenoxyethoxy)ethyl}-bis-(2-methoxyethyl)]-amine, compounds (C1-1) to (C3-3) shown by way of example in section [0066] of US 2007/0224539 A1 and the like.

(4) Ammonium Salt Derived from any of the Compounds (1) to (3) Above

Ammonium salts can also be appropriately used. Hydroxides and carboxylates are preferred. Preferred particular examples thereof are tetraalkylammonium hydroxides, a typical example of which is tetrabutylammonium hydroxide.

As other compounds usable in the composition of the present invention, there can be mentioned compounds synthesized in Examples of JP-A-2002-363146, compounds described in section [0108] of JP-A-2007-298569 and the like.

With respect to the ratio between the acid generator and basic compound used in the composition, the ratio of acid generator to basic compound (molar ratio) is preferably in the range of 2.5 to 300. A molar ratio of 2.5 or higher is preferred from the viewpoint of sensitivity and resolving power. A molar ratio of 300 or below is preferred from the viewpoint of suppressing any resolving power drop due to pattern thickening over time until the baking treatment after exposure. The ratio of acid generator to basic compound (molar ratio) is more preferably in the range of 5.0 to 200, further more preferably 7.0 to 150.

(F) Surfactant

Preferably, the composition of the present invention further contains a surfactant. The surfactant is preferably a fluorinated and/or siliconized surfactant.

As such a surfactant, there can be mentioned Megafac F176 or Megafac R08 produced by Dainippon Ink & Chemicals, Inc., PF656 or PF6320 produced by OMNOVA SOLUTIONS, INC., Troy Sol S-366 produced by Troy Chemical Co., Ltd., Florad FC430 produced by Sumitomo 3M Ltd., polysiloxane polymer KP-341 produced by Shin-Etsu Chemical Co., Ltd., or the like.

Surfactants other than these fluorinated and/or siliconized surfactants can also be used. In particular, the other surfactants include polyoxyethylene alkyl ethers, polyoxyethylene alkyl aryl ethers and the like.

Moreover, generally known surfactants can also be appropriately used. As useful surfactants, there can be mentioned, for example, those described in section [0273] et seq of US 2008/0248425 A1

These surfactants may be used alone or in combination.

The amount of surfactant added is preferably in the range of 0.0001 to 2 mass %, more preferably 0.001 to 1 mass %, based on the total solids of the composition.

(G) Other Additives

The actinic-ray- or radiation-sensitive resin composition of the present invention may further according to necessity contain a carboxylic acid onium salt, a dye, a plasticizer, a photosensitizer, a light absorber, an alkali-soluble resin, a dissolution inhibitor, a compound capable of increasing the solubility in a developer (for example, a phenolic compound of 1000 or less molecular weight or a carboxylated alicyclic or aliphatic compound), an antioxidant, etc.

The solid content of the actinic-ray- or radiation-sensitive resin composition of the present invention is generally in the range of 1.0 to 10 mass %, preferably 2.0 to 5.7 mass % and further preferably 2.0 to 5.3 mass %. When the solid content falls within the above range, any solution of the actinic-ray- or radiation-sensitive resin composition can be uniformly applied onto a substrate, and a pattern excelling in line edge roughness can be formed. The reason therefor has not yet been elucidated but is presumed to be that when the solid content is 10 mass % or less, preferably 5.7 mass % or less, the aggregation of materials contained in the solution of the actinic-ray- or radiation-sensitive resin composition, especially the photoacid generator, would be suppressed and as a result a uniform film could be formed.

The solid content is the percentage of the mass of the components of the actinic-ray- or radiation-sensitive resin composition, excluding the solvent, to the total mass of the actinic-ray- or radiation-sensitive resin composition.

In the patterning method of the present invention, the step of forming a film of the actinic-ray- or radiation-sensitive resin composition of the present invention on a substrate, the step of exposing the film, the step of baking the exposed film and the step of performing a positive development of the baked film can be carried out by generally known methods.

The wavelength of light source for use in an exposure unit according to the present invention is not particularly limited. For example, any of KrF excimer laser wavelength (248 nm), ArF excimer laser wavelength (193 nm) and $F_2$ excimer laser wavelength (157 nm) can be applied.

Moreover, in the exposure step according to the present invention, the liquid immersion exposure method can be applied as aforementioned.

The substrate for film formation according to the present invention is not particularly limited. Use can be made of any of an inorganic substrate of silicon, SiN, $SiO_2$, TiN or the like, a coated inorganic substrate such as SOG and substrates commonly employed in a semiconductor production process for an IC or the like, a circuit board production process for a liquid crystal, a thermal head or the like and other photoapplication lithography processes. Further, according to necessity, an organic antireflection film may be provided between the above film and the substrate. In the present invention, even when the substrate is a basic one of SiN, TiN or the like, no serious problem such as abnormal pattern configuration would occur and favorable patterning can be realized.

In the positive development, it is preferred to use an alkali developer.

As the alkali developer for use in the positive development, use can be made of, for example, any of alkaline aqueous solutions of an inorganic alkali such as sodium hydroxide, potassium hydroxide, sodium carbonate, sodium silicate, sodium metasilicate or aqueous ammonia, a primary amine such as ethylamine or n-propylamine, a secondary amine such as diethylamine or di-n-butylamine, a tertiary amine such as triethylamine or methyldiethylamine, an alcoholamine such as dimethylethanolamine or triethanolamine, a quaternary ammonium salt such as tetramethylammonium hydroxide or tetraethylammonium hydroxide, a cycloamine such as pyrrole or piperidine, and the like.

Before the use of the above alkaline aqueous solutions, appropriate amounts of an alcohol and a surfactant may be added thereto.

The alkali concentration of the alkali developer is generally in the range of 0.1 to 20 mass %.

The pH value of the alkali developer is generally in the range of 10.0 to 15.0.

A 2.38% aqueous tetramethylammonium hydroxide solution is particularly preferred.

Pure water is used as the rinse liquid for use in the rinse treatment after the positive development. Before the use thereof, an appropriate amount of surfactant may be added thereto.

In the negative development, it is preferred to use an organic developer containing an organic solvent.

As the organic developers for use in the negative development, there can be mentioned a polar solvent, such as a ketone solvent, an ester solvent, an alcohol solvent, an amide solvent or an ether solvent, and a hydrocarbon solvent.

As the ketone solvent, there can be mentioned, for example, 1-octanone, 2-octanone, 1-nonanone, 2-nonanone, acetone, 2-heptanone, 3-heptanone, 4-heptanone, 1-hexanone, 2-hexanone, 3-hexanone, diisobutyl ketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone, propylene carbonate or the like.

As the ester solvent, there can be mentioned, for example, methyl acetate, butyl acetate, ethyl acetate, isopropyl acetate, amyl acetate, propylene glycol monomethyl ether acetate, ethylene glycol monoethyl ether acetate, diethylene glycol monobutyl ether acetate, diethylene glycol monoethyl ether acetate, 3-methoxybutyl acetate, 3-methyl-3-methoxybutyl acetate, ethyl-3-ethoxypropionate, methyl formate, ethyl formate, butyl formate, propyl formate, ethyl lactate, butyl lactate, propyl lactate or the like.

As the alcohol solvent, there can be mentioned, for example, an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol or n-decanol; a glycol solvent such as ethylene glycol, diethylene glycol or triethylene glycol; a glycol ether solvent such as ethylene glycol monomethyl ether, propylene glycol monomethyl ether, ethylene glycol monoethyl ether, propylene glycol monoethyl ether, diethylene glycol monomethyl ether, triethylene glycol monoethyl ether or methoxymethylbutanol; or the like.

As the ether solvent, there can be mentioned, for example, not only any of the above-mentioned glycol ether solvents but also dioxane, tetrahydrofuran, anisole or the like.

As the amide solvent, there can be mentioned, for example, N-methyl-2-pyrrolidone, N,N-dimethylacetamide, N,N-dimethylformamide, hexamethylphosphoric triamide, 1,3-dimethyl-2-imidazolidinone or the like.

As the hydrocarbon solvent, there can be mentioned, for example, an aromatic hydrocarbon solvent, such as toluene or xylene, or an aliphatic hydrocarbon solvent, such as pentane, hexane, octane or decane.

These solvents may be mixed together before use, and may be used in a mixture with a solvent other than those mentioned above or water.

It is especially preferred for the negative developer to be a developer containing at least one solvent selected from among a ketone solvent, an ester solvent, an alcohol solvent, an amide solvent and an ether solvent.

Among ester solvents, an alkyl acetate is most preferably used.

The vapor pressure of the negative developer at 20° C. is preferably 5 kPa or below, more preferably 3 kPa or below and most preferably 2 kPa or below. When the vapor pressure of the negative developer is 5 kPa or below, the evaporation of the developer on the substrate or in a development cup can be suppressed so that the temperature uniformity within the plane of the wafer can be enhanced to thereby improve the dimensional uniformity within the plane of the wafer.

As particular examples of the solvents exhibiting a vapor pressure of 5 kPa or below, there can be mentioned a ketone solvent, such as 1-octanone, 2-octanone, 1-nonanone, 2-nonanone, 2-heptanone, 3-heptanone, 4-heptanone, 2-hexanone, 3-hexanone, diisobutyl ketone, cyclohexanone, methylcyclohexanone, phenylacetone or methyl isobutyl ketone; an ester solvent, such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate, 3-methoxybutyl acetate, 3-methyl-3-methoxybutyl acetate, butyl formate, propyl formate, ethyl lactate, butyl lactate or propyl lactate; an alcohol solvent, such as n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol or n-decanol; a glycol solvent, such as ethylene glycol, diethylene glycol or triethylene glycol; a glycol ether solvent, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether or methoxymethylbutanol; an ether solvent, such as tetrahydrofuran or anisole; an amide solvent, such as N-methyl-2-pyrrolidone, N,N-dimethylacetamide or N,N-dimethylformamide; an aromatic hydrocarbon solvent, such as toluene or xylene, and an aliphatic hydrocarbon solvent, such as octane or decane.

As particular examples of the developers exhibiting a vapor pressure of 2 kPa or below falling within the most preferred range, there can be mentioned a ketone solvent, such as 1-octanone, 2-octanone, 1-nonanone, 2-nonanone, 2-heptanone, 3-heptanone, 4-heptanone, 2-hexanone, 3-hexanone, diisobutyl ketone, cyclohexanone, methylcyclohexanone or phenylacetone; an ester solvent, such as butyl acetate, amyl acetate, propylene glycol monomethyl ether acetate, ethylene glycol monoethyl ether acetate, diethylene glycol monobutyl ether acetate, diethylene glycol monoethyl ether acetate, ethyl 3-ethoxypropionate, 3-methoxybutyl acetate, 3-methyl-3-methoxybutyl acetate, ethyl lactate, butyl lactate or propyl lactate; an alcohol solvent, such as n-butyl alcohol, sec-butyl alcohol, tert-butyl alcohol, isobutyl alcohol, n-hexyl alcohol, n-heptyl alcohol, n-octyl alcohol or n-decanol; a glycol solvent, such as ethylene glycol, diethylene glycol or triethylene glycol; a glycol ether solvent, such as ethylene glycol monomethyl ether, propylene glycol monomethyl ether, ethylene glycol monoethyl ether, propylene glycol monoethyl ether, diethylene glycol monomethyl ether, triethylene glycol monoethyl ether or methoxymethylbutanol; an ether solvent, such as anisole; an amide solvent, such as N-methyl-2-pyrrolidone, N,N-dimethylacetamide or N,N-dimethylformamide; an aromatic hydrocarbon solvent, such as xylene, and an aliphatic hydrocarbon solvent, such as octane or decane.

According to necessity, an appropriate amount of surfactant can be added to the developer for use in the negative development.

The surfactant is not particularly limited. For example, use can be made of any of ionic and nonionic fluorinated and/or siliconized surfactants and the like. As such fluorinated and/or siliconized surfactants, there can be mentioned, for example, those described in JP-As 62-36663, 61-226746, 61-226745, 62-170950, 63-34540, 7-230165, 8-62834, 9-54432 and 9-5988 and U.S. Pat. Nos. 5,405,720, 5,360,692, 5,529,881, 5,296,330, 5,436,098, 5,576,143, 5,294,511 and 5,824,451. Nonionic surfactants are preferred. The nonionic surfactants are not particularly limited. However, using a nonionic fluorinated surfactant or siliconized surfactant is further preferred.

The surfactants are used in an amount of generally 0.001 to 5 mass %, preferably 0.005 to 2 mass % and further preferably 0.01 to 0.5 mass % based on the total mass of the developer.

As the development method, use can be made of, for example, a method in which the substrate is dipped in a tank filled with a developer for a given period of time (dip method), a method in which a developer is mounded on the surface of the substrate by its surface tension and allowed to stand still for a given period of time to thereby effect development (puddle method), a method in which a developer is sprayed onto the surface of the substrate (spray method), a method in which a developer is continuously applied onto the substrate rotating at a given speed while scanning a developer application nozzle at a given speed (dynamic dispense method), or the like.

The step of negative development may be followed by the step of discontinuing the development by solvent replacement.

Preferably, the step of rinsing with a rinse liquid for negative development containing an organic solvent is included in the operation after the negative development.

The rinse liquid for use in the rinse step after negative development is not particularly limited as long as it does not dissolve the pattern, and common solutions containing an organic solvent can be used. The preferably used rinse liquid is one containing at least one organic solvent selected from among a hydrocarbon solvent, a ketone solvent, an ester solvent, an alcohol solvent, an amide solvent and an ether solvent. More preferably, the negative development is followed by the step of rinsing with the use of a rinse liquid containing at least one organic solvent selected from among a ketone solvent, an ester solvent, an alcohol solvent and an amide solvent. Further more preferably, the negative development is followed by the step of rinsing with the use of a rinse liquid containing an alcohol solvent or an ester solvent. Most preferably, the negative development is followed by the step of rinsing with the use of a rinse liquid containing a monohydric alcohol. The monohydric alcohol for use in the rinse step after negative development can be any of linear, branched and cyclic monohydric alcohols. Particular examples thereof include 1-butanol, 2-butanol, 3-methyl-1-butanol, tert-butyl alcohol, 1-pentanol, 2-pentanol, 1-hexanol, 1-heptanol, 1-octanol, 2-hexanol, 2-heptanol, 2-octanol, 3-hexanol, 3-heptanol, 3-octanol, 4-octanol and the like. Preferred use is made of 1-hexanol, 2-hexanol, 1-pentanol, 3-methyl-1-butanol and 4-methyl-2-pentanol. Secondary or tertiary alcohols containing an alkyl group with a branched and/or cyclic structure having 5 or more (more preferably 5 to 10) carbon atoms are especially preferred.

These components may be mixed together, and also may be mixed with other organic solvents before use.

The water content of the rinse liquid is preferably 10 mass % or below, more preferably 5 mass % or below and most preferably 3 mass % or below. A favorable development performance can be obtained by controlling the water content to be 10 mass % or below.

The vapor pressure of the rinse liquid for use after negative development at 20° C. is preferably in the range of 0.05 to 5 kPa, more preferably 0.1 to 5 kPa and most preferably 0.12 to 3 kPa. When the vapor pressure of the rinse liquid is in the range of 0.05 to 5 kPa, not only can the temperature uniformity within the plane of the wafer be enhanced but also the swell attributed to the penetration of the rinse liquid can be suppressed to thereby improve the dimensional uniformity within the plane of the wafer.

An appropriate amount of surfactant can be added to the rinse liquid before the use thereof.

In the rinse step, the wafer having undergone negative development is rinsed using the rinse liquid containing an organic solvent. The method of rinse treatment is not particularly limited. For example, use can be made of any of a method in which the rinse liquid is continuously applied onto the substrate rotating at a given speed (spin application method), a method in which the substrate is dipped in a tank filled with the rinse liquid for a given period of time (dip method), a method in which the rinse liquid is sprayed onto the surface of the substrate (spray method) and the like. Preferably, the rinse treatment is carried out according to the spin application method, and after the rinse operation, the substrate is rotated at a rotating speed of 2000 to 4000 rpm to thereby remove the rinse liquid from the top of the substrate. Also preferably, the rinse is followed by the step of baking (postbake). This bake step is preferably carried out at 80° to 120° C. for a period of 15 to 120 seconds.

EXAMPLE

Now, the present invention will be described with reference to Examples, which however in no way limit the scope of the present invention.

Synthetic Example 1

Synthesis of Resin (P-1)

In a nitrogen stream, 40 g of a solvent consisting of a 6/4 (mass ratio) mixture of propylene glycol monomethyl ether acetate and propylene glycol monomethyl ether was placed in a three-necked flask and heated at 80° C. (solvent 1). The monomers corresponding to the following repeating units mixed in a molar ratio of 20/20/10/20/30 were dissolved in a solvent consisting of a 6/4 (mass ratio) mixture of propylene glycol monomethyl ether acetate and propylene glycol monomethyl ether, thereby obtaining a 22 mass % monomer solution (400 g). Polymerization initiator V-601 (produced by Wako Pure Chemical Industries, Ltd.) was added thereto in an amount of 8 mol % based on the monomers and dissolved.

The thus obtained solution was dropped into the solution 1 over a period of 6 hours. After the completion of the dropping, reaction was continued at 80° C. for 2 hours. The reaction liquid was allowed to stand still to cool and was dropped into a mixture consisting of 3600 ml of hexane and 400 ml of ethyl acetate. The thus precipitated powder was collected by filtration and dried, thereby obtaining 74 g of a desired resin (P-1). The weight average molecular weight of the obtained resin (P-1) was 10,000 and the dispersity (Mw/Mn) thereof was 1.4.

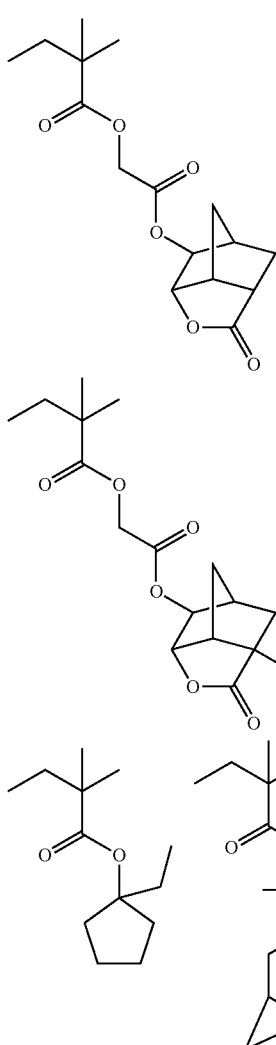

(P-1)

Resins (P-2) to (P-4) and hydrophobic resins (1b) to (4b) were synthesized in the same manner as in Synthetic Example 1 except that monomers corresponding to specified repeating units were used in a given component ratio (molar ratio). The hydrophobic resins (1b) to (4b) correspond to the aforementioned resins (D).

The structures of the resins (P-2) to (P-4) and hydrophobic resins (1b) to (4b) are shown below. The component ratio (molar ratio), weight average molecular weight and dispersity of each of the resin (P-1), resins (P-2) to (P-4) and hydrophobic resins (1b) to (4b) are given in Table 2 below.

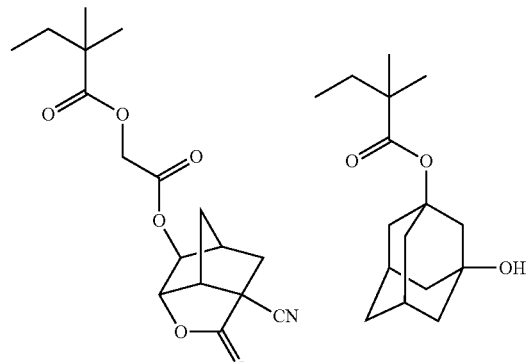

(P-2)

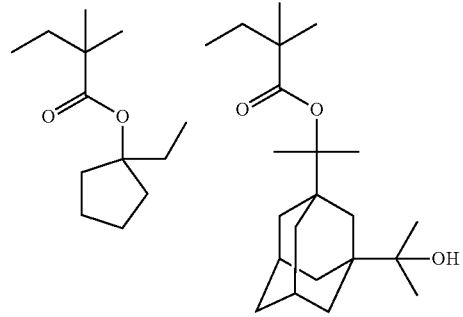

(P-3)

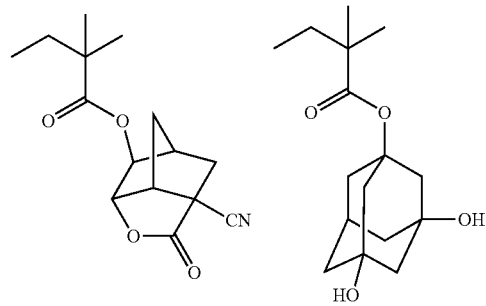

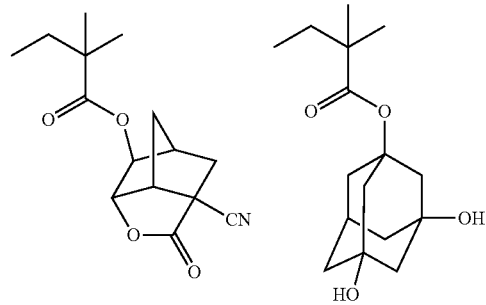

(P-4)

-continued

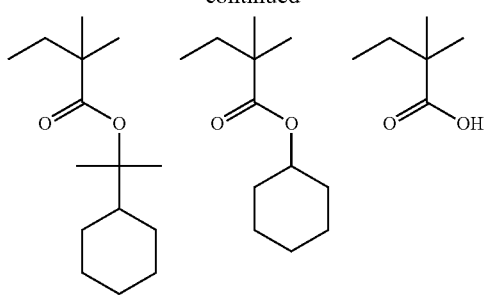

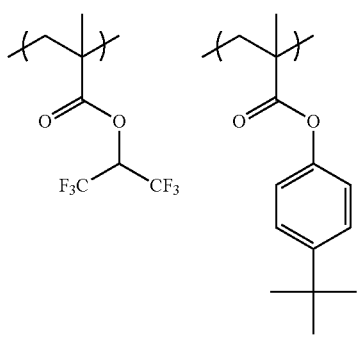

(1b)

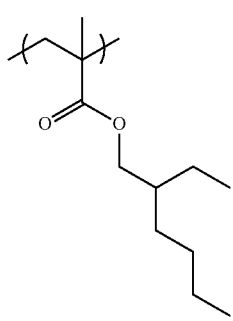

(2b)

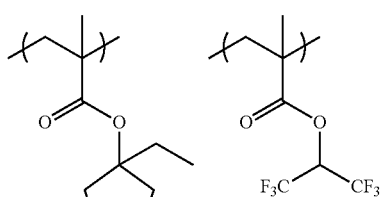

(3b)

-continued

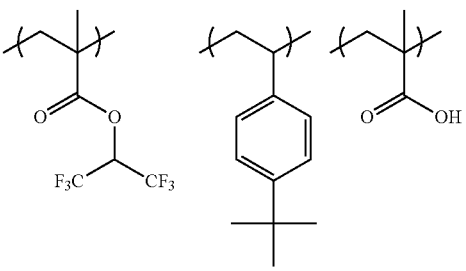

(4b)

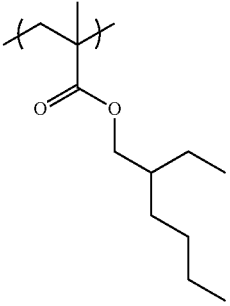

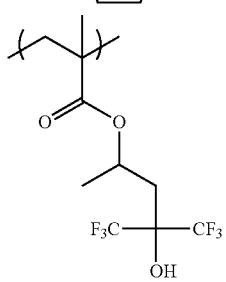

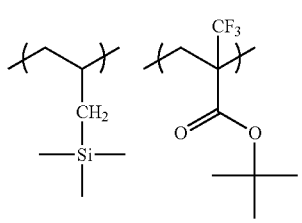

TABLE 2

| Resin | Composition (molar ratio) | Mw | Mw/Mn |
|---|---|---|---|
| (P-1) | 20/20/10/20/30 | 10000 | 1.4 |
| (P-2) | 40/15/30/15 | 8000 | 1.3 |
| (P-3) | 40/10/40/10 | 6000 | 1.5 |
| (P-4) | 35/10/40/10/5 | 15000 | 1.5 |
| (1b) | 40/50/10 | 5000 | 1.3 |
| (2b) | 40/50/10 | 5000 | 1.4 |
| (3b) | 50/50 | 6000 | 1.6 |
| (4b) | 39/57/2/2 | 4000 | 1.3 |

Synthetic Example 2

Synthesis of Triphenylsulfonium Acetate

In a flask, 5.07 g (13 mmol) of triphenylsulfonium iodide, 2.25 g (13.5 mmol) of silver acetate, 120 ml of acetonitrile and 60 ml of water were mixed together and agitated at room temperature for one hour. The reaction solution was filtered, thereby obtaining a solution of triphenylsulfonium acetate.

Synthetic Example 3

Synthesis of Compound PAG-1

In a nitrogen stream, 28.0 g (88.55 mmol) of 1,1,2,2,3,3-hexafluoropropane-1,3-disulfonyl difluoride, 17.92 g (177.1 mmol) of triethylamine and 210 ml of diisopropyl ether were cooled with ice. A solution consisting of a mixture of 7.56 g (88.2 mmol) of piperidine and 105 ml of diisopropyl ether was dropped thereinto over a period of 30 minutes. The mixture was agitated while cooling with ice for one hour and further agitated at room temperature for one hour. The resultant organic phase was sequentially washed with water, a saturated aqueous ammonium chloride solution and water, and dried over sodium sulfate. The solvent was evaporated off, and 140 ml of ethanol and 1400 mg of sodium hydroxide were added to the dried matter and agitated at room temperature for two hours. Dilute hydrochloric acid was added so as to neutralize the reaction solution, thereby obtaining an ethanol solution of sulfonic acid.

The solution of triphenylsulfonium acetate was added to the obtained sulfonic acid solution, and agitated at room temperature for two hours. Chloroform amounting to 2100 ml was added, and the resultant organic phase was sequentially washed with water, a saturated aqueous ammonium chloride solution and water. The washed organic phase was purified by means of column chromatography (SiO$_2$, chloroform/methanol=5/1), thereby obtaining 21.0 g (32.76 mmol) of compound (PAG-1) of formula below as a white solid.

$^1$H-NMR (300 MHz, CDCl$_3$) δ 1.64 (bs, 6H), 3.29 (bs, 2H), 3.64 (bs, 2H), 7.70 (m, 15H) $^{19}$F-NMR (300 MHz, CDCl$_3$) δ-111.1 (t, 2F), -114.3 (t, 2F), -119.4 (m, 2F)

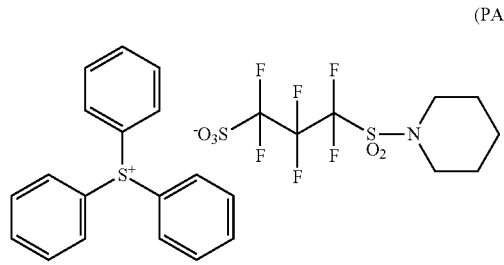

(PAG-1)

Photoacid generators (PAG-2) to (PAG-14) of formulae below were synthesized from the compounds corresponding to the individual components (B) in the same manner as in Synthetic Examples 2 and 3.

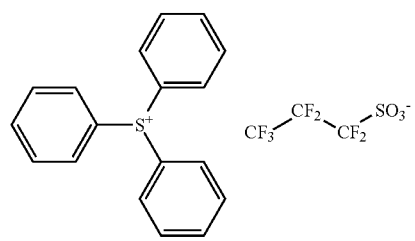

(PAG-2)

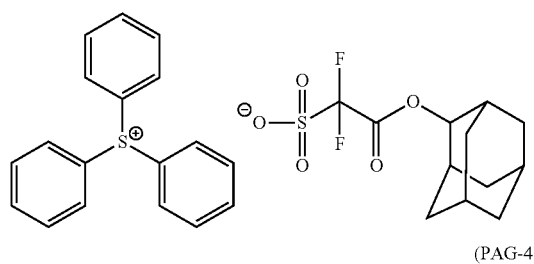

(PAG-3)

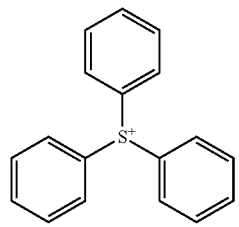

(PAG-4)

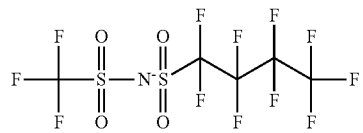

(PAG-5)

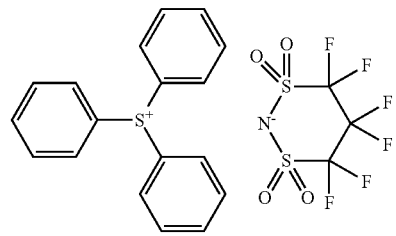

(PAG-6)

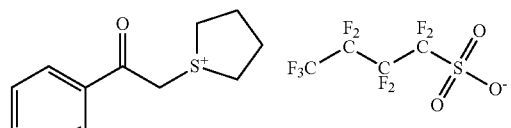

(PAG-7)

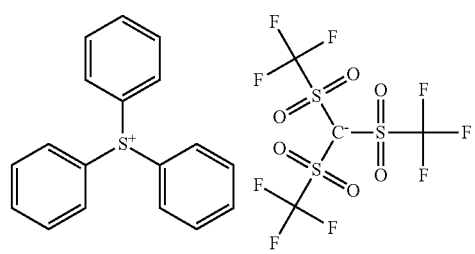

(PAG-8)

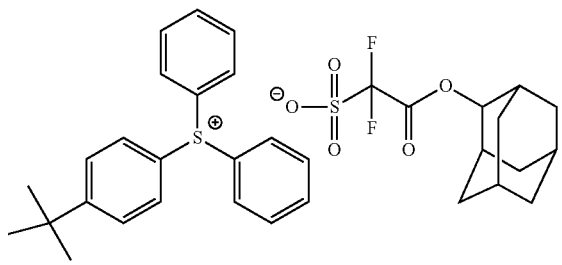

(PAG-9)

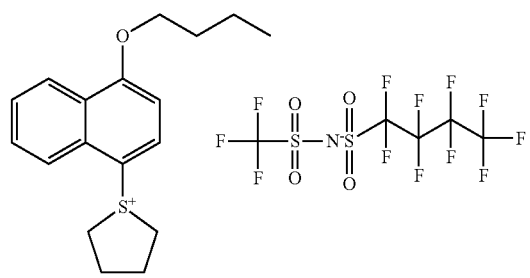

(PAG-10)

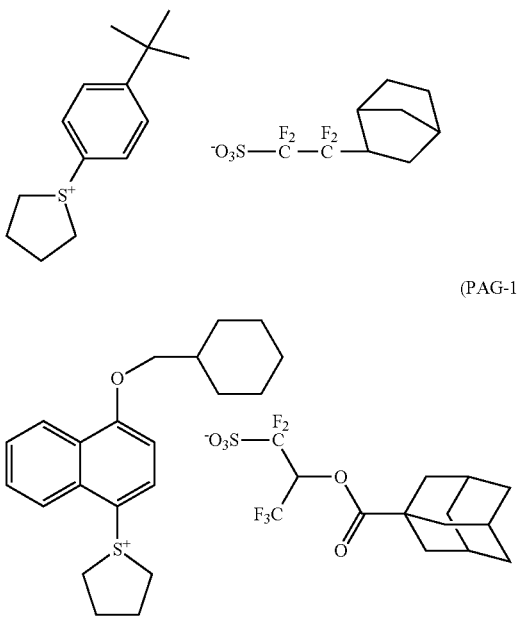

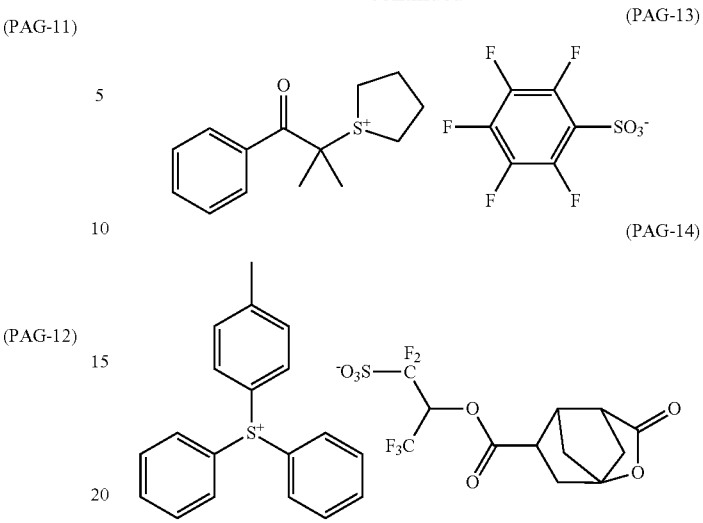

<Preparation of Resist Composition>

The components indicated in Table 3 below were dissolved in appropriate solvents indicated in the same table, and the solutions were passed through a polyethylene filter of 0.03 μm pore size. Thus, resist compositions Ar-1 to Ar-31 and Ar—R1 to Ar—R8 were obtained.

TABLE 3

| Resist | (A) Resin (mass/g) | (B) Acid generator (mass/g) | Solid concentration (mass %) | Basic compound (mass/g) | Solid concentration (mass %) | Surfactant (0.04 g) | Hydrophobic resin (0.06 g) | (C) Solvent (mass ratio) |
|---|---|---|---|---|---|---|---|---|
| Ar-1 | P-1 (10) | PAG-1 (1.8) | 14.9 | B-1/B-3 (0.06/0.09) | 0.5/0.7 | W-1 | (1b) | A1/B1 (60/40) |
| Ar-2 | P-2 (10) | PAG-2 (1.0) | 8.9 | B-2/B-1 (0.06/0.09) | 0.5/0.8 | W-2 | (2b) | A1/B2 (80/20) |
| Ar-3 | P-3 (10) | PAG-3 (1.2) | 10.5 | B-3/B-2 (0.06/0.09) | 0.5/0.8 | W-3 | (3b) | A2/B1 (70/30) |
| Ar-4 | P-4 (10) | PAG-4/PAG-1 (0.7/0.7) | 6.0/6.0 | B-4 (0.15) | 1.3 | W-1 | (4b) | A3/B2 (80/20) |
| Ar-5 | P-1 (10) | PAG-5/PAG-6 (1.4/0.2) | 11.8/1.7 | B-5 (0.15) | 1.3 | W-2 | (1b) | A1/A2/B1 (50/4/46) |
| Ar-6 | P-2 (10) | PAG-1/PAG-7 (1.5/0.3) | 12.4/2.5 | B-6 (0.15) | 1.2 | W-3 | (2b) | A1/B1 (60/40) |
| Ar-7 | P-3 (10) | PAG-2 (1.0) | 8.9 | B-1/B-3 (0.06/0.09) | 0.5/0.8 | W-1 | (3b) | A1/B2 (80/20) |
| Ar-8 | P-4 (10) | PAG-3 (1.2) | 10.5 | B-2/B-1 (0.06/0.09) | 0.5/0.8 | W-2 | (4b) | A2/B1 (70/30) |
| Ar-9 | P-1 (10) | PAG-4 (1.4) | 12.0 | B-3/B-2 (0.06/0.09) | 0.5/0.8 | W-3 | (1b) | A3/B2 (80/20) |
| Ar-10 | P-2 (10) | PAG-5/PAG-1 (0.9/0.7) | 7.6/5.9 | B-4 (0.15) | 1.3 | W-1 | (2b) | A1/A2/B1 (50/4/46) |
| Ar-11 | P-3 (10) | PAG-1/PAG-6 (1.6/0.2) | 13.3/1.7 | B-5 (0.15) | 1.2 | W-2 | (3b) | A1/B1 (60/40) |
| Ar-12 | P-4 (10) | PAG-2 (1.0) | 8.9 | B-6 (0.15) | 1.3 | W-3 | (4b) | A1/B2 (80/20) |
| Ar-13 | P-1 (10) | PAG-3 (1.2) | 10.5 | B-1/B-3 (0.06/0.09) | 0.5/0.8 | W-1 | (1b) | A2/B1 (70/30) |
| Ar-14 | P-2 (10) | PAG-4 (1.4) | 12.0 | B-2/B-1 (0.06/0.09) | 0.5/0.8 | W-2 | (2b) | A3/B2 (80/20) |
| Ar-15 | P-3 (10) | PAG-5 (1.6) | 13.5 | B-3/B-2 (0.06/0.09) | 0.5/0.8 | W-3 | (3b) | A1/A2/B1 (50/4/46) |
| Ar-16 | P-4 (10) | PAG-1/PAG-6 (1.1/1.1) | 8.8/8.8 | B-4 (0.15) | 1.2 | W-1 | (4b) | A1/B1 (60/40) |
| Ar-17 | P-1 (10) | PAG-2/PAG-7 (0.7/0.3) | 6.2/2.7 | B-5 (0.15) | 1.3 | W-2 | (1b) | A1/B2 (80/20) |
| Ar-18 | P-2 (10) | PAG-3 (1.2) | 10.5 | B-6 (0.15) | 1.3 | W-3 | (2b) | A2/B1 (70/30) |
| Ar-19 | P-3 (10) | PAG-4 (1.4) | 12.0 | B-1/B-3 (0.06/0.09) | 0.5/0.8 | W-1 | (3b) | A3/B2 (80/20) |

TABLE 3-continued

| Resist | (A) Resin (mass/g) | (B) Acid generator (mass/g) | Solid concentration (mass %) | Basic compound (mass/g) | Solid concentration (mass %) | Surfactant (0.04 g) | Hydrophobic resin (0.06 g) | (C) Solvent (mass ratio) |
|---|---|---|---|---|---|---|---|---|
| Ar-20 | P-4 (10) | PAG-5 (1.6) | 13.5 | B-2/B-1 (0.06/0.09) | 0.5/0.8 | W-2 | (4b) | A1/A2/B1 (50/4/46) |
| Ar-21 | P-1 (10) | PAG-8 (1.8) | 14.9 | B-3/B-2 (0.06/0.09) | 0.5/0.7 | W-3 | (1b) | A1/B1 (60/40) |
| Ar-22 | P-2 (10) | PAG-9 (2.5) | 19.6 | B-4 (0.15) | 1.2 | W-1 | (2b) | A1/B2 (80/20) |
| Ar-23 | P-3 (10) | PAG-10 (1.2) | 10.5 | B-5 (0.15) | 1.3 | W-2 | (3b) | A2/B1 (70/30) |
| Ar-24 | P-4 (10) | PAG-11/PAG-1 (1.5/0.7) | 12.0/5.6 | B-6 (0.15) | 1.3 | W-3 | (4b) | A3/B2 (80/20) |
| Ar-25 | P-1 (10) | PAG-12/PAG-6 (1.4/0.2) | 11.8/1.7 | B-1/B-3 (0.06/0.09) | 0.5/0.8 | W-1 | (1b) | A1/A2/B1 (50/4/46) |
| Ar-26 | P-2 (10) | PAG-13/PAG-7 (2.0/0.3) | 15.9/2.4 | B-2/B-1 (0.06/0.09) | 0.5/0.7 | W-2 | (2b) | A1/B1 (60/40) |
| Ar-27 | P-3 (10) | PAG-14 (1.0) | 8.9 | B-3/B-2 (0.06/0.09) | 0.5/0.8 | W-3 | (3b) | A1/B2 (80/20) |
| Ar-28 | P-1/P-2 (5/5) | PAG-4 (1.1) | 9.7 | B-5 (0.15) | 1.3 | W-2 | (1b) | A1/B2 (80/20) |
| Ar-29 | P-2 (10) | PAG-5 (1.5) | 12.8 | B-6 (0.15) | 1.3 | W-3 | (2b) | A2/B1 (70/30) |
| Ar-30 | P-3/P-4 (5/5) | PAG-12 (2.1) | 17.0 | B-1/B-3 (0.06/0.09) | 0.5/0.8 | W-1 | (3b) | A3/B2 (80/20) |
| Ar-31 | P-4 (10) | PAG-13 (2.5) | 19.7 | B-2/B-1 (0.06/0.09) | 0.5/0.8 | (—) | (4b) | A1/A2/B1 (50/4/46) |
| Ar-R1 Comp. Ex. | P-1 (10) | PAG-1 (0.8) | 7.2 | B-3/B-2 (0.06/0.09) | 0.5/0.8 | W-3 | (1b) | A1/B1 (60/40) |
| Ar-R2 Comp. Ex. | P-2 (10) | PAG-2/PAG-1 (0.1/0.7) | 0.9/6.3 | B-4 (0.15) | 1.4 | W-1 | (2b) | A1/B2 (80/20) |
| Ar-R3 Comp. Ex. | P-3 (10) | PAG-3/PAG-6 (0.6/0.2) | 5.4/1.8 | B-5 (0.15) | 1.4 | W-2 | (3b) | A2/B1 (70/30) |
| Ar-R4 Comp. Ex. | P-4 (10) | PAG-4/PAG-7 (0.5/0.3) | 4.5/2.7 | B-6 (0.15) | 1.4 | W-3 | (4b) | A3/B2 (80/20) |
| Ar-R5 Comp. Ex. | P-1 (10) | PAG-5 (2.6) | 20.2 | B-1/B-3 (0.06/0.09) | 0.5/0.7 | W-1 | (1b) | A1/A2/B1 (50/4/46) |
| Ar-R6 Comp. Ex. | P-2 (10) | PAG-1 (2.6) | 20.2 | B-2/B-1 (0.06/0.09) | 0.5/0.7 | W-2 | (2b) | A1/B1 (60/40) |
| Ar-R7 Comp. Ex. | P-3 (10) | PAG-2/PAG-7 (2.2/0.4) | 17.1/3.1 | B-3/B-2 (0.06/0.09) | 0.5/0.7 | W-3 | (3b) | A1/B2 (80/20) |
| Ar-R8 Comp. Ex. | P-4 (10) | PAG-3/PAG-6 (2.3/0.3) | 17.9/2.3 | B-4 (0.15) | 1.2 | W-1 | (4b) | A2/B1 (70/30) |

The brevity codes appearing in the Table 3 have the following meanings.

[Basic Compound]

B-1 to B-6: compounds of the following formulae.

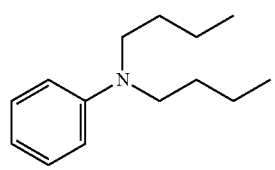

(B-1)

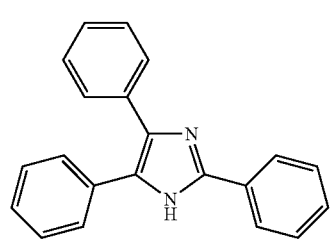

(B-2)

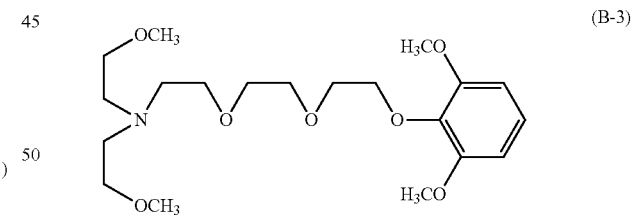

(B-3)

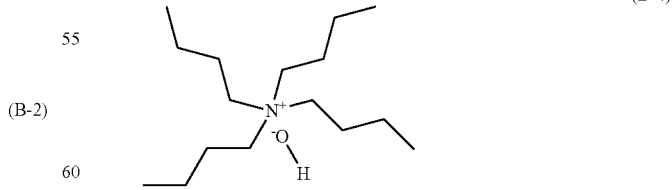

(B-4)

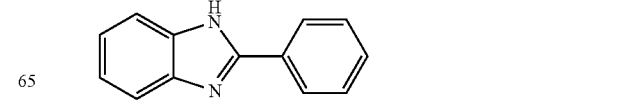

(B-5)

-continued

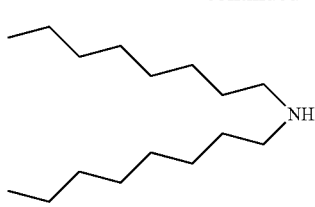
(B-6)

[Surfactant]
W-1: Megafac F176 (produced by Dainippon Ink & Chemicals, Inc., fluorinated),
W-2: Megafac R08 (produced by Dainippon Ink & Chemicals, Inc., fluorinated and siliconized), and
W-3: polysiloxane polymer KP-341 (produced by Shin-Etsu Chemical Co., Ltd., siliconized).

[Solvent]
A1: propylene glycol monomethyl ether acetate (PGMEA),
A2: γ-butyrolactone,
A3: cyclohexanone,
B1: propylene glycol monomethyl ether (PGME), and
B2: ethyl lactate.

Using the obtained resist compositions, resist patterns were formed by the following methods.

Example 1

Exposure→Bake→Negative Development: Brevity Code E-B-N

An organic antireflection film ARC29A (produced by Nissan Chemical Industries, Ltd.) was applied onto a silicon wafer and baked at 205° C. for 60 seconds, thereby forming a 86 nm-thick antireflection film. The resist composition Ar-1 was applied thereunto and baked at 100° C. for 60 seconds, thereby forming a 100 nm-thick resist film. The resultant wafer was patternwise exposed through an exposure mask (line/space=1/1) by means of an ArF excimer laser scanner (NA0.75). Thereafter, the exposed wafer was baked at 95° C. for 60 seconds, developed (negative development) with the developer indicated in Table 4 for 30 seconds, and rinsed with the rinse liquid indicated in Table 4. The rinsed wafer was rotated at a rotating speed of 4000 rpm for 30 seconds, thereby obtaining a 100 nm (1:1) line and space resist pattern.

Examples 2 to 15 and Comparative Examples 1 to 5 and 9

E-B-N

In the same manner as in Example 1 except that the resists and conditions specified in Table 4 were employed, 100 nm (1:1) line and space resist patterns were formed.

Example 21

Exposure→Bake→Negative Development→Postbake: Brevity Code E-B-N-B

An organic antireflection film ARC29A (produced by Nissan Chemical Industries, Ltd.) was applied onto a silicon wafer and baked at 205° C. for 60 seconds, thereby forming a 86 nm-thick antireflection film. The resist composition Ar-21 was applied thereunto and baked at 100° C. for 60 seconds, thereby forming a 100 nm-thick resist film. The resultant wafer was patternwise exposed through an exposure mask (line/space=1/1) by means of an ArF excimer laser scanner (NA0.75). Thereafter, the exposed wafer was baked at 100° C. for 60 seconds, developed (negative development) with the developer indicated in Table 4 for 30 seconds, and rinsed with the rinse liquid indicated in Table 4. The rinsed wafer was rotated at a rotating speed of 4000 rpm for 30 seconds, and baked at 90° C. for 60 seconds, thereby obtaining a 100 nm (1:1) line and space resist pattern.

Examples 22, 23 and 25 to 31

E-B-N-B

In the same manner as in Example 21 except that the resists and conditions specified in Table 4 were employed, 100 nm (1:1) line and space resist patterns were formed.

Example 16

Exposure→Bake→Positive Development→Negative Development: Brevity Code E-B-P-N

An organic antireflection film ARC29A (produced by Nissan Chemical Industries, Ltd.) was applied onto a silicon wafer and baked at 205° C. for 60 seconds, thereby forming a 86 nm-thick antireflection film. The resist composition Ar-16 was applied thereonto and baked at 100° C. for 60 seconds, thereby forming a 100 nm-thick resist film. The resultant wafer was patternwise exposed through an exposure mask (line/space=1/1) by means of an ArF excimer laser scanner (NA0.75). Thereafter, the exposed wafer was baked at 95° C. for 60 seconds, developed (positive development) with an aqueous solution of tetramethylammonium hydroxide (2.38 mass %) (positive developer) for 30 seconds, and rinsed with pure water, thereby obtaining a pattern of 400 nm pitch and 300 nm line width. Further, the wafer was developed (negative development) with the developer indicated in Table 4 for 30 seconds, and rinsed with the rinse liquid indicated in Table 4. The rinsed wafer was rotated at a rotating speed of 4000 rpm for 30 seconds, thereby obtaining a 100 nm (1:1) line and space resist pattern.

Example 17

Exposure Bake→Negative Development→Positive Development: Brevity Code E-B-N-P

An organic antireflection film ARC29A (produced by Nissan Chemical Industries, Ltd.) was applied onto a silicon wafer and baked at 205° C. for 60 seconds, thereby forming a 86 nm-thick antireflection film. The resist composition Ar-17 was applied thereonto and baked at 100° C. for 60 seconds, thereby forming a 150 nm-thick resist film. The resultant wafer was patternwise exposed through an exposure mask (line/space=1/1) by means of an ArF excimer laser scanner (NA0.75). Thereafter, the exposed wafer was baked at 95° C. for 60 seconds, developed (negative development) with the developer indicated in Table 4 for 30 seconds, and rinsed with the rinse liquid indicated in Table 4. The rinsed wafer was rotated at a rotating speed of 4000 rpm for 30 seconds, thereby obtaining a pattern of 400 nm pitch and 300 nm line width. Further, the wafer was developed (positive development) with an aqueous solution of tetramethylammonium hydroxide (2.38 mass %) (positive developer) for 30 seconds, and rinsed with pure water. The rinsed wafer was rotated at a rotating speed of 4000 rpm for 30 seconds, thereby obtaining a 100 nm (1:1) line and space resist pattern.

Example 18

Exposure→Bake→Positive Development→Bake→Negative Development: Brevity Code E-B-P-B-N An organic antireflection film ARC29A (produced by Nissan Chemical Industries, Ltd.) was applied onto a silicon wafer and baked at 205° C. for 60 seconds, thereby forming a 86 nm-thick antireflection film. The resist composition Ar-18 was applied thereonto and baked at 100° C. for 60 seconds, thereby forming a 150 nm-thick resist film. The resultant wafer was patternwise exposed through an exposure mask (line/space=1/1) by means of an ArF excimer laser scanner (NA0.75). Thereafter, the exposed wafer was baked at 95° C. for 60 seconds, developed (positive development) with an aqueous solution of tetramethylammonium hydroxide (2.38 mass %) (positive developer) for 30 seconds, and rinsed with pure water. The rinsed wafer was rotated at a rotating speed of 4000 rpm for 30 seconds, thereby obtaining a pattern of 400 nm pitch and 300 nm line width. Further, the wafer was baked at 95° C. for 60 seconds, developed (negative development) with the developer indicated in Table 4 for 30 seconds, and rinsed with the rinse liquid indicated in Table 4. The rinsed wafer was rotated at a rotating speed of 4000 rpm for 30 seconds, thereby obtaining a 100 nm (1:1) line and space resist pattern.

Comparative Example 7

E-B-P-B-N

A 100 nm (1:1) line and space resist pattern was produced in the same manner as in Example 18 except that the resist and conditions specified in Table 4 were employed.

Example 19

Exposure→Bake→Negative Development→Bake→Positive Development: Brevity Code E-B-N-B-P An organic antireflection film ARC29A (produced by Nissan Chemical Industries, Ltd.) was applied onto a silicon wafer and baked at 205° C. for 60 seconds, thereby forming a 86 nm-thick antireflection film. The resist composition Ar-19 was applied thereonto and baked at 100° C. for 60 seconds, thereby forming a 150 nm-thick resist film. The resultant wafer was patternwise exposed through an exposure mask (line/space=1/1) by means of an ArF excimer laser scanner (NA0.75). Thereafter, the exposed wafer was baked at 95° C. for 60 seconds, developed (negative development) with the developer indicated in Table 4 for 30 seconds, and rinsed with the rinse liquid indicated in Table 4. The rinsed wafer was rotated at a rotating speed of 4000 rpm for 30 seconds, thereby obtaining a pattern of 400 nm pitch and 300 nm line width. Further, the wafer was baked at 95° C. for 60 seconds, developed (positive development) with an aqueous solution of tetramethylammonium hydroxide (2.38 mass %) (positive developer) for 30 seconds, and rinsed with pure water. The rinsed wafer was rotated at a rotating speed of 4000 rpm for 30 seconds, thereby obtaining a 100 nm (1:1) line and space resist pattern.

Comparative Example 8

E-B-N-B-P

A 100 nm (1:1) line and space resist pattern was produced in the same manner as in Example 19 except that the resist and conditions specified in Table 4 were employed.

Example 20

Exposure Bake→Negative Development→Postbake: Brevity Code iE-B-N

An organic antireflection film ARC29A (produced by Nissan Chemical Industries, Ltd.) was applied onto a silicon wafer and baked at 205° C. for 60 seconds, thereby forming a 86 nm-thick antireflection film. The resist composition Ar-20 was applied thereonto and baked at 100° C. for 60 seconds, thereby forming a 150 nm-thick resist film. The resultant wafer was patternwise exposed through an exposure mask (line/space=1/1) and through the pure water on the wafer by means of an ArF excimer laser liquid immersion scanner (NA1.20). Thereafter, the exposed wafer was baked at 95° C. for 60 seconds, developed (negative development) with the negative developer indicated in Table 4 for 30 seconds, and rinsed with the rinse liquid indicated in Table 4. The rinsed wafer was rotated at a rotating speed of 4000 rpm for 30 seconds, thereby obtaining a 100 nm (1:1) line and space resist pattern.

Comparative Example 6 iE-B-N

A 100 nm (1:1) line and space resist pattern was produced in the same manner as in Example 20 except that the resist and conditions specified in Table 4 were employed.

Example 24

Exposure Bake→Negative Development→Postbake: Brevity Code iE-B-N-B

An organic antireflection film ARC29A (produced by Nissan Chemical Industries, Ltd.) was applied onto a silicon wafer and baked at 205° C. for 60 seconds, thereby forming a 86 nm-thick antireflection film. The resist composition Ar-24 was applied thereonto and baked at 100° C. for 60 seconds, thereby forming a 150 nm-thick resist film. The resultant wafer was patternwise exposed through an exposure mask (line/space=1/1) and through the pure water on the wafer by means of an ArF excimer laser liquid immersion scanner (NA1.20). Thereafter, the exposed wafer was baked at 100° C. for 60 seconds, developed (negative development) with the negative developer indicated in Table 4 for 30 seconds, and rinsed with the rinse liquid indicated in Table 4. The rinsed wafer was rotated at a rotating speed of 4000 rpm for 30 seconds, and baked at 90° C. for 60 seconds, thereby obtaining a 100 nm (1:1) line and space resist pattern.

TABLE 4

| | Resist | PB | PEB | Developer for negative development | Rinse liquid for negative development | PB | Process brevity code |
|---|---|---|---|---|---|---|---|
| Ex. 1 | Ar-1 | 100° C. 60 s | 95° C. 60 s | Butyl acetate | 1-hexanol | — | E-B-N |
| Ex. 2 | Ar-2 | 100° C. 60 s | 95° C. 60 s | Butyl acetate | 1-hexanol | — | E-B-N |
| Ex. 3 | Ar-3 | 100° C. 60 s | 95° C. 60 s | B1 | 1-hexanol | — | E-B-N |
| Ex. 4 | Ar-4 | 100° C. 60 s | 95° C. 60 s | B1 | 4-methyl-2-pentanol | — | E-B-N |
| Ex. 5 | Ar-5 | 100° C. 60 s | 95° C. 60 s | Butyl acetate | 4-methyl-2-pentanol | — | E-B-N |
| Ex. 6 | Ar-6 | 100° C. 60 s | 95° C. 60 s | Butyl acetate | 4-methyl-2-pentanol | — | E-B-N |
| Ex. 7 | Ar-7 | 100° C. 60 s | 95° C. 60 s | Butyl acetate | 4-methyl-2-pentanol | — | E-B-N |
| Ex. 8 | Ar-8 | 100° C. 60 s | 95° C. 60 s | Butyl acetate | 4-methyl-2-pentanol | — | E-B-N |
| Ex. 9 | Ar-9 | 100° C. 60 s | 95° C. 60 s | Butyl acetate | 1-hexanol | — | E-B-N |
| Ex. 10 | Ar-10 | 100° C. 60 s | 95° C. 60 s | Butyl acetate | 1-hexanol | — | E-B-N |
| Ex. 11 | Ar-11 | 100° C. 60 s | 95° C. 60 s | Butyl acetate | 1-hexanol | — | E-B-N |
| Ex. 12 | Ar-12 | 100° C. 60 s | 95° C. 60 s | Butyl acetate | 4-methyl-2-pentanol | — | E-B-N |
| Ex. 13 | Ar-13 | 100° C. 60 s | 95° C. 60 s | Butyl acetate | 4-methyl-2-pentanol | — | E-B-N |
| Ex. 14 | Ar-14 | 100° C. 60 s | 95° C. 60 s | Butyl acetate | 4-methyl-2-pentanol | — | E-B-N |
| Ex. 15 | Ar-15 | 100° C. 60 s | 95° C. 60 s | Butyl acetate | 4-methyl-2-pentanol | — | E-B-N |
| Ex. 16 | Ar-16 | 100° C. 60 s | 95° C. 60 s | Butyl acetate | 4-methyl-2-pentanol | — | E-B-P-N |
| Ex. 17 | Ar-17 | 100° C. 60 s | 95° C. 60 s | Butyl acetate | 1-hexanol | — | E-B-N-P |
| Ex. 18 | Ar-18 | 100° C. 60 s | 95° C. 60 s | Butyl acetate | 1-hexanol | — | E-B-P-B-N |
| Ex. 19 | Ar-19 | 100° C. 60 s | 95° C. 60 s | Butyl acetate | 1-hexanol | — | E-B-N-B-P |
| Ex. 20 | Ar-20 | 100° C. 60 s | 95° C. 60 s | Butyl acetate | 4-methyl-2-pentanol | — | iE-B-N |
| Ex. 21 | Ar-21 | 100° C. 60 s | 100° C. 60 s | Butyl acetate | 1-hexanol | 90° C. 60 s | E-B-N-B |
| Ex. 22 | Ar-22 | 100° C. 60 s | 100° C. 60 s | Butyl acetate | 1-hexanol | 90° C. 60 s | E-B-N-B |
| Ex. 23 | Ar-23 | 100° C. 60 s | 100° C. 60 s | B1 | 1-hexanol | 90° C. 60 s | E-B-N-B |
| Ex. 24 | Ar-24 | 100° C. 60 s | 100° C. 60 s | B1 | 4-methyl-2-pentanol | 90° C. 60 s | iE-B-N-B |
| Ex. 25 | Ar-25 | 100° C. 60 s | 100° C. 60 s | Butyl acetate | 4-methyl-2-pentanol | 90° C. 60 s | E-B-N-B |
| Ex. 26 | Ar-26 | 100° C. 60 s | 100° C. 60 s | Butyl acetate | 4-methyl-2-pentanol | 90° C. 60 s | E-B-N-B |
| Ex. 27 | Ar-27 | 100° C. 60 s | 100° C. 60 s | Butyl acetate | 4-methyl-2-pentanol | 90° C. 60 s | E-B-N-B |
| Ex. 28 | Ar-28 | 100° C. 60 s | 100° C. 60 s | Butyl acetate | 4-methyl-2-pentanol | 90° C. 60 s | E-B-N-B |
| Ex. 29 | Ar-29 | 100° C. 60 s | 100° C. 60 s | Butyl acetate | 4-methyl-2-pentanol | 90° C. 60 s | E-B-N-B |
| Ex. 30 | Ar-30 | 100° C. 60 s | 100° C. 60 s | Butyl acetate | 4-methyl-2-pentanol | 90° C. 60 s | E-B-N-B |
| Ex. 31 | Ar-31 | 100° C. 60 s | 100° C. 60 s | Butyl acetate | 4-methyl-2-pentanol | 90° C. 60 s | E-B-N-B |
| Ex. 32 | Ar-1 | 100° C. 60 s | 95° C. 60 s | A1 | 1-hexanol | — | E-B-N |
| Ex. 33 | Ar-2 | 100° C. 60 s | 95° C. 60 s | A1:B1 = 50 mass %:50 mass % | 1-hexanol | — | E-B-N |
| Ex. 34 | Ar-3 | 100° C. 60 s | 95° C. 60 s | 2-hexanone | 1-hexanol | — | E-B-N |
| Ex. 35 | Ar-4 | 100° C. 60 s | 95° C. 60 s | 3-hexanone | 4-methyl-2-pentanol | — | E-B-N |
| Ex. 36 | Ar-5 | 100° C. 60 s | 95° C. 60 s | 2-heptanone | 4-methyl-2-pentanol | — | E-B-N |
| Ex. 37 | Ar-6 | 100° C. 60 s | 95° C. 60 s | 3-heptanone | 4-methyl-2-pentanol | — | E-B-N |
| Ex. 38 | Ar-7 | 100° C. 60 s | 95° C. 60 s | Anisole | 4-methyl-2-pentanol | — | E-B-N |
| Ex. 39 | Ar-8 | 100° C. 60 s | 95° C. 60 s | Ethyl-3-ethoxypropionate | 4-methyl-2-pentanol | — | E-B-N |
| Ex. 40 | Ar-9 | 100° C. 60 s | 95° C. 60 s | Ethyl-3-ethoxypropionate | 1-hexanol | — | E-B-N |
| Ex. 41 | Ar-10 | 100° C. 60 s | 95° C. 60 s | A1 | 1-hexanol | — | E-B-N |
| Ex. 42 | Ar-11 | 100° C. 60 s | 95° C. 60 s | A1:B1 = 50 mass %:50 mass % | 1-hexanol | — | E-B-N |
| Ex. 43 | Ar-12 | 100° C. 60 s | 95° C. 60 s | 2-hexanone | 4-methyl-2-pentanol | — | E-B-N |
| Ex. 44 | Ar-13 | 100° C. 60 s | 95° C. 60 s | 3-hexanone | 4-methyl-2-pentanol | — | E-B-N |
| Ex. 45 | Ar-14 | 100° C. 60 s | 95° C. 60 s | 2-heptanone | 4-methyl-2-pentanol | — | E-B-N |
| Ex. 46 | Ar-15 | 100° C. 60 s | 95° C. 60 s | 3-heptanone | 4-methyl-2-pentanol | — | E-B-N |
| Ex. 47 | Ar-16 | 100° C. 60 s | 95° C. 60 s | Ethyl-3-ethoxypropionate | 4-methyl-2-pentanol | — | E-B-P-N |
| Ex. 48 | Ar-17 | 100° C. 60 s | 95° C. 60 s | A1 | 1-hexanol | — | E-B-N-P |
| Ex. 49 | Ar-18 | 100° C. 60 s | 95° C. 60 s | A1:B1 = 50 mass %:50 mass % | 1-hexanol | — | E-B-P-B-N |
| Ex. 50 | Ar-19 | 100° C. 60 s | 95° C. 60 s | 2-hexanone | 1-hexanol | — | E-B-N-B-P |
| Ex. 51 | Ar-20 | 100° C. 60 s | 95° C. 60 s | 3-hexanone | 4-methyl-2-pentanol | — | iE-B-N |
| Ex. 52 | Ar-21 | 100° C. 60 s | 100° C. 60 s | 2-heptanone | 1-hexanol | 90° C. 60 s | E-B-N-B |
| Ex. 53 | Ar-22 | 100° C. 60 s | 100° C. 60 s | 3-heptanone | 1-hexanol | 90° C. 60 s | E-B-N-B |
| Ex. 54 | Ar-23 | 100° C. 60 s | 100° C. 60 s | Anisole | 1-hexanol | 90° C. 60 s | E-B-N-B |
| Ex. 55 | Ar-24 | 100° C. 60 s | 100° C. 60 s | Ethyl-3-ethoxypropionate | 4-methyl-2-pentanol | 90° C. 60 s | iE-B-N-B |
| Ex. 56 | Ar-25 | 100° C. 60 s | 100° C. 60 s | Ethyl-3-ethoxypropionate | 4-methyl-2-pentanol | 90° C. 60 s | E-B-N-B |
| Ex. 57 | Ar-26 | 100° C. 60 s | 100° C. 60 s | A1 | 4-methyl-2-pentanol | 90° C. 60 s | E-B-N-B |
| Ex. 58 | Ar-27 | 100° C. 60 s | 100° C. 60 s | A1:B1 = 50 mass %:50 mass % | 4-methyl-2-pentanol | 90° C. 60 s | E-B-N-B |
| Ex. 59 | Ar-28 | 100° C. 60 s | 100° C. 60 s | 2-hexanone | 4-methyl-2-pentanol | 90° C. 60 s | E-B-N-B |
| Ex. 60 | Ar-29 | 100° C. 60 s | 100° C. 60 s | 3-hexanone | 4-methyl-2-pentanol | 90° C. 60 s | E-B-N-B |
| Ex. 61 | Ar-30 | 100° C. 60 s | 100° C. 60 s | 2-heptanone | 4-methyl-2-pentanol | 90° C. 60 s | E-B-N-B |
| Ex. 62 | Ar-31 | 100° C. 60 s | 100° C. 60 s | 3-heptanone | 4-methyl-2-pentanol | 90° C. 60 s | E-B-N-B |
| Comp. Ex. 1 | Ar-R1 | 100° C. 60 s | 95° C. 60 s | Butyl acetate | 4-methyl-2-pentanol | — | E-B-N |
| Comp. Ex. 2 | Ar-R2 | 100° C. 60 s | 95° C. 60 s | Butyl acetate | 4-methyl-2-pentanol | — | E-B-N |
| Comp. Ex. 3 | Ar-R3 | 100° C. 60 s | 95° C. 60 s | Butyl acetate | 4-methyl-2-pentanol | — | E-B-N |
| Comp. Ex. 4 | Ar-R4 | 100° C. 60 s | 95° C. 60 s | Butyl acetate | 4-methyl-2-pentanol | — | E-B-N |
| Comp. Ex. 5 | Ar-R5 | 100° C. 60 s | 95° C. 60 s | Butyl acetate | 1-hexanol | — | E-B-N |

TABLE 4-continued

| | Resist | PB | PEB | Developer for negative development | Rinse liquid for negative development | PB | Process brevity code |
|---|---|---|---|---|---|---|---|
| Comp. Ex. 6 | Ar-R6 | 100° C. 60 s | 95° C. 60 s | Butyl acetate | 1-hexanol | — | iE-B-N |
| Comp. Ex. 7 | Ar-R7 | 100° C. 60 s | 95° C. 60 s | Butyl acetate | 1-hexanol | — | E-B-P-B-N |
| Comp. Ex. 8 | Ar-R8 | 100° C. 60 s | 95° C. 60 s | Butyl acetate | 4-methyl-2-pentanol | — | E-B-N-B-P |
| Comp. Ex. 9 | Ar-R1 | 100° C. 60 s | 105° C. 60 s | Butyl acetate | 4-methyl-2-pentanol | — | E-B-N |

In Table 4, PB means pre-exposure bake, PEB means bake subsequent to exposure, and Postbake means bake subsequent to rinse. In the columns of PB and PEB, for example, "100060s" means bake at 100° C. for 60 seconds. With respect to the negative developer, B1 means the above-mentioned solvent PGME.

<Evaluation Method>

Evaluation of Resolving Power

[Line Width Roughness (LWR)]

Each of the 100 nm (1:1) line and space resist patterns was observed by means of a critical dimension scanning electron microscope (SEM model S-9380II, manufactured by Hitachi, Ltd.). In a 2 μm region along the longitudinal direction of the space pattern, the line width was measured at 50 points with equal intervals. The roughness was determined by computing 3σ from the standard deviation of measurements. The smaller the value thereof, the higher the performance exhibited.

[Defocus Latitude (Depth of Focus DOF)]

The optimum exposure amount and optimum focus were respectively defined as the exposure amount and focus that form a 100 nm (1:1) line and space resist pattern. The focus width in which when the focus was varied (defocused) while maintaining the exposure amount at the optimum exposure amount, the pattern size allowed 100 nm±10% was determined. The greater the value thereof, the less the change in performance by focus changes and the higher the defocus latitude (depth of focus DOF).

[Configuration]

The configuration of each of the 100 nm (1:1) line and space resist patterns formed at the optimum exposure amount and optimum focus was observed. The greater the closeness to a rectangle, the more favorable the configuration of the resist pattern.

TABLE 5

| | Resist | LWR [nm] | DOF [um] | Configuration |
|---|---|---|---|---|
| Ex. 1 | Ar-1 | 4.8 | 0.60 | Rectangle |
| Ex. 2 | Ar-2 | 5.6 | 0.50 | Rectangle |
| Ex. 3 | Ar-3 | 6.8 | 0.55 | Rectangle |
| Ex. 4 | Ar-4 | 6.7 | 0.55 | Rectangle |
| Ex. 5 | Ar-5 | 5.4 | 0.55 | Rectangle |
| Ex. 6 | Ar-6 | 5.4 | 0.60 | Rectangle |
| Ex. 7 | Ar-7 | 6.2 | 0.50 | Rectangle |
| Ex. 8 | Ar-8 | 6.5 | 0.55 | Rectangle |
| Ex. 9 | Ar-9 | 5.2 | 0.55 | Rectangle |
| Ex. 10 | Ar-10 | 5.4 | 0.55 | Rectangle |
| Ex. 11 | Ar-11 | 6.5 | 0.65 | Rectangle |
| Ex. 12 | Ar-12 | 6.0 | 0.50 | Rectangle |
| Ex. 13 | Ar-13 | 5.9 | 0.65 | Rectangle |
| Ex. 14 | Ar-14 | 4.5 | 0.55 | Rectangle |
| Ex. 15 | Ar-15 | 6.3 | 0.65 | Rectangle |
| Ex. 16 | Ar-16 | 5.8 | 0.65 | Rectangle |
| Ex. 17 | Ar-17 | 5.2 | 0.50 | Rectangle |
| Ex. 18 | Ar-18 | 5.7 | 0.65 | Rectangle |
| Ex. 19 | Ar-19 | 6.1 | 0.50 | Rectangle |
| Ex. 20 | Ar-20 | 6.4 | 0.65 | Rectangle |
| Ex. 21 | Ar-21 | 5.2 | 0.70 | Rectangle |
| Ex. 22 | Ar-22 | 6.3 | 0.57 | Rectangle |
| Ex. 23 | Ar-23 | 5.1 | 0.57 | Rectangle |
| Ex. 24 | Ar-24 | 6.1 | 0.56 | Rectangle |
| Ex. 25 | Ar-25 | 5.4 | 0.65 | Rectangle |
| Ex. 26 | Ar-26 | 5.6 | 0.60 | Rectangle |
| Ex. 27 | Ar-27 | 5.0 | 0.65 | Rectangle |
| Ex. 28 | Ar-28 | 5.6 | 0.67 | Rectangle |
| Ex. 29 | Ar-29 | 5.2 | 0.60 | Rectangle |
| Ex. 30 | Ar-30 | 6.1 | 0.72 | Rectangle |
| Ex. 31 | Ar-31 | 5.5 | 0.63 | Rectangle |
| Ex. 32 | Ar-1 | 4.5 | 0.72 | Rectangle |
| Ex. 33 | Ar-2 | 5.4 | 0.56 | Rectangle |
| Ex. 34 | Ar-3 | 6.1 | 0.59 | Rectangle |
| Ex. 35 | Ar-4 | 6.5 | 0.62 | Rectangle |
| Ex. 36 | Ar-5 | 5.7 | 0.64 | Rectangle |
| Ex. 37 | Ar-6 | 4.9 | 0.59 | Rectangle |
| Ex. 38 | Ar-7 | 5.8 | 0.61 | Rectangle |
| Ex. 39 | Ar-8 | 6.2 | 0.57 | Rectangle |
| Ex. 40 | Ar-9 | 4.6 | 0.66 | Rectangle |
| Ex. 41 | Ar-10 | 5.2 | 0.62 | Rectangle |
| Ex. 42 | Ar-11 | 6.8 | 0.70 | Rectangle |
| Ex. 43 | Ar-12 | 5.5 | 0.57 | Rectangle |
| Ex. 44 | Ar-13 | 5.5 | 0.76 | Rectangle |
| Ex. 45 | Ar-14 | 4.3 | 0.54 | Rectangle |
| Ex. 46 | Ar-15 | 5.6 | 0.79 | Rectangle |
| Ex. 47 | Ar-16 | 5.6 | 0.67 | Rectangle |
| Ex. 48 | Ar-17 | 5.5 | 0.60 | Rectangle |
| Ex. 49 | Ar-18 | 5.2 | 0.73 | Rectangle |
| Ex. 50 | Ar-19 | 5.7 | 0.54 | Rectangle |
| Ex. 51 | Ar-20 | 6.1 | 0.73 | Rectangle |
| Ex. 52 | Ar-21 | 4.6 | 0.82 | Rectangle |
| Ex. 53 | Ar-22 | 6.1 | 0.56 | Rectangle |
| Ex. 54 | Ar-23 | 5.4 | 0.70 | Rectangle |
| Ex. 55 | Ar-24 | 5.6 | 0.58 | Rectangle |
| Ex. 56 | Ar-25 | 5.0 | 0.78 | Rectangle |
| Ex. 57 | Ar-26 | 5.4 | 0.67 | Rectangle |
| Ex. 58 | Ar-27 | 4.5 | 0.70 | Rectangle |
| Ex. 59 | Ar-28 | 5.4 | 0.76 | Rectangle |
| Ex. 60 | Ar-29 | 5.5 | 0.70 | Rectangle |
| Ex. 61 | Ar-30 | 5.6 | 0.71 | Rectangle |
| Ex. 62 | Ar-31 | 5.1 | 0.77 | Rectangle |
| Comp. Ex. 1 | Ar-R1 | 8.8 | 0.65 | Taper |
| Comp. Ex. 2 | Ar-R2 | 8.5 | 0.50 | Taper |
| Comp. Ex. 3 | Ar-R3 | 9.5 | 0.55 | Taper |
| Comp. Ex. 4 | Ar-R4 | 9.1 | 0.55 | Taper |
| Comp. Ex. 5 | Ar-R5 | 8.5 | 0.40 | T-top |
| Comp. Ex. 6 | Ar-R6 | 8.3 | 0.35 | T-top |
| Comp. Ex. 7 | Ar-R7 | 8.7 | 0.20 | T-top |
| Comp. Ex. 8 | Ar-R8 | 9.1 | 0.45 | T-top |
| Comp. Ex. 9 | Ar-R1 | 7.0 | 0.30 | Rectangle |

It is apparent from the Table 5 that a high-precision micropattern excelling in line width roughness, defocus latitude and pattern configuration can stably be formed from the resist composition of the present invention.

The formation of resist patterns was attempted in the same manner as in Examples 1 to 15 except that the application substrate was changed to a TiN substrate not provided with any antireflection film or the like. In such attempts as well, patterns excelling in configuration and lithographic performance could be formed.

The invention claimed is:

1. A method of forming a pattern, comprising the step of applying an actinic-ray- or radiation-sensitive resin composition on a substrate so as to form a film, the step of selectively exposing the film through a mask and the step of developing the exposed film with the use of a developer containing an organic solvent, wherein the actinic-ray- or radiation-sensitive resin composition contains a resin (A) whose polarity is increased by the action of an acid so that the solubility of the resin in the developer containing an organic solvent is decreased, a photoacid generator (B) that when exposed to actinic rays or radiation, generates an acid containing a fluorine atom and having a cyclic structure in its molecule, and a solvent (C), and wherein the photoacid generator (B) is contained in the composition in a ratio of 8 to 20 mass % based on the total solids of the composition, wherein the photoacid generator (B) has a structure expressed by formula (ZI)

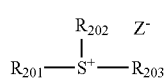
(ZI)

wherein each of $R_{201}$, $R_{202}$ and $R_{203}$ independently represents an organic group, wherein $Z^-$ is

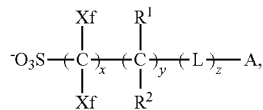
(AN1)

each of Xf independently represents a fluorine atom or an alkyl group substituted with at least one fluorine atom, each of $R^1$ and $R^2$ independently represents a member selected from among a hydrogen atom, a fluorine atom, an alkyl group and an alkyl group substituted with at least one fluorine atom, and when two or more $R^1$s or $R^2$s are contained, the two or more may be identical to or different from each other, L represents any one of a single bond, —COO—, —OCO—, and —CO—, and A represents an alicyclic group or a group with a nonaromatic heterocyclic structure, x is an integer of 1 to 20; y is an integer of 0 to 10 and z is an integer of 0 to 10.

2. The method of forming a pattern according to claim 1, wherein the acid generated from the photoacid generator (B) contains 6 or more fluorine atoms per molecule.

3. The method of forming a pattern according to claim 1, wherein the resin (A) contains any of the repeating units of general formula (AII) below,

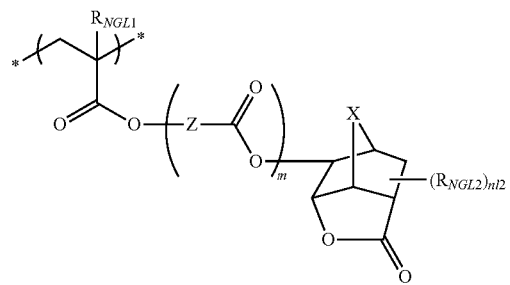
(AII)

in which $R_{NGL1}$, represents a hydrogen atom or an alkyl group; $R_{NGL2}$ represents an alkyl group, a cycloalkyl group, an alkoxy group, an alkoxycarbonyl group, a carboxyl group, a halogen atom, a hydroxyl group or a cyano group; X represents a methylene group, a methylmethylene group, a dimethylmethylene group, an ethylene group, an oxygen atom or a sulfur atom; Z, each independently in the instance of Zs, represents a chain or cyclic alkylene group; m represents the number of repetitions and is an integer of 0 to 3; and n12 is an integer of 0 to 4, provided that when n12 is 2 or greater, two or more $R_{NGL2}$S may be identical to or different from each other and that two or more $R_{NGL2}$S may be bonded to each other to thereby form a ring.

4. The method of forming a pattern according to claim 1, further comprising the step of developing the film with the use of an alkali developer.

5. The method of forming a pattern according to claim 1, further comprising the step of rinsing the film with the use of a rinse liquid containing an organic solvent.

6. The method of forming a pattern according to claim 1, wherein the developer containing an organic solvent is a ketone solvent, an ester solvent or an ether solvent.

7. The method of forming a pattern according to claim 1, wherein an ArF excimer laser is used as an exposure light source.

8. The method of forming a pattern according to claim 1, wherein the photoacid generator (B) is contained in the composition in a ratio of 9 to 15 mass % based on the total solids of the composition.

9. The method of forming a pattern according to claim 1, wherein the photoacid generator (B) is contained in the composition in a ratio of 12 to 20 mass % based on the total solids of the composition.

10. The method of forming a pattern according to claim 1, wherein the photoacid generator (B) has a structure expressed by formula (ZI-3)

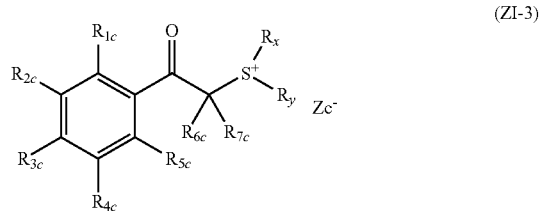
(ZI-3)

wherein each of $R_{1c}$ to $R_{5c}$ independently represents a hydrogen atom, an alkyl group, a cycloalkyl group, an alkoxy group, a halogen atom or a phenylthio group, each of $R_{6c}$ and $R_{7c}$ independently represents a hydrogen atom, an alkyl group, a cycloalkyl group, halogen atom, a cyano group or an aryl group, each of $R_x$ and $R_y$ independently represents an alkyl group, a cycloalkyl group, a 2-oxoalkyl group, a 2-oxocycloalkyl group, an alkoxycarbonylalkyl group, an allyl group or a vinyl group, and $Zc^-$ represents is a nonnucleophilic anion represented by general formula (AN1).

11. A method of forming a pattern, comprising the step of applying an actinic-ray- or radiation-sensitive resin composition on a substrate so as to form a film, the step of selectively exposing the film through a mask and the step of developing the exposed film with the use of a developer containing an organic solvent, wherein the actinic-ray- or radiation-sensitive resin composition contains a resin (A) whose polarity is increased by the action of an acid so that the solubility of the resin in the developer containing an organic solvent is decreased, a photoacid generator (B) that when exposed to actinic rays or radiation, generates an acid containing a fluorine atom and having a cyclic structure in its molecule, and a solvent (C), and wherein the photoacid generator (B) is contained in the composition in a ratio of 8 to 20 mass % based on the total solids of the composition, wherein the photoacid generator (B) has a structure expressed by formula (ZI-4)

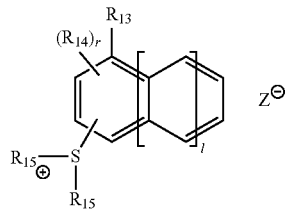

(ZI-4)

wherein $R_{13}$ represents any of a hydrogen atom, a fluorine atom, a hydroxyl group, an alkyl group, a cycloalkyl group, an alkoxy group, an alkoxycarbonyl group and a group with a cycloalkyl skeleton of a single ring or multiple rings, $R_{14}$, each independently in the instance of $R_{14}$s, represents any of an alkyl group, a cycloalkyl group, an alkoxy group, an alkoxycarbonyl group, an alkylcarbonyl group, an alkylsulfonyl group, a cycloalkylsulfonyl group and a group with a cycloalkyl skeleton of a single ring or multiple rings, each of $R_{15}$s independently represents an alkyl group, a cycloalkyl group or a naphthyl group, provided that the two $R_{15}$s may be bonded to each other to thereby form a ring, l is an integer of 0 to 2, r is an integer of 0 to 8, and Z— represents a nonnucleophilic anion.

12. A method of forming a pattern, comprising the step of applying an actinic-ray- or radiation-sensitive resin composition on a substrate so as to form a film, the step of selectively exposing the film through a mask and the step of developing the exposed film with the use of a developer containing an organic solvent, wherein the actinic-ray- or radiation-sensitive resin composition contains a resin (A) whose polarity is increased by the action of an acid so that the solubility of the resin in the developer containing an organic solvent is decreased, a photoacid generator (B) that when exposed to actinic rays or radiation, generates an acid containing a fluorine atom and having a cyclic structure in its molecule, and a solvent (C), and wherein the photoacid generator (B) is contained in the composition in a ratio of 8 to 20 mass % based on the total solids of the composition, wherein the photoacid generator (B) has a structure expressed by formula (ZII)

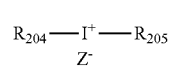

(ZII)

wherein each of $R_{204}$ to $R_{205}$ independently represents an aryl group, an alkyl group or a cycloalkyl group, wherein $Z^-$ is

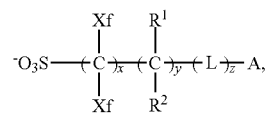

(AN1)

each of Xf independently represents a fluorine atom or an alkyl group substituted with at least one fluorine atom, each of $R^1$ and $R^2$ independently represents a member selected from among a hydrogen atom, a fluorine atom, an alkyl group and an alkyl group substituted with at least one fluorine atom, and when two or more $R^1$s or $R^2$s are contained, the two or more may be identical to or different from each other, L represents any one of a single bond, —COO—, —OCO—, and —CO—, and A represents an alicyclic group or a group with a nonaromatic heterocyclic structure, x is an integer of 1 to 20; y is an integer of 0 to 10 and z is an integer of 0 to 10.

* * * * *